(12) United States Patent
Lee et al.

(10) Patent No.: US 10,840,228 B2
(45) Date of Patent: Nov. 17, 2020

(54) SEMICONDUCTOR PACKAGE

(71) Applicant: SAMSUNG ELECTRO-MECHANICS CO., LTD., Suwon-si, Gyeonggi-do (KR)

(72) Inventors: Yun Tae Lee, Suwon-si (KR); Han Kim, Suwon-si (KR); Hyung Joon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/391,896

(22) Filed: Apr. 23, 2019

(65) Prior Publication Data

US 2020/0266178 A1    Aug. 20, 2020

(30) Foreign Application Priority Data

Feb. 14, 2019    (KR) .................. 10-2019-0017069

(51) Int. Cl.
*H01L 25/16* (2006.01)
*H01L 23/538* (2006.01)
(Continued)

(52) U.S. Cl.
CPC ............ *H01L 25/162* (2013.01); *H01L 23/13* (2013.01); *H01L 23/3128* (2013.01);
(Continued)

(58) Field of Classification Search
CPC ............... H01L 25/162; H01L 23/5386; H01L 23/5383; H01L 23/5384; H01L 23/13; H01L 23/3128
See application file for complete search history.

(56) References Cited

U.S. PATENT DOCUMENTS

2016/0276307 A1* 9/2016 Lin ..................... H01L 23/552
2016/0307847 A1   10/2016 Lee et al.
(Continued)

FOREIGN PATENT DOCUMENTS

KR    10-2016-0123938 A    10/2016
KR    10-2018-0073371 A    7/2018
(Continued)

*Primary Examiner* — Herve-Louis Y Assouman
(74) *Attorney, Agent, or Firm* — Morgan, Lewis & Bockius LLP

(57) ABSTRACT

A semiconductor package includes a first connection structure having a first surface and a second surface and including one or more first redistribution layers, a first semiconductor chip disposed on the first surface, a second semiconductor chip disposed on the second surface, a third semiconductor chip disposed on the second surface, and at least one first passive component disposed between the second and third semiconductor chips on the second surface. The first connection structure may include a first region including a region overlapping the first passive component, and a second region including regions respectively overlapping at least portions of the second and third semiconductor chips, when viewed from above. The first region may be disposed between second regions. The first redistribution may include at least one of a power pattern and a ground pattern in the first region and include a signal pattern in the second region.

31 Claims, 27 Drawing Sheets

(51) Int. Cl.
*H01L 23/13* (2006.01)
*H01L 23/31* (2006.01)

(52) U.S. Cl.
CPC ...... *H01L 23/5383* (2013.01); *H01L 23/5384* (2013.01); *H01L 23/5386* (2013.01)

(56) References Cited

U.S. PATENT DOCUMENTS

2017/0373035 A1* 12/2017 Seol .................. H01L 25/18
2018/0182691 A1   6/2018 Cho et al.
2018/0211944 A1   7/2018 Kim

FOREIGN PATENT DOCUMENTS

KR   10-2018-0076995 A   7/2018
KR       10-1912290 B1   10/2018

* cited by examiner

I-I'

II-II'

III–III'

IV–IV'

V-V'

VI-VI'

SEMICONDUCTOR PACKAGE

CROSS-REFERENCE TO RELATED APPLICATION(S)

This application claims benefit of priority to Korean Patent Application No. 10-2019-0017069 filed on Feb. 14, 2019 in the Korean Intellectual Property Office, the disclosure of which is incorporated herein by reference in its entirety.

BACKGROUND

The present disclosure relates to a semiconductor package.

With the recent development of smart electronic devices, specifications of components used in such smart electronic devices have been increased. For example, the specification of an application processor (AP), a core chip of smart electronic devices, is rapidly developing. Recently, package-on-package (PoP) technology has been applied to satisfy such a high specification. Package-on-package (PoP) may be designed in various structures depending on fields of application. An AP package according to a related art has a structure in which a signal and power are transferred to a memory package through a path in a fan-out region outside of an AP chip after the AP chip is packaged. In the case of a specific structure, different package structures have been employed depending on manufacturer.

SUMMARY

An aspect of the present disclosure is to provide a package structure in which a plurality of semiconductor chips may be packaged to have optimal signal and power characteristics.

One of proposals of the present disclosure is to optimally arrange and package a semiconductor chip and a passive component at opposite sides of a connection structure, including at least one redistribution layer, and to design a layout of a signal pattern, a power pattern, and/or a ground pattern of the redistribution layer of the connection structure depending on the arrangement thereof.

According to an aspect of the present disclosure, a semiconductor package includes a first connection structure having a first surface and a second surface opposing the first surface and including one or more first redistribution layers, a first semiconductor chip disposed on the first surface of the first connection structure in such a manner that a surface, on which a first connection pad of the first semiconductor chip is disposed, faces the first surface of the first connection structure, a second semiconductor chip disposed on the second surface of the first connection structure in such a manner that a surface, on which a second connection pad of the second semiconductor chip is disposed, faces the second surface of the first connection structure, a third semiconductor chip, disposed on the second surface of the first connection structure in such a manner that a surface, on which a third connection pad of the third semiconductor chip is disposed, faces the second surface of the first connection structure, and at least one first passive component disposed between the second and third semiconductor chips on the second surface of the first connection structure. The first connection structure may include a first region including a region overlapping, in a thickness direction of the semiconductor package, the first passive component, and second regions including regions respectively overlapping, in the thickness direction of the semiconductor package, at least portions of the second and third semiconductor chips, when viewed from above. The first region may be disposed between second regions. The one or more first redistribution layers may include at least one of a power pattern and a ground pattern in the first region and include a signal pattern in the second region.

According to another aspect of the present disclosure, a semiconductor package includes: a connection structure having a first surface and a second surface opposing the first surface and including a redistribution layer; a first frame disposed on the first surface of the connection structure, having first and second penetration portions spaced apart from each other by a first region of the first frame, and including a wiring layer connected to the redistribution layer; first and second semiconductor chips respectively disposed in the first and second penetration portions on the first surface, connection pads of the first and second semiconductor chips facing the first surface; and a passive component disposed on the first region of the first frame. The connection structure is disposed between the passive component and the first region, the wiring layer in the first region of the frame includes patterns connected to power and ground, and the wiring layer outside the first region of the frame includes patterns transmitting signals.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
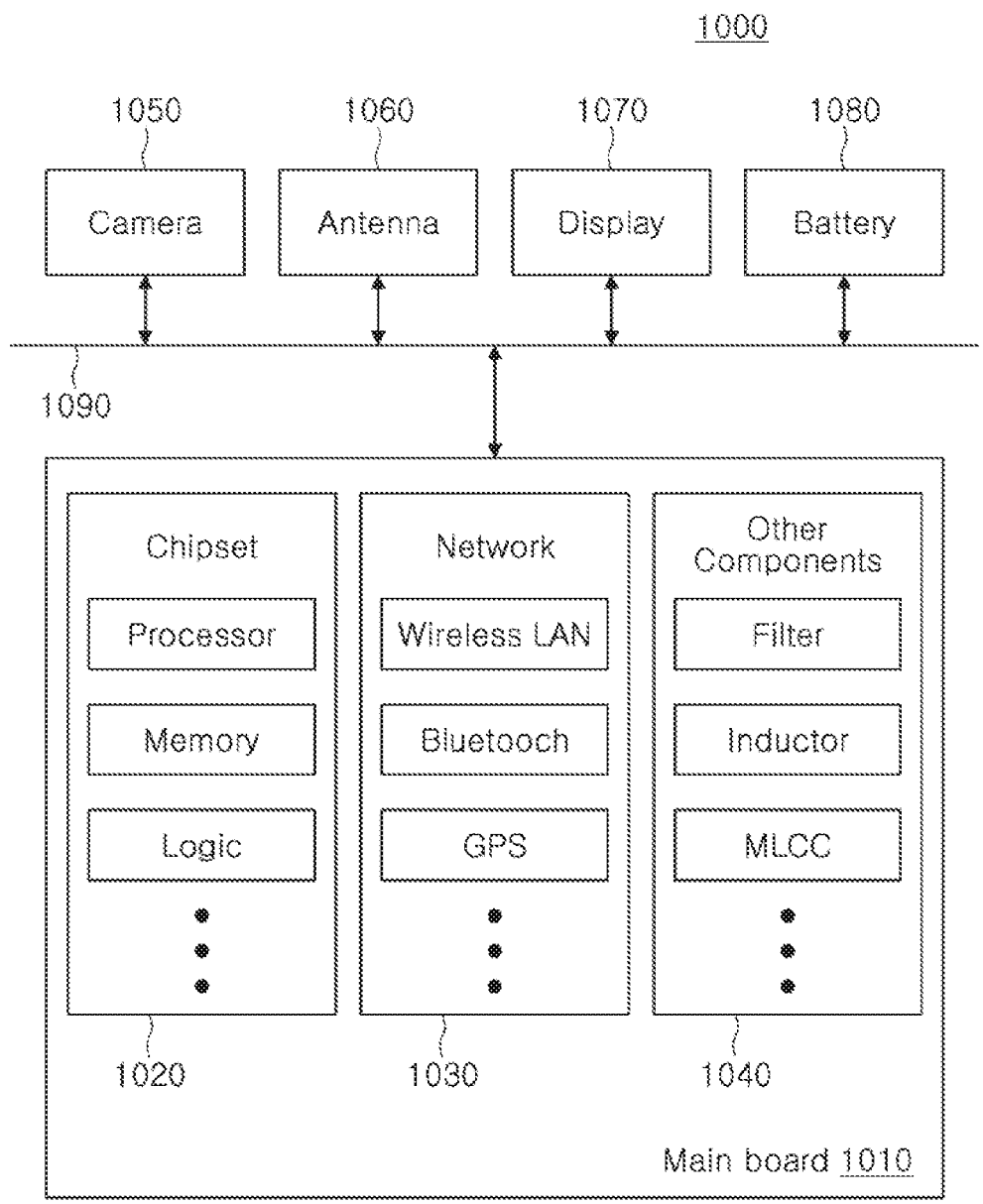
FIG. 1 is a block diagram schematically illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
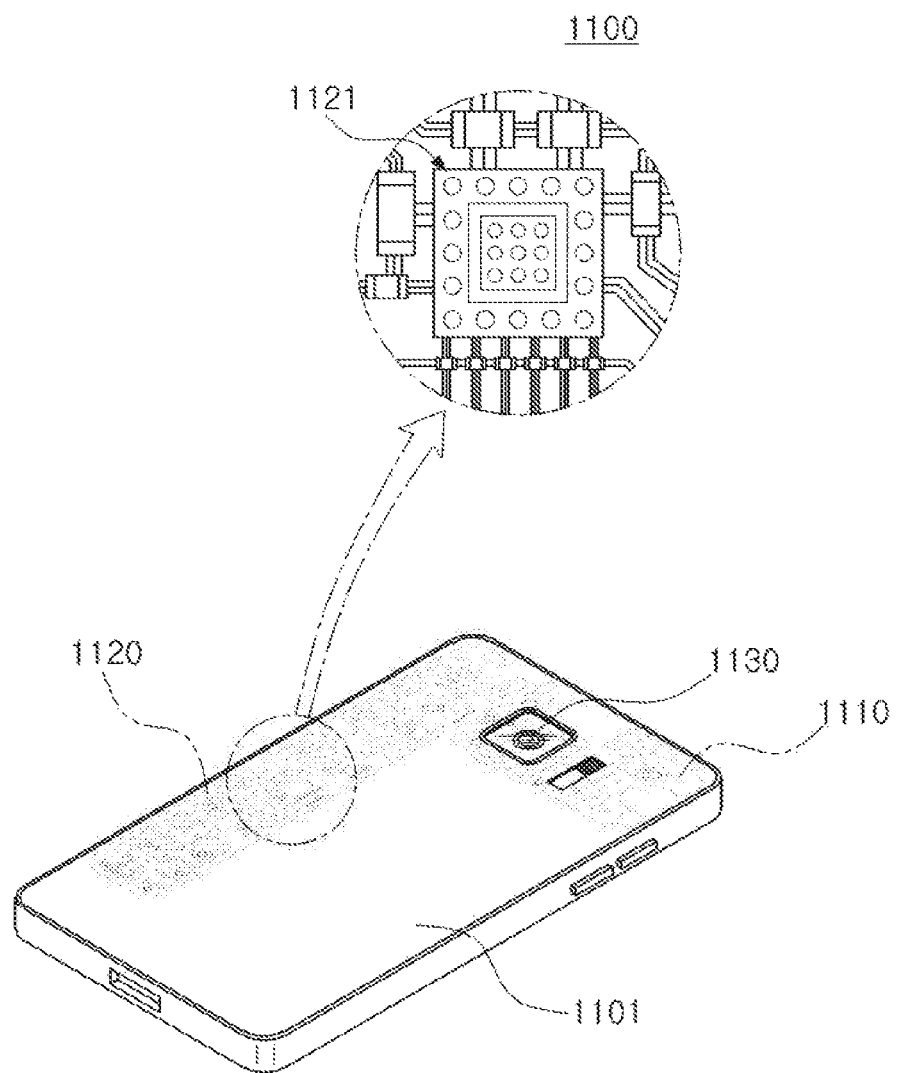
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
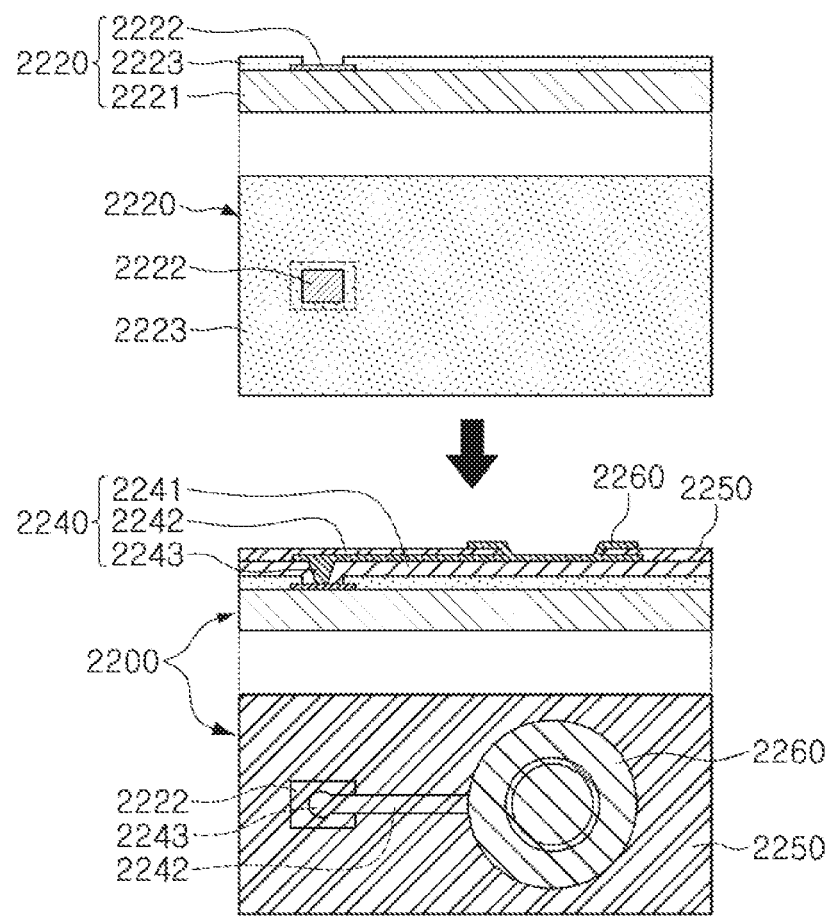
FIGS. 3A and 3B are schematic cross-sectional views illustrating states of a fan-in semiconductor package before and after being packaged.
Figure 3B:
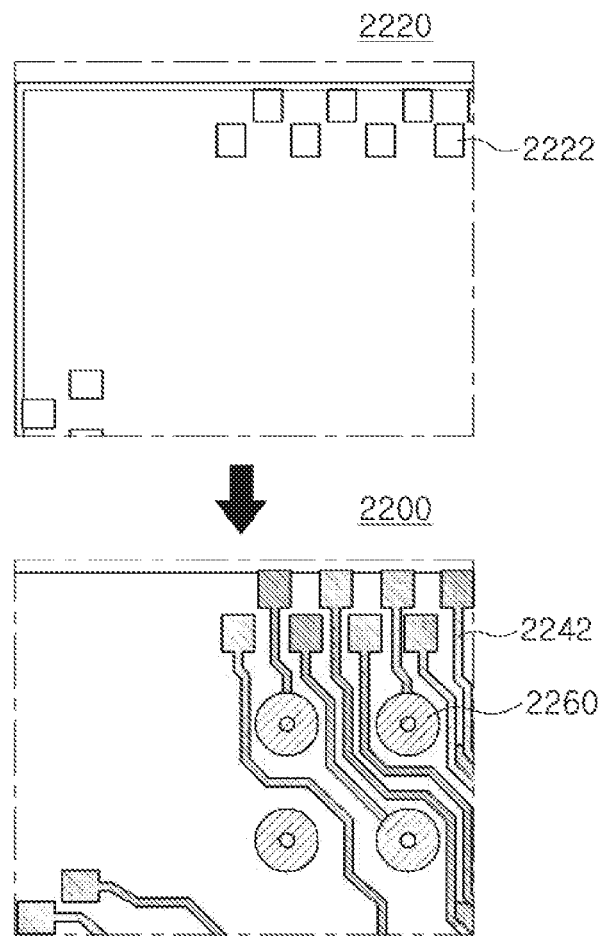

FIGS. 3A and 3B are schematic cross-sectional views illustrating states of a fan-in semiconductor package before and after being packaged.

Figure 4:
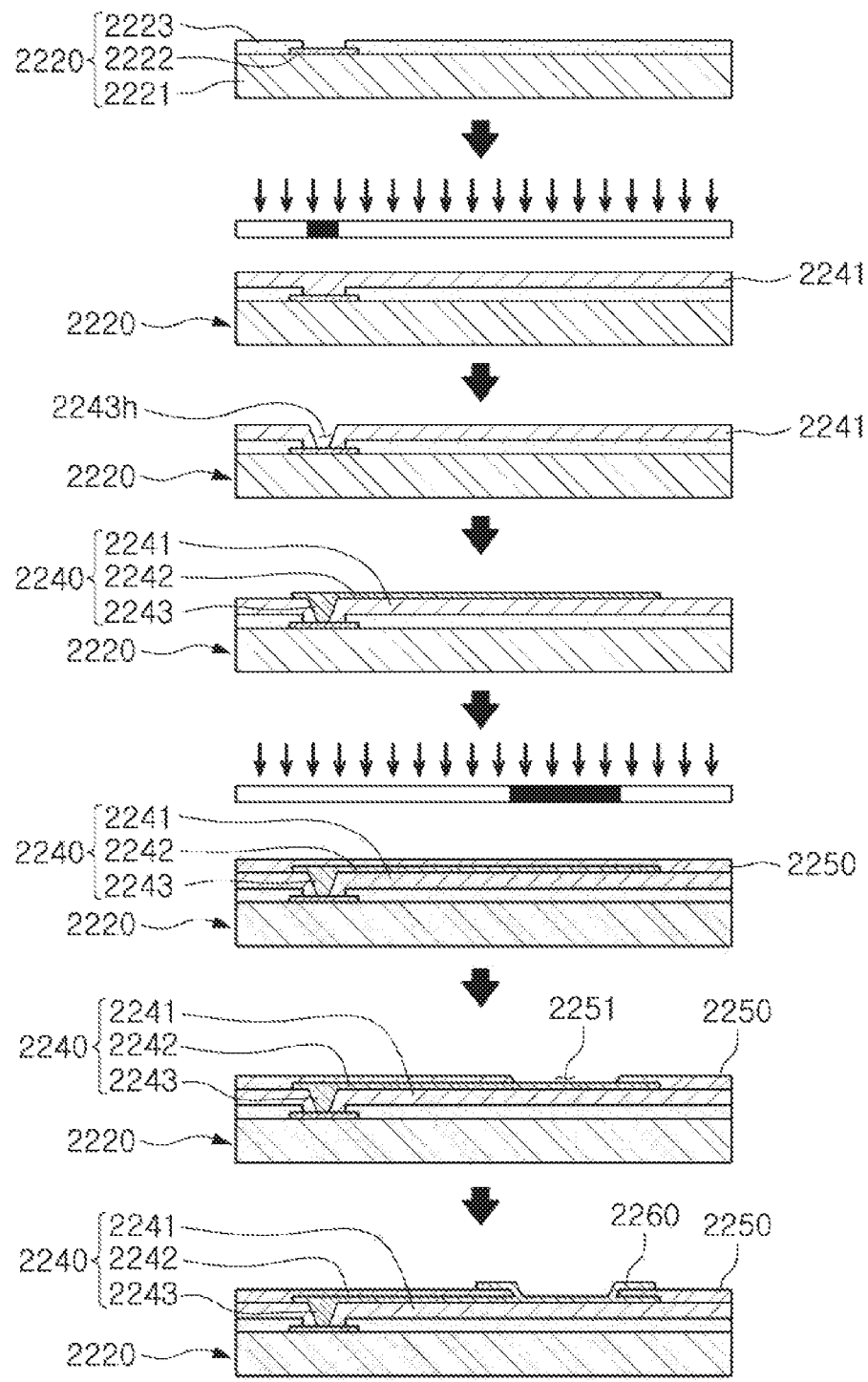
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
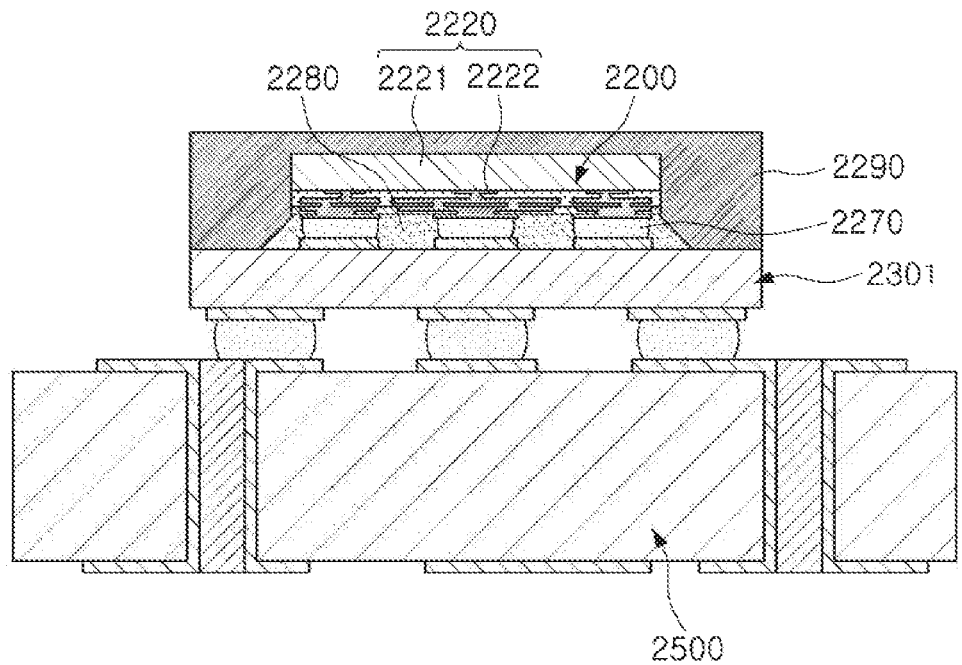
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
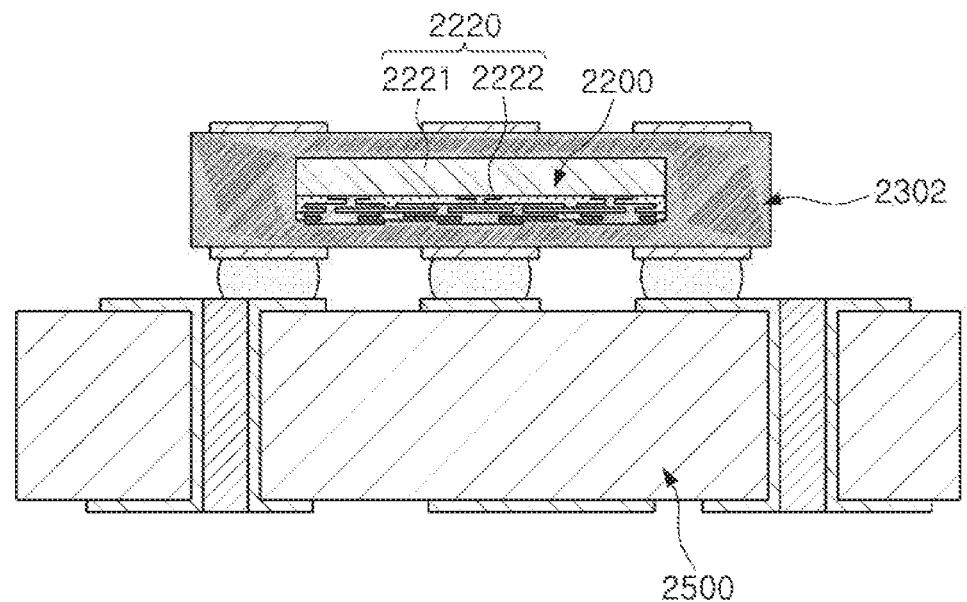
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
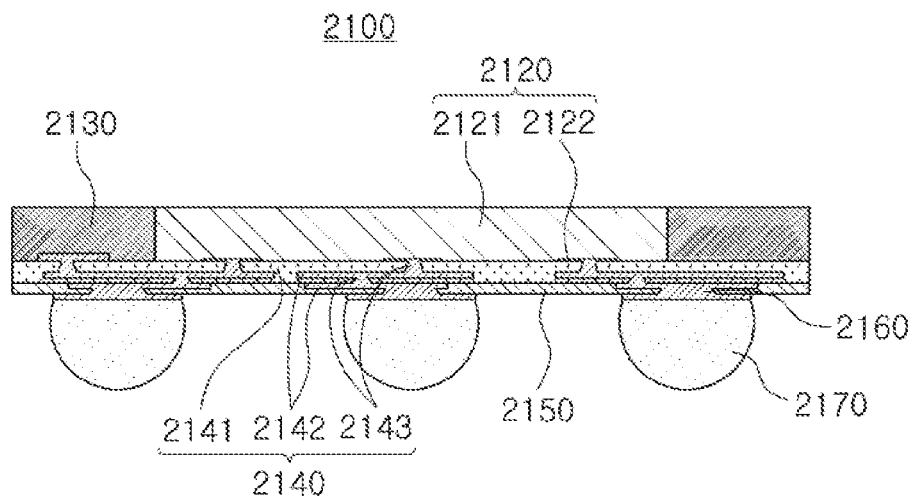
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
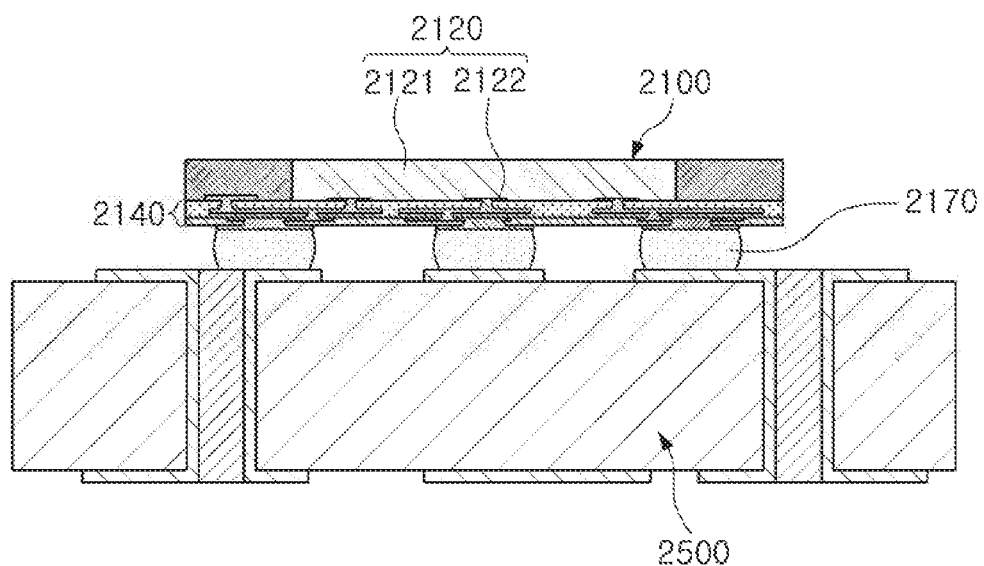
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Hereinafter, a package structure, in which a plurality of semiconductor chips may be packaged to have optimal signal and power characteristics, will be described with reference to accompanying drawings.

Figure 9:
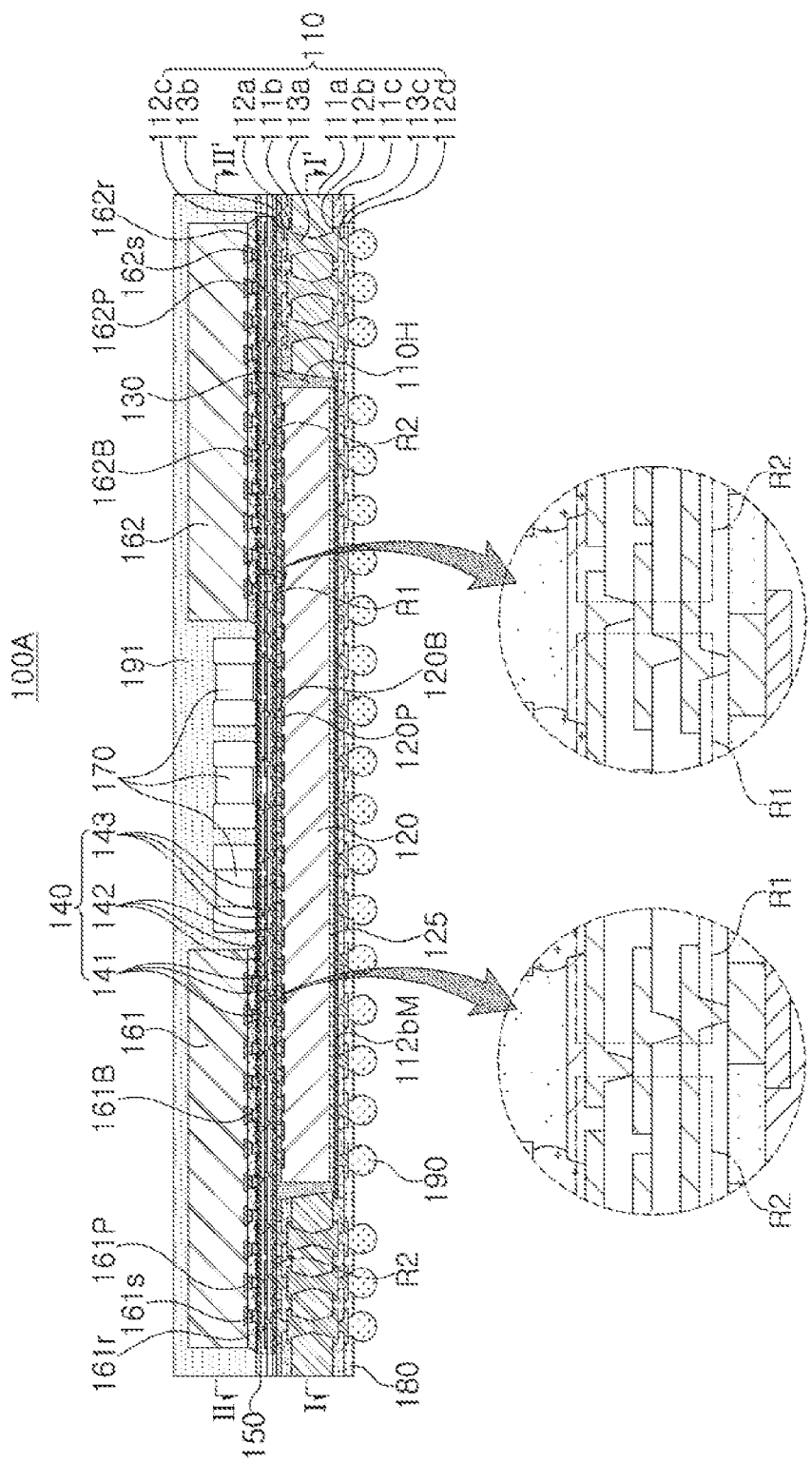
FIG. 9 is a cross-sectional view illustrating an example of a semiconductor package.
Figure 10:
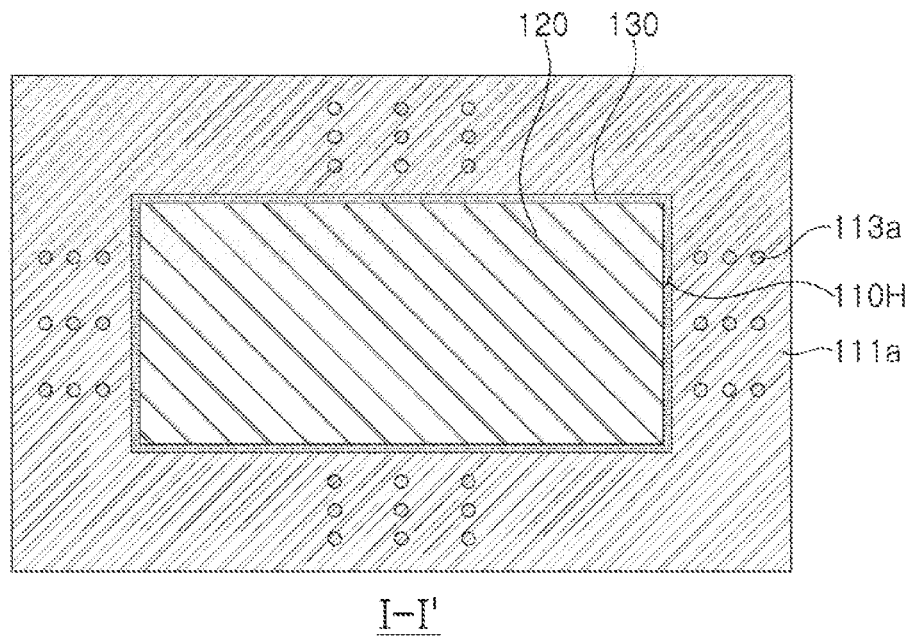
FIG. 10 is a schematic plan view taken along line I-I' of the semiconductor package in FIG. 9.

FIG. 9 is a cross-sectional view illustrating an example of a semiconductor package. FIG. 10 is a schematic plan view taken along line I-I' of the semiconductor package in FIG. 9, and FIG. 11 is a schematic plan view taken along line II-II' of the semiconductor package in FIG. 9.

Figure 11:
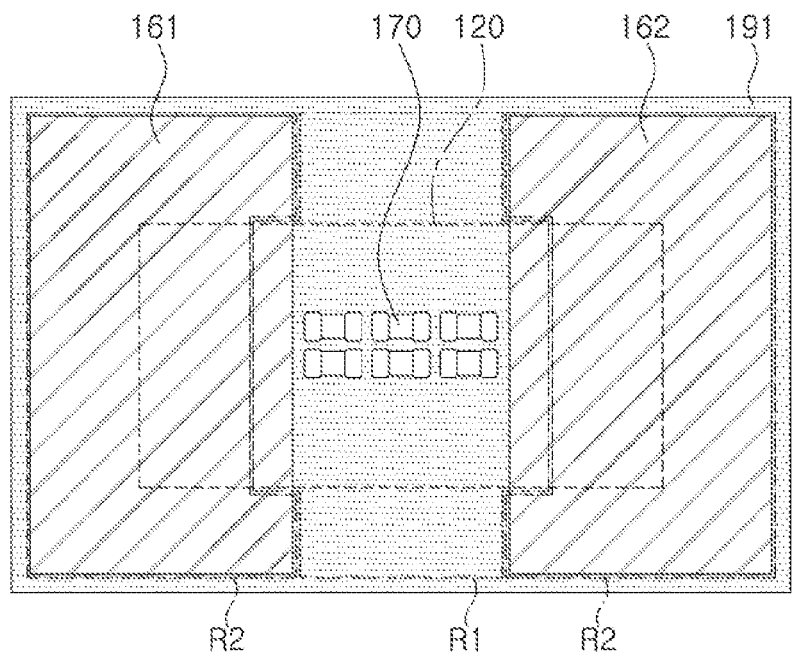
FIG. 11 is a schematic plan view taken along line II-II' of the semiconductor package in FIG. 9.

Referring to FIGS. 9 to 11, a semiconductor package 100A includes a connection structure 140 having a top surface and a bottom surface disposed to oppose each other, a frame 110, disposed on the bottom surface of the connection structure 140, having a penetration portion 110H, a first semiconductor chip 120 disposed in the penetration portion 110H on the bottom surface of the connection structure 140, an encapsulant 130, disposed on the bottom surface of the connection structure 140, covering at least a portion of each of the frame 110 and the first semiconductor chip 120 and filling at least a portion of the penetration portion 110H, a first passivation layer 150 disposed on the top surface of the connection structure 140, second and third semiconductor chips 161 and 162 respectively disposed on the first passivation layer 150, at least one passive component 170 disposed between the second and third semiconductor chips 161 and 162 on the first passivation layer 150, a molding material 191, disposed on the first passivation layer 150, covering at least a portion of each of the second and third semiconductor chips 161 and 162 and the passive component 170, a second passivation layer 180 disposed at a lower side of the frame 110, and a plurality of electrical connection metals 190 disposed in a plurality of openings of the second passivation layer 180, respectively.

The connection structure 140 includes one or more redistribution layers 142. The first semiconductor chip 120 is disposed on the bottom surface of the connection structure 140 in such a manner that a surface, on which the first connection pad 120P is disposed, faces the bottom surface of the connection structure 140. The second and third semiconductor chips 161 and 162 are disposed on the top surface of the connection structure 140 in such a manner that a surface, on which second and third connection pads 161P and 162P are disposed, faces the top surface of the connection structure 140, respectively. The connection structure 140 has a first region R1, including a region overlapping the passive component 170, and second regions R2 including regions respectively overlapping at least portions of the second and third semiconductor chips 161 and 162, when viewed from above. Being viewed from above refers to being viewed in a thickness direction or a laminating direction of the semiconductor package 100A. The thickness direction or the laminating direction of the semiconductor package 100A may be parallel to a thickness direction of a semiconductor chip, such as one of the first to third semiconductor chips 120, 161, and 162. The first region R1 is disposed between the second regions R2. The first region R1 may overlap at least another portion of each of the second and third semiconductor chips 161 and 162, when viewed from above. The redistribution layer 142 mainly includes a power pattern and/or a ground pattern in the first region R1, and mainly includes a signal pattern in the second region R2. For example, in the first region R1, an area occupied by patterns of the redistribution layer 142 to transmit power and patterns of the redistribution layer 142 connected to ground is greater than an area occupied by patterns of the redistribution layer 142 to transmit signals. In the each of the second regions R2, an area occupied by patterns of the redistribution layer 142 to transmit signals is greater than an area occupied by patterns of the redistribution layer 142 to transmit power and patterns of the redistribution layer 142 connected to ground.

Recently, various methods have been applied to improve performance of an application process (AP), a core component of smart electronic devices. One of the methods is functional partition of an AP. For example, when dies are functionally divided to be designed as semiconductor chips and the semiconductor chips are packaged according to optimal processes and characteristics, improved performance may be implemented as compared to a single AP according to a related art. However, a high-tech packaging method is required. Accordingly, there is a need for a new type of package structure in which a plurality of divided semiconductor chips may be packaged to have optimum signal and power characteristics.

In view of the foregoing, a semiconductor package 110A according to an example embodiment includes the first semiconductor chip 120 and the second third semiconductor chips 161 and 162 performing different functions. The first semiconductor chip 120 and the second third semiconductor chips 161 and 162 are respectively disposed on opposite sides of the connection structure 140, including one or more redistribution layers 142, in such a manner that the first connection pad 120P and the first and second connection pads 161P and 162P are disposed to oppose each other with the connection structure 140 interposed therebetween. At least one passive component 170 is disposed between the second and third semiconductor chips 161 and 162 on the top surface of the connection structure 140. The redistribution layer 142 of the connection structure 140 is designed to correspond to the arrangement of the first to third semiconductor chips 120, 161, and 1621 and the passive component 170. More specifically, a power pattern and/or a ground pattern is mainly designed to be in the first region R1 in which the passive component 170 is mainly disposed, and a signal pattern is mainly designed to be in the second region R2 in which the second and third semiconductor chips 161 and 162 are mainly disposed. Accordingly, an optimal signal and power path may be provided therebetween to improve signal and power characteristics of a package.

At least a portion of each of the second and third semiconductor chips 161 and 162 is disposed to overlap the first semiconductor chip 120, when viewed from above. In this case, a portion of the first connection pad 120P is electrically connected to a portion of each of the second and third connection pads 161p and 162P through a signal pattern of the redistribution layer 142 in the second region R2. Another portion of each of the passive component 170 and the first to third connection pads 120P, 161P, and 162P is electrically connected to a power pattern and/or a ground pattern of the redistribution layer 142 in the first region R1. Thus, the first semiconductor chip 120 and the second and third semiconductor chips 161 and 162 may allow signals to be vertically connected through the signal pattern of the redistribution layer 142 in the second region R2 of the connection structure 140 and a corresponding connection via 143. Additionally, power may be supplied to the passive component 170 from an optimal distance. As a result, signal and power characteristics may be optimized.

Each of the first to third semiconductor chips 120, 161, and 162 may be a chip in which functions of the application processor (AP) are divided. For example, each of the first to third semiconductor chips 120, 161, and 162 may be a chip constituting some or all functions of an application processor (AP). In the semiconductor package 100A, the first to third semiconductor chips 120, 161, and 162 may be disposed in a specific form together with the passive component 170, and the redistribution layer 142 and the connection via 143 of the connection structure 140 may be designed according to the specific form. Thus, the package 100A having improved signal and power characteristics may be implemented more easily than in the case in which an application process according to a related art is packaged in a single unit.

The frame 110 includes a plurality of insulating layers 111a, 111b, and 111c, a plurality of wiring layers 112a, 112b, 112c, and 112d, and a plurality of wiring via layers 113a, 113b, and 113c. The penetration portion 110H of the frame 110 is in the form of a blind cavity having a bottom surface on which a stopper layer 112bM is disposed. The first semiconductor chip 120 is disposed on the blind cavity-type penetration portion 110H in such a manner that a bottom surface opposing the surface, on which the first connection pad 120P is disposed, is attached to the stopper layer 112bM via an adhesive member 125 or the like. Accordingly, when the first semiconductor chip 120, generating heat more severely, is disposed, heat is easily radiated to a lower side of the semiconductor package 100A through the stopper layer 112bM. For example, when the semiconductor package 100A is mounted on a printed circuit board, not illustrated, heat may be easily radiated to the printed circuit board. Among the plurality of wiring layers 112a, 112b, 112c, and 112d, at least one wiring layer 112d may be disposed in a position lower than the stopper layer 112bM. Since the wiring layer 112d may serve as a backside wiring layer, an additional backside process is not required.

Hereinafter, the components included in the semiconductor package 100A according to an example embodiment will be described in further detail.

The frame 110 may further improve rigidity of the package 100A according to a detailed material and may serve to secure thickness uniformity and the like of the encapsulant 130. Since the frame 110 includes the wiring layers 112a, 112b, 112c, and 112d and the wiring via layers 113a, 113b, and 113c, the frame 110 may serve as an electrical connection member. The frame 110 includes the wiring layer 112d disposed in a position lower than a rear surface of the first semiconductor chip 120, a backside wiring layer for the first semiconductor chip 120 may be provided without an additional process of forming a backside wiring layer. The frame 110 has the blind cavity-type penetration portion 110H, formed as a stopper, and the first semiconductor chip 120 has a rear surface attached to the stopper layer 112bM via an adhesive member 125, such as a die attach film (DAF), known in the art. The stopper layer 112bM may be a metal plate to easily radiate heat, generated by the first semiconductor chip 120, to a lower side of the package 100A. The penetration portion 110H may be formed by a sandblasting process and have a predetermined angle of inclination. In this case, the first semiconductor chip 120 may be disposed more easily. Although not illustrated in the drawings, a metal layer, not illustrated, may be disposed on a wall surface of the penetration portion 110H of the frame 110. An electromagnetic shielding effect and a heat radiation effect may be improved through the metal layer.

The frame 110 includes a first insulating layer 111a, a first wiring layer 112a disposed on a top surface of the first insulating layer 111a, a second wiring layer 112b disposed on a bottom surface of the first insulating layer 111a, a second insulating layer 111b disposed on the top surface of the first insulating layer 111a to cover at least a portion of the first wiring layer 112a, a third wiring layer 112c disposed on a top surface of the second insulating layer 111b, a third insulating layer 111c disposed on the bottom surface of the first insulating layer 111a to cover at least a portion of the second wiring layer 112b, and a fourth wiring layer 112d disposed on a bottom surface of the third insulating layer 111c. The frame 110 further includes a first wiring via layer 113a penetrating through the first insulating layer 111a and electrically connecting the first and second wiring layers 112a and 112b to each other, a second wiring via layer 113b penetrating through the second insulating layer 112b and electrically connecting the first and third wiring layers 112a and 112c to each other, and a third wiring via layer 113c penetrating through the third insulating layer 111c and electrically connecting the second and fourth wiring layers 112b and 112d to each other. The first to fourth wiring layers 112a, 112b, 112c, and 112d may be electrically connected to each other. Each of the first to fourth wiring layers 112a, 112bv, 112c, and 112d may also be electrically connected to the redistribution layer 142 of the connection structure 140 depending on a detailed function.

The stopper layer 112bM is disposed on the bottom surface of the first insulating layer 111a, and has a bottom surface, covered with the second insulating layer 112b, and a top surface. At least a portion of the top surface of the stopper layer 112bM is exposed by the penetration portion 110H. The penetration portion 110H penetrates through the first and second insulating layers 111a and 111b, and does not penetrate the third insulating layer 111c. However, this is merely an example, and the stopper layer 112M may be disposed on a lower side of the third insulating layer 111c to penetrate through the first to third insulating layers 111a, 111b, and 111c. In the stopper layer 112bM, an edge region in contact with the first insulation layer 111a may have a thickness greater than a thickness of a region exposed from the first insulation layer 111a by the penetration portion 110H. This is because a portion of the exposed region of the stopper layer 112bM may also be removed during a sandblasting process.

The stopper layer 112bM may be a metal plate including a metal such as titanium (Ti), copper (Cu), or the like. However, a material of the stopper layer 112bM is not limited thereto, and the stopper layer 112bM may include a material having an etching rate lower than a metal such as copper (Cu) in a sandblasting process. For example, the stopper layer 112bM may be an insulating film including an insulating material. More specifically, the stopper layer 112bM may be, for example, a dry film photoresist (DFR) including a photosensitive polymer.

The insulating layers 111a, 111b, and 111c may be formed of an insulating material. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. When a high-rigidity material such as prepreg is used, the frame 110 may be used as a support member for controlling warpage of the package 100A or a core member.

The first insulating layer 111a may have a thickness greater than a thickness of each of the second and third insulating layers 111b and 111c. This is because the first insulating layer 111a may basically have a relatively greater thickness to maintain rigidity, and the second and third insulating layers 111b and 111c may be introduced to form a greater number of wiring layers 112c and 112d. From a similar point of view, a wiring via of the first wiring via layer 113a penetrating through the first insulating layer 111a may have an average diameter and a height greater than an average diameter and a height of a wiring via of each of the second and third wiring via layers 113b and 113c penetrating through the second and third insulating layers 111b and 111c.

Together with the wiring via layers 113a, 113b, and 113c, the wiring layers 112a, 112b, 112c, and 112d may provide upper and lower electrical connection paths. A material forming each of the wiring layers 112a, 112b, 112c, and 112d may be a metal material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform various functions depending on designs thereof. For example, a ground pattern, a power pattern, a signal pattern, and the like may be included. The ground pattern and the signal pattern may include a wiring and a pad. The signal pattern includes various signals, such as a data signal and the like, except for the ground pattern, the power pattern, and the like. The term "pattern" refers to a concept including a wiring and a pad.

Each of the wiring layers 112a, 112b, 112c, and 112d may have a thickness greater than a thickness of the redistribution layer 142 of the connection structure 140. The frame 110 may be formed in a panel level by a board process, such that each of the wiring layers 112a, 112b, 112c, and 112d may also be formed to have a greater size. Meanwhile, the connection structure 140 requires a fine design such as a fine pitch, such that the redistribution layer 142 may be formed to have a relatively smaller size.

The wiring via layers 113a, 113b, and 113c electrically connect the wiring layers 112a, 112b, 112c, and 112d, disposed on different layers, to form an electrical path in the frame 110. The above-mentioned metal material may be used as a material forming wiring via layers 113a, 113b, and 113c. A wiring via of each of the wiring via layers 113a, 113b, and 113c may be a filled-type via, filled with a metal material, or a conformal-type via formed along a wall surface of a via hole. The wiring via of the first wiring via layer 113a may have a cylindrical cross-sectional shape or an hourglass cross-sectional shape, and the wiring via of each of the second and third wiring via layers 113b and 113c may have a tapered cross-sectional shape. In this case, the wiring via of each of the second and third wiring vias 113b and 113c may have a cross-sectional shape tapered in opposite directions on the basis of the first insulating layer 111a.

The first semiconductor chip 120 may be an integrated circuit (IC) provided in an amount of several hundred to several million or more elements integrated in a single chip. The first semiconductor chip 120 may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and the first semiconductor chip 120 may be a chip in which some functions of the application processor (AP) are divided, for example, a central processor (CPU), a graphics processor (GPU), a field programmable gate array (FPGA), a digital signal processor, a cryptographic processor, a microprocessor, and/or a microcontroller, or may be a chip in which other functions, not mentioned herein, are divided.

The first semiconductor chip 120 may be a die formed based on an active wafer. A base material of a body of the first semiconductor chip 120 may be silicon (Si), germanium (Ge), gallium arsenide (GaAs), or the like. Various circuits may be formed on the body 121. The first connection pad 120P may electrically connect the semiconductor chip 120 to other components. A material forming the first connection pad 120P may be a metal material such as copper (Cu), aluminum (Al), or the like. A passivation layer, not illustrated, may be formed on the body to expose the first connection pad 120P. The passivation layer may be an oxide layer, a nitride layer, or the like, or a double layer of an oxide layer and a nitride layer. An insulating layer, not illustrated, or the like may be further disposed at a necessary position. The first semiconductor chip 120 may be a bare die, but may be a packaged die on which an additional redistribution, not illustrated, is further disposed on a surface, on which the first connection pad 120P is disposed, for example, an active surface.

The first semiconductor chip 120 may further include a first electrical connection bump 120B connected to the first connection pad 120P. The first electrical connection bump 120B may be formed of copper (Cu) or the like. The semiconductor package 100A may be subjected to a grinding process on the encapsulant 130. As a result, an upper surface of the encapsulant 130, a surface, which is in contact with the connection via 143, of the third wiring layer 112c, the uppermost wiring layer of the frame 110, may be coplanar with a surface, which is in contact with the connection via 143, of the first electrical connection bump 120B. The term "coplanar" refers to a concept including a fine difference depending on a processor error. Accordingly, the connection via 143, connecting the first electrical connection bump 120B to the redistribution layer 142, may have the same height as the connection via 143 connecting the third wiring layer 112c to the redistribution layer 142. The term "same" also refers to a concept including a fine difference, depending on a process error. As described above, when a surface, on which the connection structure 140 is formed, is a planar surface, the insulating layer 141 may be formed to be planar. Accordingly, the redistribution layer 142, the connection via 143, or the like may be formed more finely. As necessary, an additional electrical connection metal, not illustrated, may be disposed on the third wiring layer 112c to prevent copper (Cu) burr or the like. Since the electrical connection metal, not illustrated, is ground, a surface in contact with the connection via 143 of the electrical connection metal, not illustrated, may have the above-described relationship.

The encapsulant 130 may protect the frame 110, the first semiconductor chip 120, and the like. An encapsulation form is not limited. For example, the encapsulant 130 may cover a surface on which the frame 110 and the first connection pad 120P of the first semiconductor chip 120 are disposed, and may fill at least a portion of the penetration portion 110H. The encapsulant 130 may fill the penetration portion 110H to serve as an adhesive according to a detailed material and to reduce buckling.

A material of the encapsulant 130 is not limited. For example, an insulating material may be used as a material of the encapsulant 130. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. As necessary, a photoimageable encapsulant (PIE) resin may be used as a material of the encapsulant 130.

The connection structure 140 may redistribute the first to third connection pads 120P, 161P, and 162P of the first to third semiconductor chips 120, 161, and 162. The connection structure 140 may electrically connect the first to third connection pads 120P, 161P, and 162P to each other depending on function. The connection structure 140 may electrically connect the first to third connection pads 120P, 161P, and 162P to the passive component 170 depending on function. The connection structure 140 may electrically connect the first to third connection pads 120P, 161P, and 162P to the wiring layers 112a, 112b, 112c, and 112d of the frame 110 depending on function. Several tens to several hundreds of first to third connection pads 120P, 161P, and 162P may be redistributed and may be physically and/or electrically connected through the electrical connection metal 190 depending on function. The connection structure 140 includes an insulating layer 141, a redistribution layer 142, disposed on the insulating layer 141, and a connection via 143 penetrating through the insulating layer 141. The insulating layers 141, the redistribution layers 142, and the connection vias 143 may include a larger number of layers than those illustrated in the drawings. Alternatively, the insulating layers 141, the redistribution layers 142, and the connection vias 143 may include a smaller number of layers than those illustrated in the drawings.

A material of the insulating layers 141 may be an insulating material. In this case, a photoimageable dielectric (PID) material may also be used as the insulating material in addition to the above-described insulating materials. For example, the insulating layers 141 may be a photosensitive insulating layer. When the insulating layer 141 has photosensitive properties, a fine pitch of the connection via 143 may be achieved more easily. Even when the insulating layer 141 includes multiple layers, materials of the multiple layers may be identical to each other and, as necessary, may be different from each other. When the insulating layer 141 includes multiple layers, the multiple layers are integrated with each other, such that boundaries therebetween may not be readily apparent, but are not limited thereto.

The redistribution layer 142 may substantially serve to redistribute the first to third connection pads 120P, 161P, and 162P, and may provide the above-mentioned electrical connection path. A material forming the redistribution layer 142 may be a metal material such as copper (Cu), aluminum (Al), silver (Ag), tin (Sn), gold (Au), nickel (Ni), lead (Pb), titanium (Ti), or alloys thereof. The redistribution layer 142 may perform various functions depending on a design of a corresponding layer. For example, the redistribution layer 142 may include a ground pattern, a power pattern, a signal pattern, and the like. The signal pattern may include various signals, such as data signal and the like, except for the ground pattern, the power pattern, and the like. The term "pattern" refers to a concept including a wiring and a pad. The redistribution layer 142 mainly includes a power pattern and/or a ground pattern in the first region R1 and mainly includes a signal pattern in the second region R2.

The connection via 143 may electrically connect the redistribution layers 142, the first to third connection pads 120P, 161P, and 162P, the third wiring layer 112c, disposed on different layers, and the like. As a result, an electrical path is formed in the connection structure 140. A material forming the connection via 143 may be a metal material such as copper (Cu), aluminum (Al), silver (Ag), tin (Sn), gold (Au), nickel (Ni), lead (Pb), titanium (Ti), or alloys thereof. The connection via 143 may be a filled-type via filled with the metal material, or a conformal-type via formed along a wall surface of a via hole. Moreover, the connection via 143 may have a tapered cross-sectional shape. A tapered direction may be the same as that of the wiring via of the second wiring via layer 113b.

The first passivation layer 150 is an additional component for protecting the connection structure 140 from external physical and chemical damage and the like. The first passivation layer 150 may include a thermosetting resin. For example, the first passivation layer 150 may be an ABF, but a material of the first passivation layer 150 is not limited thereto. The first passivation layer 150 may have a plurality of openings exposing at least a portion of the uppermost redistribution layer 142. There may be several tens to several tens of thousands of openings. The number of openings may be greater or smaller than several tens to several tens of thousands. Each opening may include a plurality of holes.

Each of the second and third semiconductor chips 161 and 162 may also be an integrated circuit (IC) provided in an amount of several hundred to several million or more elements integrated in a single chip. Each of the second and third semiconductor chips 161 and 162 may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and each of the second and third semiconductor chips 161 and 162 may be a chip in which some functions of the application processor (AP) are divided, for example, a central processor (CPU), a graphics processor (GPU), a field programmable gate array (FPGA), a digital signal processor, a cryptographic processor, a microprocessor, and/or a microcontroller, or may be a chip in which other functions, not mentioned herein, are divided. As an unlimited example, the first to third semiconductor chips 120, 161, and 162 may be combined to constitute a single complete application processor (AP). In this case, the first semiconductor chip 120 may be a main chip, and the second and third semiconductor chips 161 and 162 may be sub-chips. However, the first to third semiconductor chips 120 and 161 and 162 are not limited thereto, and each of the second and third semiconductor chips 161 and 162 may be a memory such as a volatile memory (DRAM), a nonvolatile memory (ROM), a flash memory, or the like.

Each of the second and third semiconductor chips 161 and 162 may also be a die formed based on an active wafer. A base material of a body of each of the second and third semiconductor chips 161 and 162 may also be silicon (Si), germanium (Ge), gallium arsenide (GaAs), or the like. Various circuits may be formed on the body of each of the second and third semiconductor chips 161 and 162. The second and third connection pads 161P and 162P may electrically connect the second and third semiconductor chips 161 and 162 to other components. A material forming the second and third connection pads 161P and 162P may also be a metal material such as copper (Cu), aluminum (Al), or the like. A passivation layer, not illustrated, may be formed on the body of each of the second and third semiconductor chips 161 and 162 to expose the second and third connection pad 161Ps and 162P. The passivation layer may be an oxide layer, a nitride layer, or the like, or a double layer of an oxide layer and a nitride layer. An insulating layer, not illustrated, or the like may be further disposed at a necessary position. Each of the second and third semiconductor chips 161 and 162 may be a bare die, but may be a packaged die on which an additional redistribution, not illustrated, is further disposed on a surface, on which the second and third connection pads 161P and 162P are disposed, for example, an active surface.

The second and third semiconductor chips 161 and 162 may be disposed on a top surface of the connection structure 140 in a surface-mount form using surface-mount technology (SMT). The second and third semiconductor chips 161 and 162 may include second and third electrical connection bumps 161B and 162B disposed on the second and third connection pads 161P and 162P, respectively. The second and third electrical connection bumps 161B and 162B may also be formed of a metal material such as copper (Cu) or the like. The second and third semiconductor chips 161 and 162 may be mounted on the top surface of the connection structure 140 through tin (Sn) or a Sn-containing alloy, for example, low melting point metals 161s and 162s such as solders, respectively. The low melting point metals 161s and 162s may be exposed to a plurality of openings of the first passivation layer 150 to be connected to the redistribution layer 142, respectively. The low melting point metal may be connected to the second and third connection pads 161P and 162P or to the second and third electrical connection bumps 161B and 162B. As a result, an electrical connection path may be provided. Underfill resins 161r and 162r may be disposed at lower sides of the second and third semiconductor chips 161 and 162, respectively. The underfill resins 161r and 162r may fix the second and third semiconductor chips 161 and 162. The underfill resin 161r and 162r may cover at least a portion of each of the second and third connection pads 161P and 162P, at least a portion of the second and third electrical connection bumps 161B and 162B, and at least a portion of the low melting point metals 161s and 162s. Each of the underfill resins 161r and 162r may be, for example, an epoxy resin or the like, but is not limited thereto.

The passive component 170 may be a chip-type capacitor such as a multilayer ceramic capacitor (MLCC) or a low inductance ceramic capacitor (LICC), or a chip-type inductor such as a power inductor. However, the passive component 170 is not limited thereto and may be another type of passive component well known in the art. For example, the passive component 170 may be a chip-type passive component well known in the art. The term "chip-type component" refers to, for example, an independent chip-type component including a body, internal electrodes, formed inside the body, and external electrodes formed on the body. The passive components 170 may be the same type or different types. The number of the passive components 170 is not limited, and may be greater than or smaller than the number of those illustrated in the drawings depending on design. The passive component 170 is also disposed in a surface-mount form through a low melting point metal such as a solder or the like.

The second passivation layer 180 is an additional component for protecting the frame 110 from external physical and chemical damage and the like. The second passivation layer 180 may also include a thermosetting resin. For example, the second passivation layer 180 may be an ABF, but a material of the second passivation layer 180 is not limited thereto. Each second passivation layer 180 may have a plurality of openings exposing at least a portion of the fourth wiring layer 112d, a lowermost wiring layer, of the frame 110. There may be several tens to several tens of thousands of openings. The number of openings may be greater or smaller than several tens to several tens of thousands. Each opening may include a plurality of holes.

The electrical connection metal 190 is also an additional component for electrically and/or physically connecting the semiconductor package 100A to an external device. For example, the semiconductor package 100A may be mounted on a mainboard of an electric device through the electrical connection metal 190. The electrical connection metal 190 is disposed on each opening of the second passivation layer 180. Accordingly, the electrical connection metal 190 may be electrically connected to the exposed fourth wiring layer 112d. As necessary, an underbump metal, not illustrated, may be formed on a plurality of openings of the second passivation layer 180. In this case, the electrical connection metal 190 may be electrically connected to the exposed fourth wiring layer 112d through the underbump metal, not illustrated. Each electrical connection metal 190 may include a low melting point metal, for example, tin (Sn) or a Sn-containing alloy. In further detail, the electrical connection metal 190 may be formed of a solder or the like. However, this is merely an example, and a material of the electrical connection metal 190 is not limited thereto.

The electrical connection metal 190 may be a land, a ball, a pin, or the like. The electrical connection metal 190 may be formed as a multilayer structure or a single-layer structure. When the electrical connection metal 190 is formed as a multilayer structure, the electrical connection metal 190 includes a copper pillar and a solder. When the electrical connection structure metal 190 is formed as a single-layer structure, the electrical connection metal 190 includes a tin-silver solder or copper. However, this is merely an example, and a structure and a material of the electrical connection metal 190 are not limited thereto. The number, an interval, a dispositional form, and the like, of the electrical connection metal 190 are not limited, but may be sufficiently modified depending on design by those skilled in the art. For example, several tens to several tens of thousands of electrical connection metals 190 may be provided according to the number of connection pads 122. The number of electrical connection metals 190 may be greater than or smaller than several tens to several tens of thousands.

At least one of the electrical connection metals 190 may be disposed in a fan-out region. The term "fan-out region" refers to a region except for a region in which the semiconductor chip 120 is disposed. For example, the semiconductor package 100A may be a fan-out semiconductor package. The fan-out package may have improved reliability as compared to a fan-in package, may allow a plurality of input/output (I/O) terminals to be implemented, and may facilitate a three-dimensional (3D) interconnection. Moreover, as compared to a ball grid array (BGA) package, a land grid array (LGA) package, or the like, the fan-out package may be manufactured to have a small thickness, and may be superior in price competitiveness.

The molding material 191 is an additional component for protecting the second and third semiconductor chips 161 and 162 and the passive component 170. The molding material 191 may cover at least a portion of each of the first and second semiconductor chips 161 and 162 and at least a portion of the passive component 170. The molding material 191 may include a material different from a material of the encapsulant 130. For example, the molding material 191 may be an epoxy molding component (EMC). As necessary, the molding material 191 may be ground for heat radiation of the second and third semiconductor chips 161 and 162. As a result of the grinding, rear surfaces of the second and third semiconductor chips 161 and 162 may be exposed.

Figure 12:
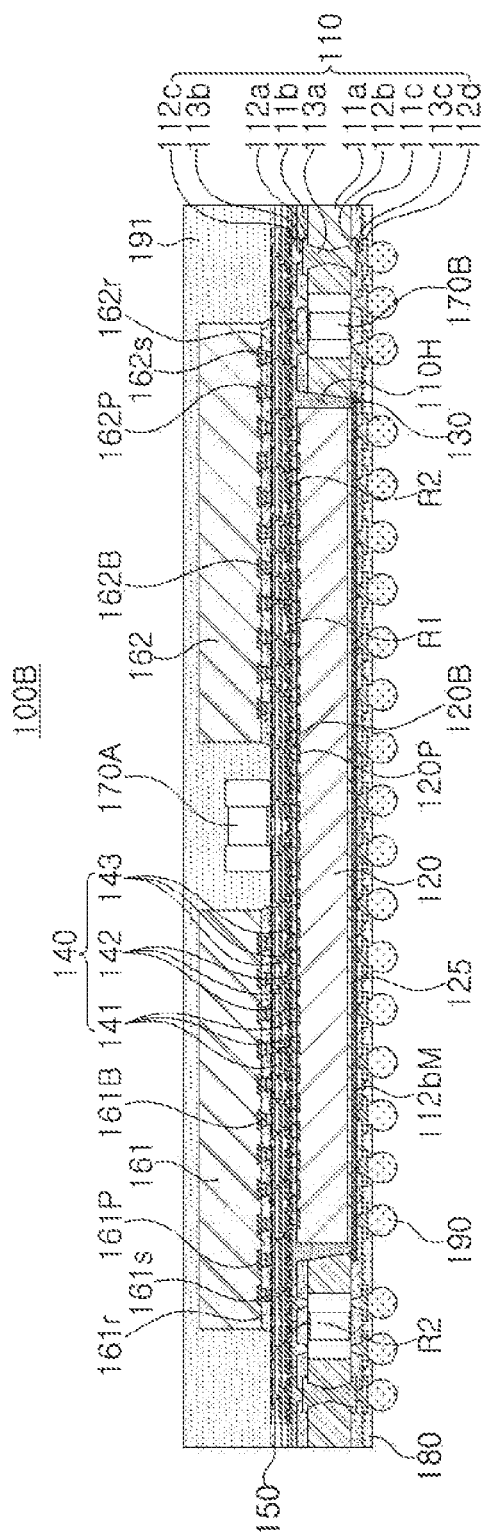
FIG. 12 is a cross-sectional view schematically illustrating a modified example of the semiconductor package in FIG. 9.

FIG. 12 is a cross-sectional view schematically illustrating a modified example of the semiconductor package in FIG. 9.

Referring to FIG. 12, a semiconductor package 100B according to a modified embodiment includes a first passive component 170A, disposed on a top surface of a connection structure 140 in a surface-mount form, and a second passive component 170B embedded in a frame 110. The second passive component 170B is electrically connected to at least some of first to fourth wiring layers 112a, 112b, 112c, and 112d depending on function. As a result, the second passive component 170B may also be electrically connected to first to third connection pads 120P, 161P, and 162P depending on function. The second passive component 170B may be a chip-type capacitor such as a multilayer ceramic capacitor (MLCC) and a low inductance ceramic capacitor (LICC), or a chip-type inductor such as a power inductor. However, the second passive component 170B is not limited thereto, and may be another type of passive component well known in the art. The second passive components 170B may be the same type or different types. The number of the passive components 170 is not limited, and may be greater than or smaller than the number of those illustrated in the drawings depending on design.

The other descriptions are substantially the same as the detailed description of the semiconductor package 100A according to an example embodiment, and will be omitted herein.

Figure 13:
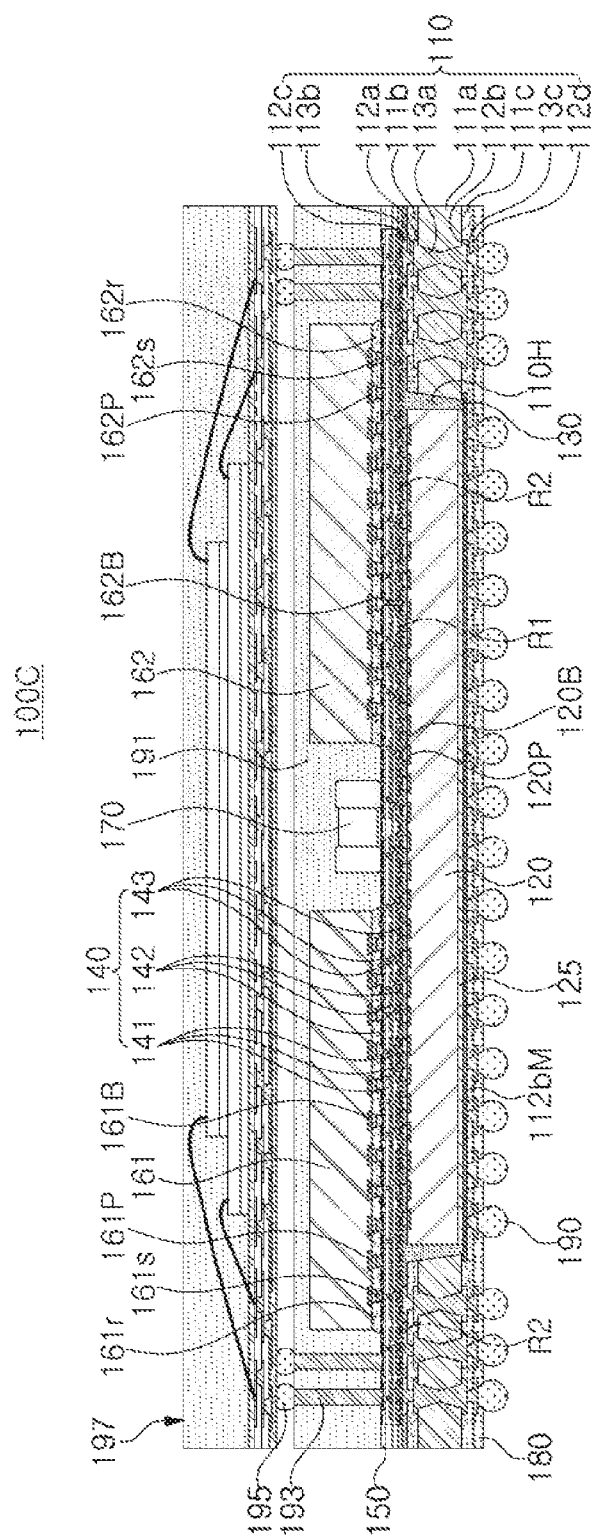
FIG. 13 is a cross-sectional view schematically illustrating a modified example of the semiconductor package in FIG. 9.

FIG. 13 is a cross-sectional view schematically illustrating a modified example of the semiconductor package in FIG. 9.

Referring to FIG. 13, a semiconductor package 100C according to another modified embodiment further includes a memory package 197 disposed in the form of package-on-package (PoP). The semiconductor package 100C further includes a penetration wiring 193, penetrating through a molding material 191 for electrical connection to the memory package 197, and a second electrical connection metal 195 connecting the penetration wiring 193 and the memory package 197 to each other. The memory package 197 may have a structure in which one or more memory chips are disposed on a wiring board and connected to the wiring board using wire bonding or the like, but a structure of the memory package 197 is not limited thereto. As necessary, instead of the memory package 197, another type of package may be disposed. The penetration wiring 193 may be a metal post, and the second electrical connection metal 195 may be a low melting point metal such as a solder. As such, the semiconductor package 100C according to another modified embodiment may be a package including both an application processor (AP) and a memory.

The other descriptions are substantially the same as the detailed description of the semiconductor package 100A according to an example embodiment, and will be omitted herein. It should be apparent that features of the semiconductor package 100B according to another modified embodiment may be introduced to the semiconductor package 100C according to another modified embodiment. For example, the semiconductor packages 100B and 100C may be combined with each other.

Figure 14:
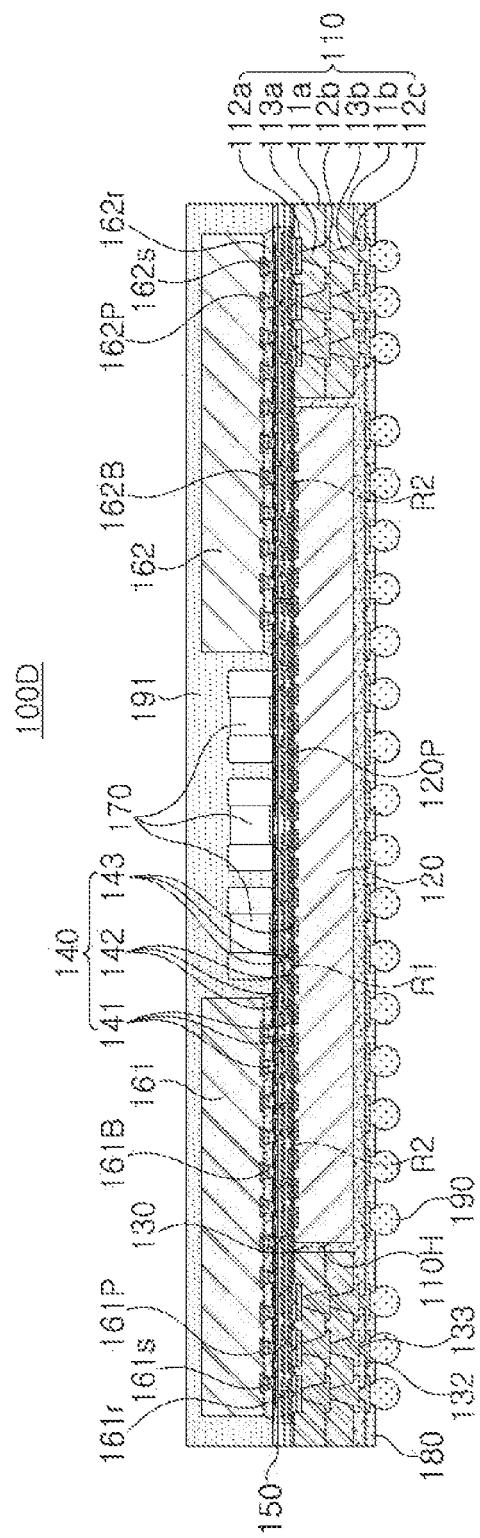
FIG. 14 is a cross-sectional view schematically illustrating a modified example of the semiconductor package in FIG. 9.

FIG. 14 is a cross-sectional view schematically illustrating a modified example of the semiconductor package in FIG. 9.

Referring to FIG. 14, a semiconductor package 100D includes another type of frame 110. More specifically, the frame 110 has a through-hole type penetration portion 110H, and a first semiconductor chip 120 is disposed on the penetration portion 110H in such a manner that a surface, on which a first connection pad 120P is disposed, faces a bottom surface of a connection structure 140. In this case, the first connection pad 120P may be connected to a connection via 143 of the connection structure 140 without an additional bump. In the present embodiment, the frame 110 includes a first insulating layer 111a in contact with a bottom surface of the connection structure 140, a first wiring layer 112a embedded in the first insulating layer 111a while being in contact with the bottom surface of the connection structure 140, a second wiring layer 112b disposed on a side opposing a side in which the first wiring layer 112a of the first insulating layer 111a is embedded, a second insulating layer 111b, disposed on a side opposing the side in which the first wiring layer 112a of the first insulating layer 111a is embedded, covering at least a portion of the second wiring layer 112b, a third wiring layer 112c disposed on a side opposing a side in which the second wiring layer 112b of the second insulating layer 111b is embedded, a first connection via layer 113a penetrating through the first insulating layer 111a and electrically connecting the first and second wiring layers 112a and 112b to each other, and a second connection via layer 113b penetrating through the second insulating layer 111b and electrically connecting the second and third wiring layers 112b and 112c to each other.

The first wiring layer 112a may be recessed into the first insulating layer 111a. For example, a surface, brought into contact with a bottom surface of the connection structure 140 of the first insulating layer 111a, may have a step with respect to a surface brought into contact with a bottom surface of the connection structure 140 of the first wiring layer 112a. In this case, when the first semiconductor chip 120 and the frame 110 are encapsulated using an encapsulant 130, bleeding of an encapsulant material may be suppressed to prevent the first wiring layer 112a from being contaminated by the encapsulant material. Each of the first to third wiring layers 112a, 112b, and 112c may have a thickness greater than a thickness of each redistribution layer 142.

When a hole is formed for the first wiring via layer 113a, some pads of the first wiring layer 112a may serve as a stopper. Accordingly, it is advantageous in process that a wiring via of the first wiring via layer 113a has a tapered shape in which an upper side has a width smaller than a width of a lower side. In this case, the wiring via of the first wiring via layer 113a may be integrated with a pad pattern of the second wiring layer 112b. Similarly, when a hole for the second wiring via layer 113b is formed, some pad of the second wiring layer 112b may serve as a stopper. Accordingly, it is advantageous in process that a wiring via of the second wiring via layer 113b has a tapered shape in which an upper side has a width smaller than a width of a lower side. In this case, a wiring via of the second wiring via layer 113b may be integrated with a pad pattern of the third wiring layer 112c.

As necessary, a backside wiring layer 132 and a backside via 133 may be introduced to a lower side of the encapsulant 130. The backside via 133 may penetrate through at least a portion of the encapsulant 130 to electrically connect the third wiring layer 112c and the backside wiring layer 132 to each other. A second passivation layer 180 may have a plurality of openings, each exposing at least a portion of the backside wiring layer 132. A plurality of electrical connection metals 190 may be electrically connected to the exposed backside wiring layer 132.

The backside wiring layer 132 may also serve to redistribute first to third connection pads 120P, 161P, and 162P. A material forming the backside wiring layer 132 may be a metal such as copper (Cu), aluminum (Al), silver (Ag), tin (Sn), gold (Au), nickel (Ni), lead (Pb), titanium (Ti), or alloys thereof. The backside wiring layer 132 may also perform various functions depending on design of a corresponding layer. For example, the backside wiring layer 132 may include a ground pattern, a power pattern, a signal pattern, and the like. The ground pattern and the signal pattern may include a wiring and a pad. The signal pattern includes various signals, for example, a data signal and the like except for the ground pattern, the power pattern, and the like. The term "pattern" refers to a concept including a wiring and a pad.

The backside via 133 may electrically connect the third wiring layer 112c and the backside wiring layer 132 to each other. A material forming the backside via 133 may be a metal such as copper (Cu), aluminum (Al), silver (Ag), tin (Sn), gold (Au), nickel (Ni), lead (Pb), titanium (Ti), or alloys thereof. The backside via 133 may be a filled-type via filed with a metal, or a conformal-type via formed along a wall surface of a via hole. The backside via 133 may have a tapered cross-sectional shape. A tapered direction of the backside via 133 may be the same as a tapered direction of a wiring via of each of the first and second wiring vias 113a and 113b.

The other descriptions are substantially the same as the detailed description of the semiconductor package 100A according to an example embodiment, and will be omitted herein. It should be apparent that features of the semiconductor packages 100B and 100C according to modified embodiments may be introduced to the semiconductor package 100D according to another modified embodiment. For example, the semiconductor packages 100B, 100C, and 100D may be combined with each other in various combinations.

Figure 15:
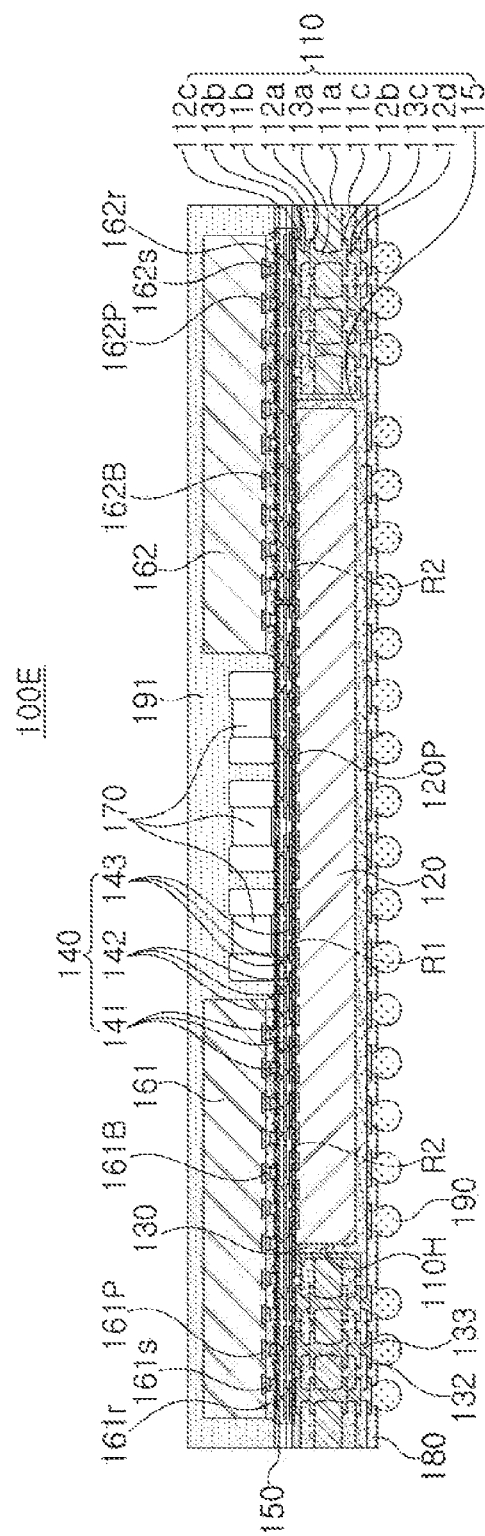
FIG. 15 is a cross-sectional view schematically illustrating a modified example of the semiconductor package in FIG. 9.

FIG. 15 is a cross-sectional view schematically illustrating a modified example of the semiconductor package in FIG. 9.

Referring to FIG. 15, a semiconductor package 100E includes another type of frame 110. More specifically, the frame 110 has a through-hole type penetration portion 110H, and a first semiconductor chip 120 is disposed on the penetration portion 110H in such a manner that a surface, on which a first connection pad 120P is disposed, faces a bottom surface of a connection structure 140. In this case, the first connection pad 120P may be connected to the connection via 143 of a connection structure 140 through an additional bump. In the present embodiment, the frame 110 includes a first insulating layer 111a, a first wiring layer 112a and a second wiring layer 112b respectively disposed on both surfaces of the first insulating layer 111a, a second insulating layer 111b and a third insulating layer 111c, respectively disposed on both surfaces of the first insulating layer 111a, respectively covering the first wiring layer 112a and the second wiring layer 112b, a third wiring layer 112c disposed on a side opposing a side in which the first wiring layer 112a of the second insulating layer 111b is embedded, a fourth wiring layer 112d disposed on a side opposing a side in which the second wiring layer 112b of the third insulating layer 111c is embedded, a first wiring via layer 113a penetrating through the first insulating layer 111a and electrically connecting the first and second wiring layers 112a and 112b to each other, a second wiring via layer 113b penetrating through the second insulating layer 111b and electrically connecting the first and third wiring layers 112a and 113c to each other, and a third wiring via layer 113c penetrating through the third insulating layer 111c and electrically connecting the second and fourth wiring layers 112b and 112d to each other. Since the frame 110 includes a greater number of wiring layers 112a, 112b, 112c, and 112d, the connection structure 140 may be further simplified.

The first insulating layer 111a may have a thickness greater than a thickness of each of the second and third insulating layers 111b and 111c. The first insulating layer 111a may have a relatively greater thickness to maintain rigidity, and the second and third insulating layers 111b and 111c may be introduced to form a greater number of wiring layers 112c and 112d. From a similar point of view, a wiring via of the first wiring via layer 113a, penetrating through the first insulating layer 111a, may have a height and an average diameter greater than a height and an average diameter of a wiring via of each of the second and third wiring via layers 113b and 113c respectively penetrating through the second and third insulating layers 111b and 111c. The wiring via of the first wiring via layer 113a may have an hourglass shape or a cylindrical shape, while the wiring vias of the second and third wiring via layers 113b and 113c may have shapes tapered in opposite directions. Each of the first to fourth wiring layers 112a, 112b, 112c, and 112d may have a thickness greater than a thickness of the redistribution layer 142.

Similarly, as necessary, a backside wiring layer 132 and a backside via 133 may be introduced on a lower side of the encapsulant 130. The backside via 133 may penetrate through at least a portion of the encapsulant 130 to electrically connect the third wiring layer 112c and the backside wiring layer 132 to each other. A second passivation layer 180 may have a plurality of openings, each exposing at least a portion of the backside wiring layer 132. A plurality of electrical wiring metals 190 may be electrically connected to the exposed backside wiring layer 132.

As necessary, a metal layer 115 may be disposed on a wall surface of the penetration portion 110H of the frame 110, and the metal layer 115 may be disposed to fully cover the wall surface. An electromagnetic shielding effect and a heat radiation effect of the first semiconductor chip 120 may be improved through the metal layer 115.

The other descriptions are substantially the same as the detailed description of the semiconductor package 100A according to an example embodiment, and will be omitted herein. It should be apparent that features of the semiconductor packages 100B and 100C according to another modified embodiment may be introduced to the semiconductor package 100E according to another modified embodiment. For example, the semiconductor packages 100B, 100C, and 100E may be combined with each other in various combinations.

Figure 16:
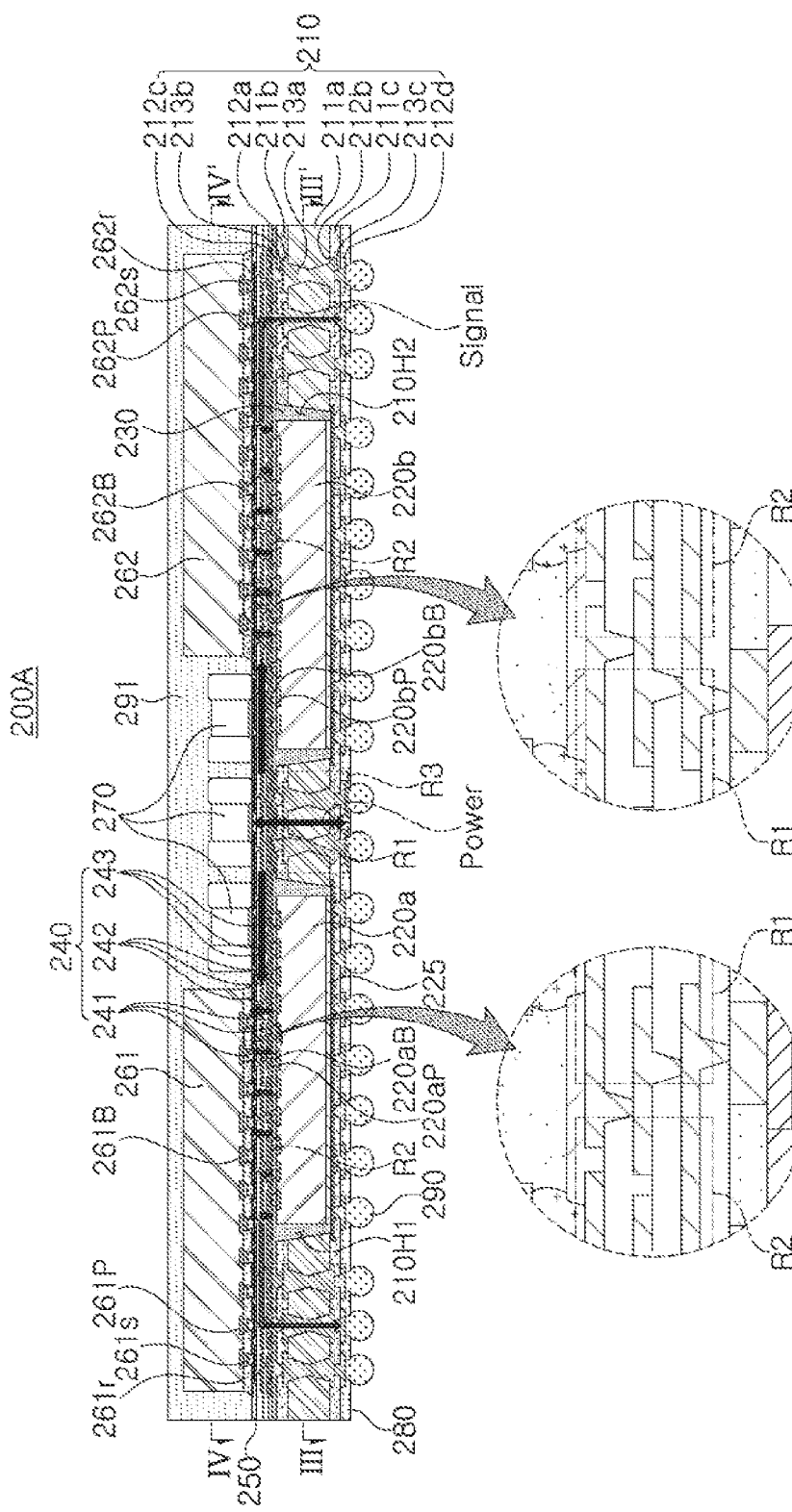
FIG. 16 is a cross-sectional view schematically illustrating another example of a semiconductor package.
Figure 17:
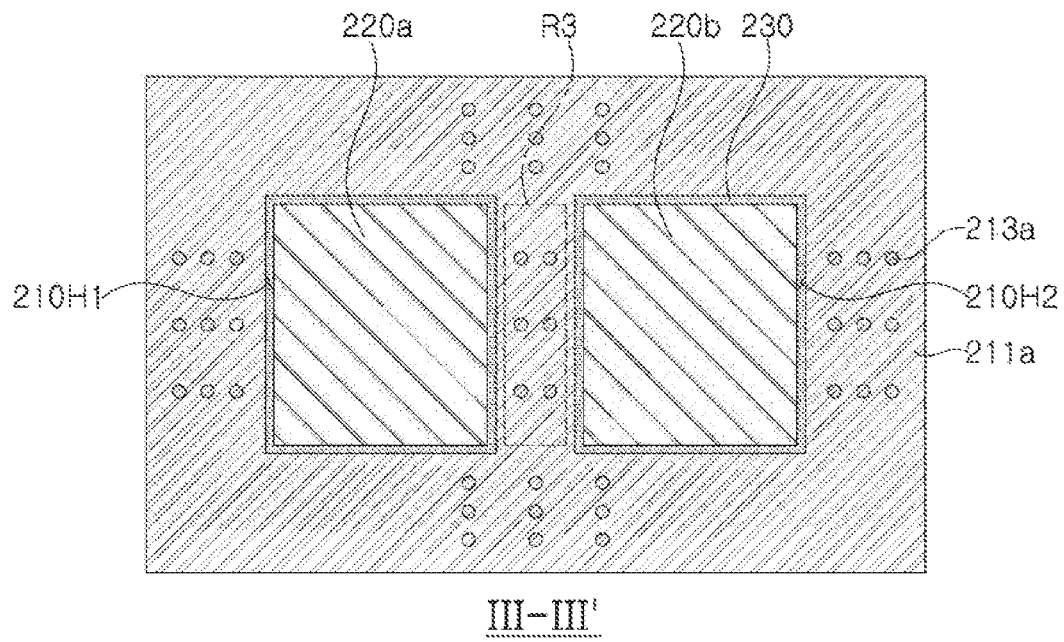
FIG. 17 is a schematic plan view taken along line of the semiconductor package in FIG. 16.

FIG. 16 is a cross-sectional view schematically illustrating another example of a semiconductor package. FIG. 17 is a schematic plan view taken along line III-III' of the semiconductor package in FIG. 16, and FIG. 18 is a schematic plan view taken along line IV-IV' of the semiconductor package in FIG. 16.

Figure 18:
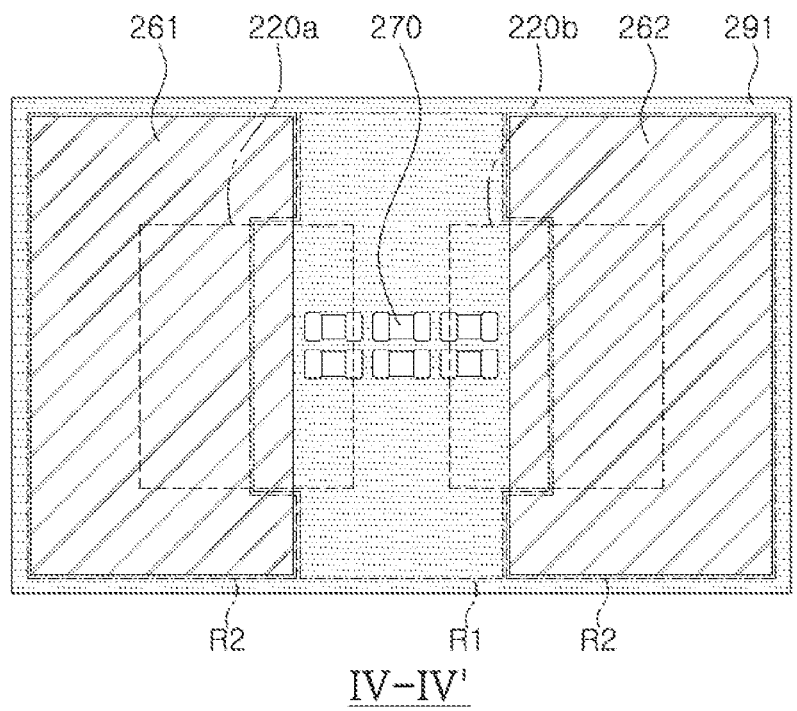
FIG. 18 is a schematic plan view taken along line IV-IV' of the semiconductor package in FIG. 16.

Referring to FIGS. 16 to 18, a semiconductor package 200A according to another embodiment includes a connection structure 240 having a top surface and a bottom surface disposed to oppose each other, a frame 210, disposed on the bottom surface of the connection structure, having first and second penetration portions 210H1 and 210H2, a first semiconductor chip 220a disposed at the first penetration portion 210H1 on the bottom surface of the connection structure 240, a second semiconductor chip 220b disposed at the second penetration portion 210H2 on the bottom surface of the connection structure 240, an encapsulant 230, disposed on the bottom surface of the connection structure 240, covering at least a portion of the frame 210 and at least a portion of each of the first and second semiconductor chips 220a and 220b and filling at least a portion of each of the first and second penetration portions 210H1 and 210H2, a first passivation layer 250 disposed on the top surface of the connection structure 240, third and fourth semiconductor chips 261 and 262 respectively disposed on the first passivation layer 250, one or more passive component 270 disposed between the third and fourth semiconductor chips 261 and 262 on the first passivation layer 250, a molding material 291, disposed on the first passivation layer 250, covering at least a portion of the third and fourth semiconductor chips 261 and 262 and at least a portion of the passive component 270, a second passivation layer 280 disposed on a lower side of the frame 210, and a plurality of electrical connection metals 290 respectively disposed on a plurality of openings of the second passivation layer 280.

The connection structure 240 includes one or more redistribution layers 242. The first and second semiconductor chips 220a and 220b are disposed side by side on the bottom surface of the connection structure 240 in such a manner that a surface, on which first and second connection pads 220aP and 220bP are disposed, faces the bottom surface of the connection structure 240, respectively. The third and fourth semiconductor chips 261 and 262 are disposed side by side on the top surface of the connection structure 240 in such a manner that a surface, on which third and fourth connection pads 261P and 262P are disposed, faces the top surface of the connection structure 240. The connection structure 240 has a first region R1, including a region overlapping the passive component 270, and second regions R2 includings respectively overlapping at least portions of the third and fourth semiconductor chips 261 and 262, when viewed from above. Being viewed from above refers to being viewed in a thickness direction or a laminating direction of the semiconductor package 200A. The thickness direction or the laminating direction of the semiconductor package 200A may be parallel to a thickness direction of a semiconductor chip, such as one of the first to fourth semiconductor chips 220a, 220b, 261, and 262. The first region R1 is disposed between the second regions R2. The first region R1 may overlap at least another portion of each of the third and fourth semiconductor chips 261 and 262, when viewed from above. The redistribution layer 242 mainly includes a power pattern and/or a ground pattern in the first region R1, and mainly includes a signal pattern in the second region R2. For example, in the first region R1, an area occupied by patterns of the redistribution layer 242 to transmit power and patterns of the redistribution layer 242 connected to ground is greater than an area occupied by patterns of the redistribution layer 242 to transmit signals. In the each of the second regions R2, an area occupied by patterns of the redistribution layer 242 to transmit signals is greater than an area occupied by patterns of the redistribution layer 242 to transmit power and patterns of the redistribution layer 242 connected to ground.

At least one of the passive components 270 is disposed to overlap a region R3 between the first and second penetration portions 210H1 and 210H2 of the frame 210, when viewed from above. A plurality of wiring layers 212a, 212b, 212c, and 212d of the frame 210 include a power pattern and/or a ground pattern electrically connected to the passive component 270 in the region R3 between the first and second penetration portions 210H1 and 210H2. A power pattern and/or a ground pattern in the first region R1 of the redistribution layer 242 are electrically connected to a power pattern and/or a ground pattern in the region R3 between the first and second penetration portions 210H1 and 210H2 of the plurality of wiring layers 212a, 212b, 212c, and 212d.

The semiconductor package 200A is disposed in such a manner that at both sides of the connection structure 240 including the at least one redistribution layer 242, the first and second semiconductor chips 220a and 220b and the third and fourth semiconductor chips 261 and 262, capable of performing different functions, are disposed to oppose each other with the connection structure 240 interposed therebetween. One or more passive components 270 are disposed between the third and fourth semiconductor chips 261 and 262 on the top surface of the connection structure 240. The redistribution layer 242 of the connection structure 240 is designed to correspond to the arrangement of the first to fourth semiconductor chips 220a, 220b, 261, and 262 and the passive component 270. The plurality of wiring layers 212a, 212b, 212c, and 212d of the frame 210 are designed. More specifically, a power pattern and/or a ground pattern is mainly designed to be in the first region R1, in which the passive component 270 is mainly disposed, and the third region R3 between the first and second penetration portions 210H1 and 210H2. A signal pattern is mainly designed to be in a region outside the third region R3 for a respective wiring layer or via layer. For example, in the third region R3, an area occupied by patterns of one of the wiring layers 212a, 212b, 212c, and 212d or one of the via layers 213a, 213b, and 213c to transmit power or connected to ground is greater than an area occupied by patterns of the one of the wiring layers 212a, 212b, 212c, and 212d or the one of the via layers 213a, 213b, and 213c to transmit signals. In a region outside the third region R3, an area occupied by patterns of one of the wiring layers 212a, 212b, 212c, and 212d or one of the via layers 213a, 213b, and 213c to transmit signals is greater than an area occupied by patterns of the one of the wiring layers 212a, 212b, 212c, and 212d or the one of the via layers 213a, 213b, and 213c to transmit power or connected to ground. A signal pattern is mainly designed to be in the second region R2 in which the third and fourth semiconductor chips 261 and 262 are mainly disposed. Accordingly, an optimal signal and power path may be provided to improve signal and power characteristics of a package.

The third and fourth semiconductor chips 261 and 262 have at least portions overlapping the first and second semiconductor chips 220a and 220b, respectively, when viewed from above. In this case, portions of the first and second connection pads 220aP and 220bP are electrically connected to portions of the third and fourth connection pads 261P and 262P through the signal pattern of the redistribution layer 242 in the second regions R2, respectively. Another portion of each of the passive component 270 and the first to fourth connection pads 220aP, 220bP, 261P, and 262P is electrically connected to a power pattern and/or a ground pattern of the redistribution layer 242 in the first region R1. The power pattern and/or the ground pattern of the redistribution layer 242 in the first region R1 is electrically connected to the power pattern and/or the ground pattern of the plurality of wiring layers 212a, 212b, 212c, and 212d in the third region R3 between the first and second penetration portions 210H1 and 210H2. As described above, the first and second semiconductor chips 220a and 220b and the third and fourth semiconductor chips 261 and 262 allow a connection between signals to be achieved in a vertical direction through a signal pattern of the redistribution layer 242 in the second region R2 of the connection structure 240 and a corresponding connection via 243. In addition, power may be supplied from the passive component 270 at an optimal distance. Thus, signal and power characteristics may be optimized.

Each of the first to fourth semiconductor chips 220a, 220b, 261, and 262 may be a chip in which functions of an application processor (AP) are divided. For example, each of the first to fourth semiconductor chips 220a, 220b, 261, and 262 may be a chip constituting some or all functions of an application processor (AP). In the semiconductor package 200A, the first to fourth semiconductor chips 220a, 220b, 261, and 262 may be disposed in a specific form together with the passive component 270, and the redistribution layer 242 and the connection via 243 of the connection structure 240 and the plurality of wiring layers 212a, 212b, 212c, and 212d of the frame 210 may be designed according to the specific form. Thus, the package 200A having improved signal and power characteristics may be implemented more easily than in the case in which an application process according to a related art is packaged in a single unit.

The frame 210 includes a plurality of insulating layers 211a, 211b, and 211c, a plurality of wiring layers 212a, 212b, 212c, and 212d, and a plurality of wiring via layers 213a, 213b, and 213c. Each of the first and second penetration portions 210H1 and 210H2 of the frame 110 is in the form of a blind cavity having a bottom surface on which a stopper layer 212bM is disposed. The first and second semiconductor chips 220a and 220b are disposed in the first and second penetration portions 210H1 and 210H2 in such a manner that a surface disposed opposing a surface, on which first and second connection pads 220aP and 220bP are disposed, is attached to a stopper layer 212bM via an adhesive member 225 or the like, respectively. Accordingly, when the first and second semiconductor chips 220a and 220b, generating heat more severely, are disposed, heat is easily radiated to a lower side of the semiconductor package 200A through the stopper layer 212bM. For example, when the semiconductor package 200A is mounted on a printed circuit board, not illustrated, heat may be easily radiated to the printed circuit board. Among the plurality of wiring layers 212a, 212b, 212c, and 212d, at least one wiring layer 212d may be disposed in a position lower than the stopper layer 212bM. Since the wiring layer 212d may serve as a backside wiring layer, an additional backside process is not required.

Hereinafter, the components included in the semiconductor package 200A according to an example embodiment will be described in further detail.

The frame 210 may further improve rigidity of the package 200A according to a detailed material and may serve to secure thickness uniformity and the like of the encapsulant 230. Since the frame 210 includes the wiring layers 212a, 212b, 212c, and 212d and the wiring via layers 213a, 213b, and 213c, the frame 210 may serve as an electrical connection member. The frame 210 includes the wiring layer 212d disposed in a position lower than rear surfaces of the first and second semiconductor chips 220a and 220b, a backside wiring layer for the first and second semiconductor chips 220a and 220b may be provided without an additional process of forming a backside wiring layer. The frame 210 has blind cavity-type first and second penetration portions 210H1 and 210H2, formed as stoppers, and each of the first and second semiconductor chips 220a and 220b has a rear surface attached to the stopper layer 212bM via an adhesive member 225, such as a die attach film (DAF), known in the art. The stopper layer 212bM may be a metal plate to easily radiate heat, generated by the first and second semiconductor chip 220a and 220b, to a lower side of the package 200A. The first and second penetration portions 210H1 and 210H2 may be formed by a sandblasting process and have a predetermined angle of inclination, respectively. In this case, the first and second semiconductor chips 210a and 210b may be disposed more easily. Although not illustrated in the drawings, a metal layer, not illustrated, may be disposed on wall surfaces of the first and second penetration portions 210H1 and 210H2 of the frame 210. An electromagnetic shielding effect and a heat radiation effect may be improved through the metal layer.

The frame 210 includes a first insulating layer 211a, a first wiring layer 212a disposed on a top surface of the first insulating layer 211a, a second wiring layer 212b disposed on a bottom surface of the first insulating layer 211a, a second insulating layer 211b disposed on the top surface of the first insulating layer 211a to cover at least a portion of the first wiring layer 212a, a third wiring layer 212c disposed on a top surface of the second insulating layer 211b, a third insulating layer 211c disposed on the bottom surface of the first insulating layer 211a to cover at least a portion of the second wiring layer 212b, and a fourth wiring layer 212d disposed on a bottom surface of the third insulating layer 211c. The frame 210 further includes a first wiring via layer 213a penetrating through the first insulating layer 211a and electrically connecting the first and second wiring layers 212a and 212b to each other, a second wiring via layer 213b penetrating through the second insulating layer 212b and electrically connecting the first and third wiring layers 212a and 212c to each other, and a third wiring via layer 213c penetrating through the third insulating layer 211c and electrically connecting the second and fourth wiring layers 212b and 212d to each other. The first to fourth wiring layers 212a, 212b, 212c, and 212d may be electrically connected to each other. Each of the first to fourth wiring layers 212a, 212b, 212c, and 212d may also be electrically connected to the redistribution layer 242 of the connection structure 240 depending on function.

The stopper layer 212bM is disposed on the bottom surface of the first insulating layer 211a, and has a bottom surface, covered with the second insulating layer 212b, and a top surface. At least a portion of the top surface of the stopper layer 212bM is exposed by the first and second penetration portions 210H1 and 210H2. The first and second penetration portions 210H1 and 210H2 penetrates through the first and second insulating layers 211a and 211b, and do not penetrate through the third insulating layer 211c. However, this is merely an example, and the stopper layer 212M may be disposed on a lower side of the third insulating layer 211c to penetrate through the first to third insulating layers 211a, 211b, and 211c. In the stopper layer 212bM, an edge region in contact with the first insulation layer 211a may have a thickness greater than a thickness of a region exposed from the first insulation layer 211a by the first and second penetration portions 210H1 and 210H2. This is because a portion of the exposed region of the stopper layer 212bM may also be removed during a sandblasting process.

The stopper layer 212bM may be a metal plate including a metal such as titanium (Ti), copper (Cu), or the like. However, a material of the stopper layer 212bM is not limited thereto, and the stopper layer 212bM may include a material having an etching rate lower than a metal such as copper (Cu) in a sandblasting process. For example, the stopper layer 212bM may be an insulating film including an insulating material. More specifically, the stopper layer 212bM may be, for example, a dry film photoresist (DFR) including a photosensitive polymer.

The insulating layers 211a, 211b, and 211c may be formed of an insulating material. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. When a high-rigidity material such as prepreg including a glass fiber or the like is used, the frame 210 may be used as a support member for controlling warpage of the package 200A or a core member.

The first insulating layer 211a may have a thickness greater than a thickness of each of the second and third insulating layers 211b and 211c. This is because the first insulating layer 211a may basically have a relatively greater thickness to maintain rigidity, and the second and third insulating layers 211b and 211c may be introduced to form a greater number of wiring layers 212c and 212d. From a similar point of view, a wiring via of the first wiring via layer 213a penetrating through the first insulating layer 211a may have an average diameter and a height greater than an average diameter and a height of a wiring via of each of the second and third wiring via layers 213b and 213c penetrating through the second and third insulating layers 211b and 211c.

Together with the wiring via layers 213a, 213b, and 213c, the wiring layers 212a, 212b, 212c, and 212d may provide upper and lower electrical connection paths. A material forming each of the wiring layers 212a, 212b, 212c, and 212d may be a metal material such as copper (Cu), aluminum (Al), silver (Ag), tin (Sn), gold (Au), nickel (Ni), lead (Pb), titanium (Ti), or alloys thereof. The wiring layers 212a, 212b, 212c, and 212d may perform various functions depending on designs thereof. For example, a ground pattern, a power pattern, a signal pattern, and the like may be included. The ground pattern and the signal pattern may include a wiring and a pad. The signal pattern includes various signals, except for the ground pattern, the power pattern, and the like, such as a data signal and the like. The term "pattern" refers to a concept including a wiring and a pad.

Each of the wiring layers 212a, 212b, 212c, and 212d may have a thickness greater than a thickness of the redistribution layer 242 of the connection structure 240. The frame 210 may be formed in a panel level by a board process, such that each of the wiring layers 212a, 212b, 212c, and 212d may also be formed to have a greater size. Meanwhile, the connection structure 240 requires a fine design such as a fine pitch, such that the redistribution layer 242 may be formed to have a relatively smaller size.

The wiring via layers 213a, 213b, and 213c electrically connect the wiring layers 212a, 212b, 212c, and 212d, disposed on different layers, to form an electrical path in the frame 210. The above-mentioned metal material may also be used as a material forming wiring via layers 213a, 213b, and 213c. A wiring via of each of the wiring via layers 213a, 213b, and 213c may be a filled-type via, filled with a metal material, or a conformal-type via formed along a wall surface of a via hole. The wiring via of the first wiring via layer 213a may have a cylindrical cross-sectional shape or an hourglass cross-sectional shape, and the wiring via of each of the second and third wiring via layers 213b and 213c may have a tapered cross-sectional shape. In this case, the wiring via of each of the second and third wiring vias 213b and 213c may have a cross-sectional shape tapered in opposite directions on the basis of the first insulating layer 211a.

Each of the first and second semiconductor chips 220a and 220b may be an integrated circuit (IC) provided in an amount of several hundred to several million or more elements integrated in a single chip. Each of the first and second semiconductor chips 220a and 220b may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and each of the first and second semiconductor chips 220a and 220b may be a chip in which some functions of the application processor (AP) are divided, for example, a central processor (CPU), a graphics processor (GPU), a field programmable gate array (FPGA), a digital signal processor, a cryptographic processor, a microprocessor, and/or a microcontroller, or may be a chip in which other functions, not mentioned herein, are divided.

Each of the first and second semiconductor chips 220a and 220b may be a die formed based on an active wafer. A base material of a body of the first semiconductor chip 120 may be silicon (Si), germanium (Ge), gallium arsenide (GaAs), or the like. Various circuits may be formed on a body. First and second connection pad 220aP and 220bP may electrically connect the first and second semiconductor chips 220a and 220b to other components. A material forming the first and second connection pads 220aP and 220bP may be a metal material such as copper (Cu), aluminum (Al), or the like. Passivation layers, not illustrated, may be formed on the body to expose the first and second connection pad 220aP and 220bP, respectively. The passivation layer may be an oxide layer, a nitride layer, or the like, or a double layer of an oxide layer and a nitride layer. An insulating layer, not illustrated, or the like may be further disposed at a necessary position. Each of the first and second semiconductor chips 220a and 220b may be a bare die, but may be a packaged die on which an additional redistribution layer, not illustrated, is further disposed on a surface, on which the first and second connection pads 220aP and 220bP are disposed, for example, an active surface.

The first and second semiconductor chips 220a and 220b may further include first and second electrical connection bumps 220aB and 220bB connected to the first and second connection pads 220aP and 220bP, respectively. Each of the first and second electrical connection bumps 220aB and 220bB may be formed of copper (Cu) or the like. The semiconductor package 200A may be subjected to a grinding process on the encapsulant 230. As a result, an upper surface of the encapsulant 230, a surface, which is in contact with the connection via 243, of the third wiring layer 212c, the uppermost wiring layer of the frame 210, may be coplanar with a surface, which is in contact with the connection via 243, of the first and second electrical connection bumps 220aB and 220bB. The term "coplanar" refers to a concept including a fine difference depending on a processor error. Accordingly, the connection via 243, connecting the first and second electrical connection bumps 220aB and 220bB to the redistribution layer 242, may have the same height as the connection via 243 connecting the third wiring layer 212c to the redistribution layer 242. The term "same" also refers to a concept including a fine difference depending on a process error. As described above, when a surface, on which the connection structure 240 is formed, is a planar surface, the insulating layer 241 may be formed to be planar. Accordingly, the redistribution layer 242, the connection via 243, or the like may be formed more finely. An additional electrical connection metal, not illustrated, may be disposed on the third wiring layer 212c to prevent copper (Cu) burr or the like. Since the electrical connection metal, not illustrated, a ground, a surface in contact with the connection via 243 of the electrical connection metal, not illustrated, may have the above-described relationship.

The encapsulant 230 may protect the frame 210, the first and second semiconductor chips 220a and 220b, and the like. An encapsulation form is not limited. For example, the encapsulant 230 may cover a surface on which the frame 210 and the first and second connection pads 220aP and 220bP of the first and second semiconductor chips 220a and 220b are disposed, and may fill at least a portion of each of the first and second penetration portions 210H1 and 210H2. The encapsulant 230 may fill the penetration portions 210aH and 210bH to serve as an adhesive according to a detailed material and to reduce buckling.

A material of the encapsulant 230 is not limited. For example, an insulating material may be used as a material of the encapsulant 230. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. As necessary, a photoimageable encapsulant (PIE) resin may be used as a material of the encapsulant 230.

The connection structure 240 may redistribute first to fourth connection pads 220aP, 220bP, 261P, 262P of the first to fourth semiconductor chips 220a, 220b, 261, and 262. The connection structure 240 may electrically connect the first to fourth connection pads 220aP, 220bP, 261P, and 262P to each other depending on function. The connection structure 240 may electrically connect the first to fourth connection pads 220aP, 220bP, 261P, and 262P to the passive component 270 depending on function. The connection structure 240 may electrically connect the first to fourth connection pads 220aP, 220bP, 261P, and 262P to wiring layers 212a, 212b, 212c, and 212d of the frame 210 depending on function. Several tens to several hundreds of first to fourth connection pads 220aP, 220bP, 261P, and 262P may be redistributed and may be physically and/or electrically connected through the electrical connection metal 290 depending on function. The connection structure 240 includes an insulating layer 241, a redistribution layer 242, disposed on the insulating layer 241, and a connection via 243 penetrating through the insulating layer 241. The insulating layers 241, the redistribution layers 242, and the connection vias 243 may include a larger number of layers than those illustrated in the drawings. Alternatively, the insulating layers 241, the redistribution layers 242, and the connection vias 243 may include a smaller number of layers than those illustrated in the drawings.

A material of the insulating layers 241 may be an insulating material. In this case, a photoimageable dielectric (PID) material may also be used as the insulating material in addition to the above-described insulating materials. For example, the insulating layers 241 may be a photosensitive insulating layer. When the insulating layer 241 has photosensitive properties, a fine pitch of the connection via 243 may be achieved more easily. Even when the insulating layer 241 includes multiple layers, materials of the multiple layers may be identical to each other and, as necessary, may be different from each other. When the insulating layer 241 includes multiple layers, the multiple layers are integrated with each other, such that boundaries therebetween may not be readily apparent, but are not limited thereto.

The redistribution layer 242 may substantially serve to redistribute the first to fourth connection pads 220aP, 220bP, 261P, and 262P, and may provide the above-mentioned electrical connection path. A material forming the redistribution layer 242 may be a metal material such as copper (Cu), aluminum (Al), silver (Ag), tin (Sn), gold (Au), nickel (Ni), lead (Pb), titanium (Ti), or alloys thereof. The redistribution layer 242 may perform various functions depending on a design of a corresponding layer. For example, the redistribution layer 242 may include a ground pattern, a power pattern, a signal pattern, and the like. The signal pattern may include various signals, such as data signal and the like, except for the ground pattern, the power pattern, and the like. The term "pattern" refers to a concept including a wiring and a pad. The redistribution layer 242 mainly includes a power pattern and/or a ground pattern in the first region R1 and mainly includes a signal pattern in the second region R2.

The connection via 243 may electrically connect the redistribution layers 242, the first to fourth connection pads 220aP, 220bP, 261P, and 262P, the third wiring layer 212c, disposed on different layers, and the like. As a result, an electrical path is formed in the connection structure 240. A material forming the connection via 243 may be a metal material such as copper (Cu), aluminum (Al), silver (Ag), tin (Sn), gold (Au), nickel (Ni), lead (Pb), titanium (Ti), or alloys thereof. The connection via 243 may be a filled-type via filled with the metal material, or a conformal-type via formed along a wall surface of a via hole. Moreover, the connection via 243 may have a tapered cross-sectional shape. A tapered direction may be the same as that of the wiring via of the second wiring via layer 213b.

The first passivation layer 250 is an additional component for protecting the connection structure 240 from external physical and chemical damage and the like. The first passivation layer 250 may include a thermosetting resin. For example, the first passivation layer 250 may be an ABF, but a material of the first passivation layer 250 is not limited thereto. Each first passivation layer 250 may have a plurality of openings exposing at least a portion of the uppermost redistribution layer 242. There may be several tens to several tens of thousands of openings. The number of openings may be greater or smaller than several tens to several tens of thousands. Each opening may include a plurality of holes.

Each of the second and third semiconductor chips 261 and 262 may also be an integrated circuit (IC) provided in an amount of several hundred to several million or more elements integrated in a single chip. Each of the second and third semiconductor chips 261 and 262 may also be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and each of the second and third semiconductor chips 261 and 262 may be a chip in which some functions of the application processor (AP) are divided, for example, a central processor (CPU), a graphics processor (GPU), a field programmable gate array (FPGA), a digital signal processor, a cryptographic processor, a microprocessor, and/or a microcontroller, or may be a chip in which other functions, not mentioned herein, are divided. As an unlimited example, the first to fourth semiconductor chips 220a, 220b, 261, and 262 may be combined to constitute a single complete application processor (AP). In this case, the first and second semiconductor chips 220a and 220b may be a main chip, and the third and fourth semiconductor chips 261 and 262 may be sub-chips. However, the first to fourth semiconductor chips 220a, 220b, 261, and 162 are not limited thereto, and each of the third and fourth semiconductor chips 261 and 262 may be a memory such as a volatile memory (DRAM), a nonvolatile memory (ROM), a flash memory, or the like.

Each of the third and fourth semiconductor chips 261 and 262 may also be a die formed based on an active wafer. A base material of a body of each of the third and fourth semiconductor chips 261 and 262 may also be silicon (Si), germanium (Ge), gallium arsenide (GaAs), or the like. Various circuits may be formed on the body of each of the third and fourth semiconductor chips 261 and 262. The third and fourth connection pads 261P and 262P may electrically connect the third and fourth semiconductor chips 261 and 262 to other components. A material forming the third and fourth connection pads 261P and 262P may also be a metal material such as copper (Cu), aluminum (Al), or the like. A passivation layer, not illustrated, may be formed on the body of each of the third and fourth semiconductor chips 261 and 262 to expose the third and fourth connection pad 261P and 262P. The passivation layer may be an oxide layer, a nitride layer, or the like, or a double layer of an oxide layer and a nitride layer. An insulating layer, not illustrated, or the like may be further disposed at a necessary position. Each of the third and fourth semiconductor chips 261 and 262 may be a bare die, but may be a packaged die on which an additional redistribution, not illustrated, is further disposed on a surface, on which the third and fourth connection pads 261P and 262P are disposed, for example, an active surface.

The third and fourth semiconductor chips 261 and 262 may be disposed on a top surface of the connection structure 140 in a surface-mount form using surface-mount technology (SMT). The third and fourth semiconductor chips 261 and 262 may include third and fourth electrical connection bumps 261B and 262B disposed on the third and fourth connection pads 261P and 262P, respectively. The third and fourth electrical connection bumps 261B and 262B may also be formed of a metal material such as copper (Cu) or the like. The third and fourth semiconductor chips 261 and 262 may be mounted on the top surface of the connection structure 240 through tin (Sn) or a Sn-containing alloy, for example, low melting point metals 261$s$ and 262$s$ such as solders, respectively. The low melting point metals 261$s$ and 262$s$ may be exposed to a plurality of openings of the first passivation layer 250 to be connected to the redistribution layer 242, respectively. The low melting point metal may be connected to the second and third connection pads 161P and 162P or to the third and fourth electrical connection bumps 261B and 262B. As a result, an electrical connection path may be provided. Underfill resins 261$r$ and 262$r$ may be disposed at lower sides of the third and fourth semiconductor chips 261 and 262, respectively. The underfill resins 261$r$ and 262$r$ may fix the third and fourth semiconductor chips 261 and 262. The underfill resin 261$r$ and 262$r$ may cover at least a portion of each of the third and fourth connection pads 261P and 262P, at least a portion of the third and fourth electrical connection bumps 261B and 262B, and at least a portion of the low melting point metals 261$s$ and 262$s$. Each of the underfill resins 261$r$ and 262$r$ may be, for example, an epoxy resin or the like, but is not limited thereto.

The passive component 270 may be a chip-type capacitor such as a multilayer ceramic capacitor (MLCC) or a low inductance ceramic capacitor (LICC), or a chip-type inductor such as a power inductor. However, the passive component 270 is not limited thereto and may be another type of passive component well known in the art. For example, the passive component 270 may be a chip-type passive component well known in the art. The term "chip-type component" refers to, for example, an independent chip-type component including a body, internal electrodes, formed inside the body, and external electrodes formed on the body. The passive components 270 may be the same type or different types. The number of the passive components 270 is not limited, and may be greater than or smaller than the number of those illustrated in the drawings depending on design. The passive component 270 is also disposed in a surface-mount form through a low melting point metal such as a solder or the like.

The second passivation layer 280 is an additional component for protecting the frame 210 from external physical and chemical damage and the like. The second passivation layer 280 may also include a thermosetting resin. For example, the second passivation layer 280 may be an ABF, but a material of the second passivation layer 280 is not limited thereto. Each second passivation layer 280 may have a plurality of openings exposing at least a portion of the fourth wiring layer 212$d$, a lowermost wiring layer, of the frame 210. There may be several tens to several tens of thousands of openings. The number of openings may be greater or smaller than several tens to several tens of thousands. Each opening may include a plurality of holes.

The electrical connection metal 290 is also an additional component for electrically and/or physically connecting the semiconductor package 200A to an external device. For example, the semiconductor package 200A may be mounted on a mainboard of an electric device through the electrical connection metal 290. The electrical connection metal 290 is disposed on each opening of the second passivation layer 280. Accordingly, the electrical connection metal 290 may be electrically connected to the exposed fourth wiring layer 212$d$. As necessary, an underbump metal, not illustrated, may be formed on a plurality of openings of the second passivation layer 280. In this case, the electrical connection metal 290 may be electrically connected to the exposed fourth wiring layer 212$d$ through the underbump metal, not illustrated. Each electrical connection metal 290 may include a low melting point metal, for example, tin (Sn) or a Sn-containing alloy. In further detail, the electrical connection metal 290 may be formed of a solder or the like. However, this is merely an example, and a material of the electrical connection metal 290 is not limited thereto.

The electrical connection metal 290 may be a land, a ball, a pin, or the like. The electrical connection metal 290 may be formed as a multilayer structure or a single-layer structure. When the electrical connection metal 290 is formed as a multilayer structure, the electrical connection metal 290 includes a copper pillar and a solder. When the electrical connection structure metal 290 is formed as a single-layer structure, the electrical connection metal 290 includes a tin-silver solder or copper. However, this is merely an example, and a structure and a material of the electrical connection metal 290 are not limited thereto. The number, an interval, a dispositional form, and the like, of the electrical connection metal 290 are not limited, but may be sufficiently modified depending on design by those skilled in the art. For example, several tens to several tens of thousands of electrical connection metals 290 may be provided according to the number of first to fourth connection pads 220$a$P, 220$b$P, 261P, and 262P. The number of electrical connection metals 290 may be greater than or smaller than several tens to several tens of thousands.

At least one of the electrical connection metals 290 may be disposed in a fan-out region. The term "fan-out region" refers to a region except for a region in which the first and second semiconductor chips 220$a$ and 220$b$ is disposed. For example, the semiconductor package 200A may be a fan-out semiconductor package. The fan-out package may have improved reliability as compared to a fan-in package, may allow a plurality of input/output (I/O) terminals to be implemented, and may facilitate a three-dimensional (3D) interconnection. Moreover, as compared to a ball grid array (BGA) package, a land grid array (LGA) package, or the like, the fan-out package may be manufactured to have a small thickness, and may be superior in price competitiveness.

The molding material 291 is an additional component for protecting the third and fourth semiconductor chips 261 and 262 and the passive component 270. The molding material 291 may cover at least a portion of each of the third and fourth semiconductor chips 261 and 262 and at least a portion of the passive component 270. The molding material 291 may include a material different from a material of the encapsulant 230. For example, the molding material 291 may be an epoxy molding component (EMC). As necessary, the molding material 291 may be ground for heat radiation of the third and fourth semiconductor chips 261 and 262. As a result of the grinding, rear surfaces of the third and fourth semiconductor chips 261 and 262 may be exposed.

Figure 19:
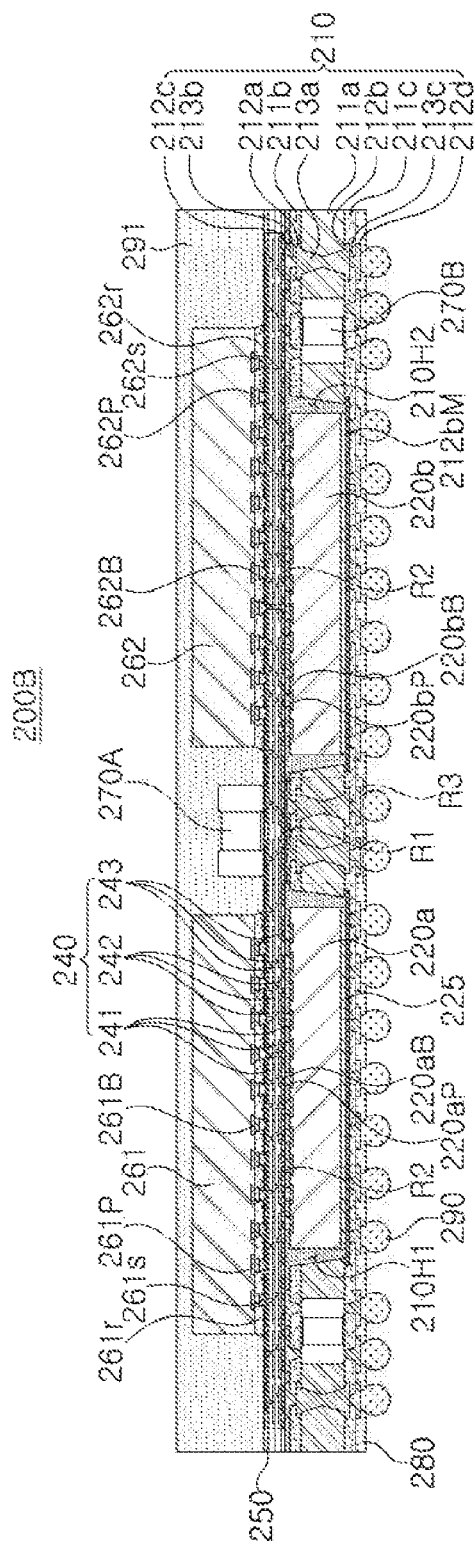
FIG. 19 is a cross-sectional view schematically illustrating a modified example of the semiconductor package in FIG. 16.

FIG. 19 is a cross-sectional view schematically illustrating a modified example of the semiconductor package in FIG. 16.

Referring to FIG. 19, a semiconductor package 200B according to a modified embodiment includes a first passive component 270A, disposed on a top surface of a connection structure 240 in a surface-mount form, and a second passive component 270B embedded in a frame 210. The second passive component 270B is electrically connected to at least some of first to fourth wiring layers 212a, 212b, 212c, and 212d of the frame 210 depending on function. As a result, the second passive component 270B may also be electrically connected to first to fourth connection pads 220aP, 220bP, 261P, and 262P depending on function. The second passive component 270B may also be a chip-type capacitor such as a multilayer ceramic capacitor (MLCC) or a low inductance ceramic capacitor (LICC), or a chip-type inductor such as a power inductor. However, the second passive component is not limited thereto, and may be another type of passive component well known in the art. For example, the second passive component 270B may also be a chip-type passive component well known in the art. The second passive components 270 may be the same type or different types. The number of the passive components 270 is not limited, and may be greater than or smaller than the number of those illustrated in the drawings depending on design.

The other descriptions are substantially the same as the detailed description of the semiconductor package 200A according to another example embodiment, and will be omitted herein.

Figure 20:
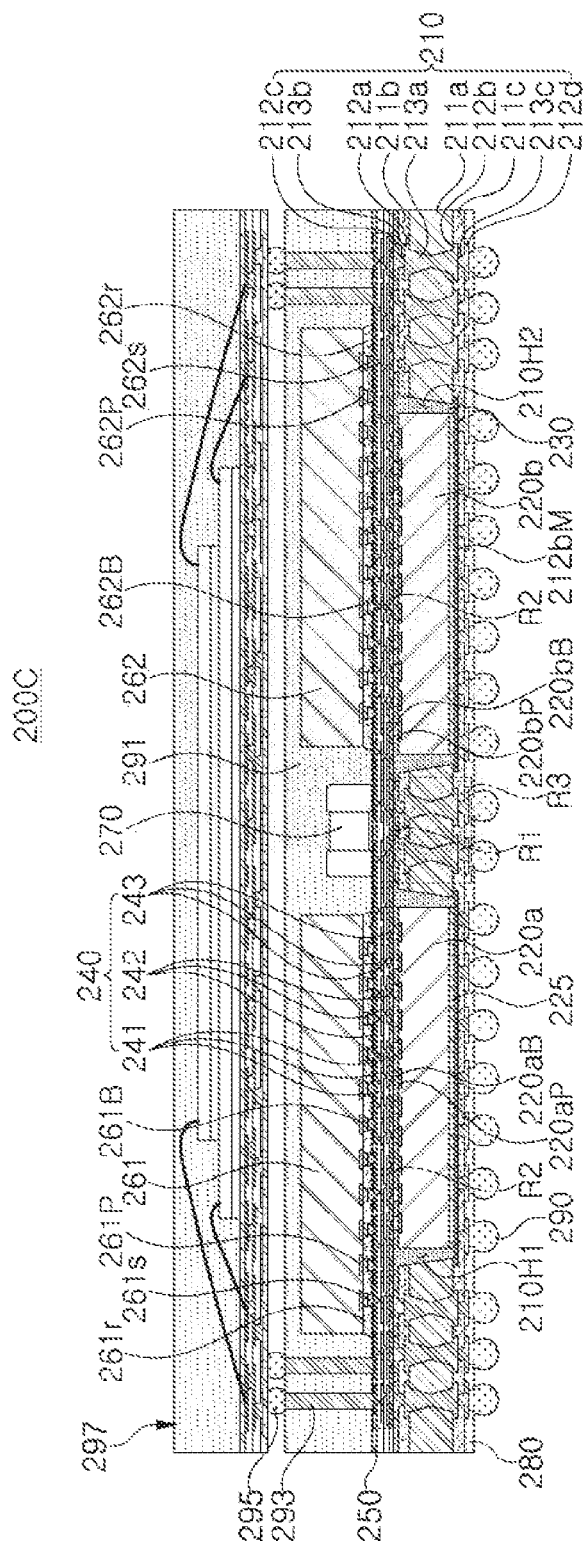
FIG. 20 is a cross-sectional view schematically illustrating a modified example of the semiconductor package in FIG. 16.

FIG. 20 is a cross-sectional view schematically illustrating a modified example of the semiconductor package in FIG. 16.

Referring to FIG. 20, a semiconductor package 200C according to another modified embodiment includes a memory package 297 further disposed in the form of a package-on-package (PoP). The semiconductor package 200C further includes a penetration wiring 293, penetrating through a molding material 291 for electrical connection to the memory package 297, and a second electrical connection metal 295 connecting the penetration wiring 293 and the memory package 297 to each other. The memory package 297 may include one or more memory chips disposed on a wiring board and connected to the wiring board by wire bonding, but is not limited thereto. As necessary, instead of the memory package 297, another type of package may be disposed. The penetration wiring 293 may be a metal post, and the second electrical connection metal 295 may be a low melting point such a solder. As described above, the semiconductor package 200C according to another modified embodiment may be a package including both an application processor (AP) and a memory.

The other descriptions are substantially the same as the detailed description of the semiconductor package 200A according to another modified embodiment, and will be omitted herein. It should be apparent that features of the semiconductor package 200B according to another modified embodiment may be introduced to the semiconductor package 200C according to another modified embodiment. For example, the semiconductor packages 200B and 200C may be combined with each other.

Figure 21:
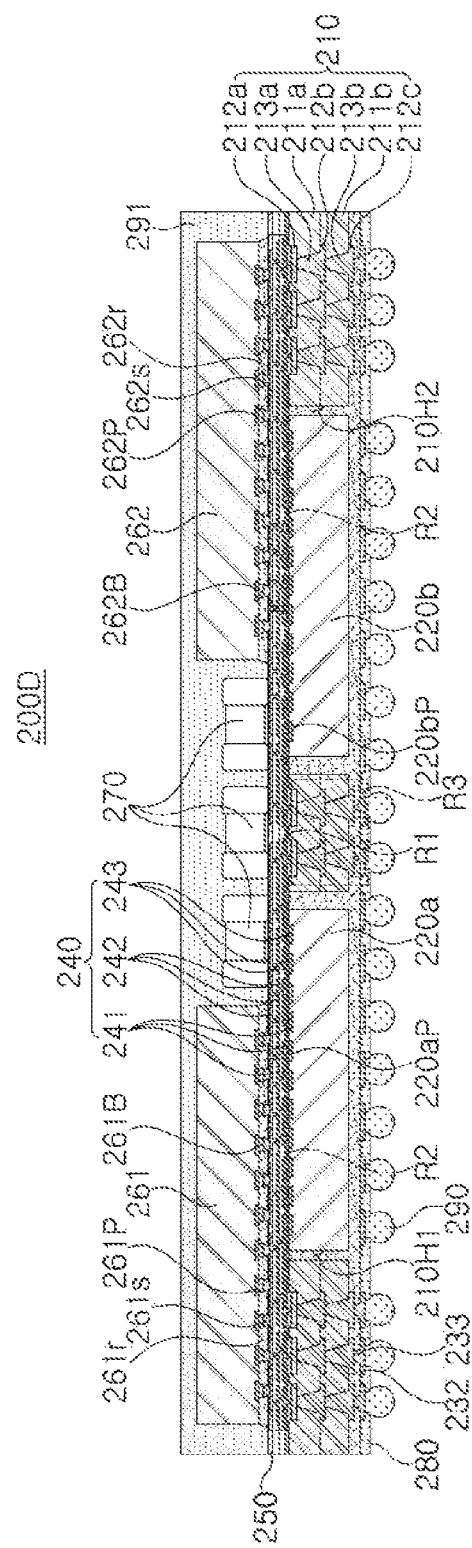
FIG. 21 is a cross-sectional view schematically illustrating a modified example of the semiconductor package in FIG. 16.

FIG. 21 is a cross-sectional view schematically illustrating a modified example of the semiconductor package in FIG. 16.

Referring to FIG. 21, a semiconductor package 200D according to another modified embodiment includes another type of frame 210. More specifically, the frame 210 has through-hole type first and second penetration portions 210H1 and 210H2, and first and second semiconductor chips 220a and 220b are disposed at the first and second penetration portions 210H1 and 210H2 in such a manner that a surface, on which first and second connection pads 220aP and 220bP are disposed, faces a bottom surface of the connection structure 240. In this case, the first and second connection pads 220aP and 220bP may be connected to a connection via 243 of the connection structure 240 without an additional bump. In the present embodiment, the frame 210 includes a first insulating layer 211a in contact with a bottom surface of the connection structure 240, a first wiring layer 212a embedded in the first insulating layer 211a while being in contact with the bottom surface of the connection structure 240, a second wiring layer 212b disposed on a side opposing a side in which the first wiring layer 212a of the first insulating layer 211a is embedded, a second insulating layer 211b, disposed on a side opposing the side in which the first wiring layer 212a of the first insulating layer 211a is embedded, covering at least a portion of the second wiring layer 212b, a third wiring layer 212c disposed on a side opposing a side in which the second wiring layer 212b of the second insulating layer 211b is embedded, a first connection via layer 213a penetrating through the first insulating layer 211a and electrically connecting the first and second wiring layers 212a and 212b to each other, and a second connection via layer 213b penetrating through the second insulating layer 211b and electrically connecting the second and third wiring layers 212b and 212c to each other.

The first wiring layer 212a may be recessed into the first insulating layer 211a. For example, a surface, brought into contact with a bottom surface of the connection structure 240 of the first insulating layer 211a, may have a step with respect to a surface brought into contact with a bottom surface of the connection structure 240 of the first wiring layer 212a. In this case, when first and second semiconductor chips 220a and 220b and the frame 210 are encapsulated using an encapsulant 230, bleeding of an encapsulant material may be suppressed to prevent the first wiring layer 212a from being contaminated by the encapsulant material. Each of the first to third wiring layers 212a, 212b, and 212c may have a thickness greater than a thickness of each redistribution layer 242.

When a hole is formed for the first wiring via layer 213a, some pads of the first wiring layer 212a may serve as a stopper. Accordingly, it is advantageous in process that a wiring via of the first wiring via layer 213a has a tapered shape in which an upper side has a width smaller than a width of a lower side. In this case, the wiring via of the first wiring via layer 213a may be integrated with a pad pattern of the second wiring layer 212b. Similarly, when a hole is formed for the second wiring via layer 213b, some pad of the second wiring layer 212b may serve as a stopper. Accordingly, it is advantageous in process that a wiring via of the second wiring via layer 213b has a tapered shape in which an upper side has a width smaller than a width of a lower side. In this case, a wiring via of the second wiring via layer 213b may be integrated with a pad pattern of the third wiring layer 212c.

As necessary, a backside wiring layer 232 and a backside via 233 may be introduced to a lower side of the encapsulant 230. The backside via 233 may penetrate through at least a portion of the encapsulant 230 to electrically connect the third wiring layer 212c and the backside wiring layer 232 to each other. A second passivation layer 280 may have a plurality of openings, each exposing at least a portion of the backside wiring layer 232. A plurality of electrical connection metals 290 may be electrically connected to the exposed backside wiring layer 132.

The backside wiring layer 232 may also serve to redistribute first to fourth connection pads 220aP, 220bP, 261P, and 262P. A material forming the backside wiring layer 232 may be a metal such as copper (Cu), aluminum (Al), silver (Ag), tin (Sn), gold (Au), nickel (Ni), lead (Pb), titanium (Ti), or alloys thereof. The backside wiring layer 232 may also perform various functions depending on design of a corresponding layer. For example, the backside wiring layer 232 may include a ground pattern, a power pattern, a signal pattern, and the like. The ground pattern and the signal pattern may include a wiring and a pad. The signal pattern includes various signals, for example, a data signal and the like except for the ground pattern, the power pattern, and the like. The term "pattern" refers to a concept including a wiring and a pad.

The backside via 233 may electrically connect the third wiring layer 212c and the backside wiring layer 232 to each other. A material forming the backside via 233 may be a metal such as copper (Cu), aluminum (Al), silver (Ag), tin (Sn), gold (Au), nickel (Ni), lead (Pb), titanium (Ti), or alloys thereof. The backside via 233 may be a filled-type via filed with a metal, or a conformal-type via formed along a wall surface of a via hole. The backside via 233 may have a tapered cross-sectional shape. A tapered direction of the backside via 233 may be the same as a tapered direction of a wiring via of each of the first and second wiring vias 213a and 213b.

The other descriptions are substantially the same as the detailed description of the semiconductor package 200A according to another example embodiment, and will be omitted herein. It should be apparent that features of the semiconductor packages 200B and 200C according to modified embodiments may be introduced to the semiconductor package 200D according to another modified embodiment. For example, the semiconductor packages 200B, 200C, and 200D may be combined with each other in various combinations.

Figure 22:
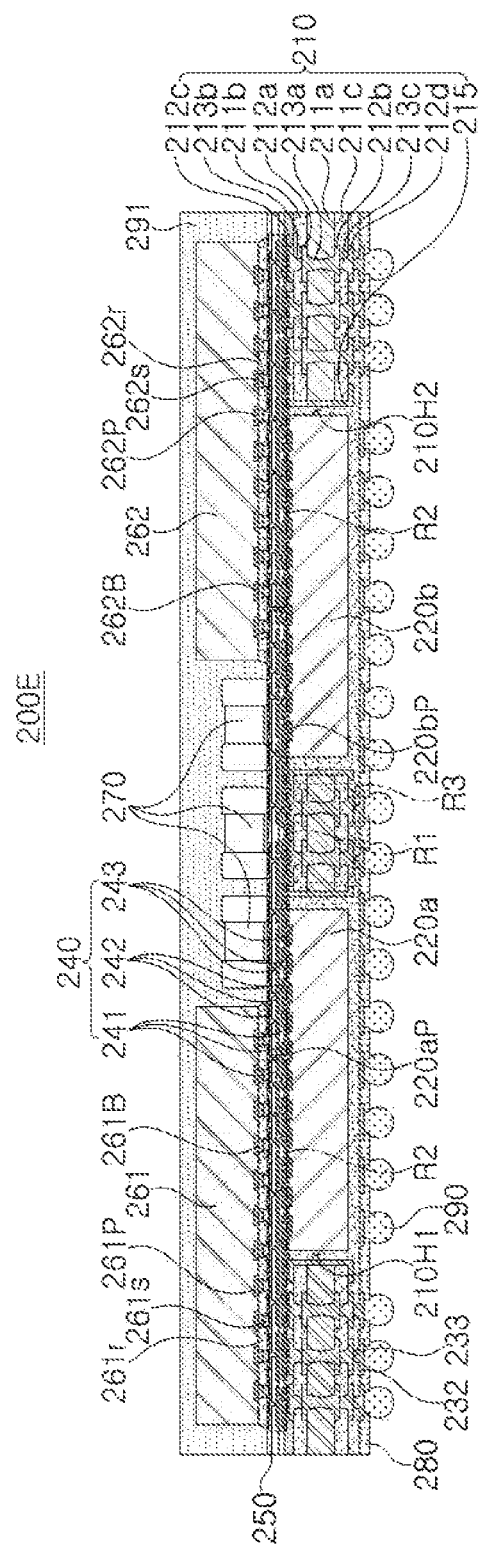
FIG. 22 is a cross-sectional view schematically illustrating a modified example of the semiconductor package in FIG. 16.

FIG. 22 is a cross-sectional view schematically illustrating a modified example of the semiconductor package in FIG. 16.

Referring to FIG. 22, a semiconductor package 200E according to another modified embodiment includes another type of frame 210. More specifically, the frame 210 has through-hole type first and second penetration portions 210H1 and 210H2, and first and second semiconductor chips 220a and 220b are disposed at the first and second penetration portions 210H1 and 210H2 in such a manner that a surface, on which first and second connection pads 220aP and 220bP are disposed, faces a bottom surface of the connection structure 240. In this case, the first and second connection pads 220aP and 220bP may be connected to a connection via 243 of the connection structure 240 without an additional bump. In the present embodiment, the frame 210 includes a first insulating layer 211a, a first wiring layer 212a and a second wiring layer 212b disposed on both surfaces of the first insulating layer 211a, a second insulating layer 211b and a third insulating layer, disposed on both surfaces of the first insulating layer 211a, a third wiring layer 212c disposed on a side opposing a side in which the second wiring layer 212b of the second insulating layer 211b is embedded, a fourth wiring layer 212d disposed on a side opposing a side in which the first wiring layer 212a of the second insulating layer 211b is embedded, a first wiring via layer 213a penetrating through the first insulating layer 211a and electrically connecting the first and second wiring layers 212a and 212b to each other, a second wiring via layer 213b penetrating through the second insulating layer 211b and electrically connecting the first and third wiring layers 212a and 213c, and a third wiring via layer 213c penetrating through the third insulating layer 211c and electrically connecting the second and fourth wiring layers 212b and 212d to each other. Since the frame 210 includes a greater number of wiring layers 212a, 212b, 212c, and 212d, the connection structure 240 may be further simplified.

The first insulating layer 211a may have a thickness greater than a thickness of each of the second and third insulating layers 211b and 211c. This is because the first insulating layer 211a may basically have a relatively greater thickness to maintain rigidity, and the second and third insulating layers 211b and 211c may be introduced to form a greater number of wiring layers 212c and 212d. From a similar point of view, a wiring via of the first wiring via layer 213a penetrating through the first insulating layer 211a may have an average diameter and a height greater than an average diameter and a height of a wiring via of each of the second and third wiring via layers 213b and 213c penetrating through the second and third insulating layers 211b and 211c. The wiring via of the first wiring via layer 213a has an hourglass shape or a cylindrical shape, while the wiring vias of the second and third wiring via layers 213b and 213c have shapes tapered in opposite directions. Each of the first to fourth wiring layers 212a, 212b, 212c, and 212d may have a thickness greater than a thickness of each redistribution layer 242.

Similarly, as necessary, a backside wiring layer 232 and a backside via 233 may be introduced on a lower side of the encapsulant 230. The backside via 233 may penetrate through at least a portion of the encapsulant 230 to electrically connect the third wiring layer 212c and the backside wiring layer 232 to each other. A second passivation layer 280 may have a plurality of openings, each exposing at least a portion of the backside wiring layer 232. A plurality of electrical wiring metals 290 may be electrically connected to the exposed backside wiring layer 232.

As necessary, a metal layer 215 may be disposed on a wall surface of the first and second penetration portions 210H1 and 210H2 of the frame 110, and the metal layer 215 may be disposed to fully cover the wall surface. The metal layer 215 may include a metal material such as copper (Cu). An electromagnetic shielding effect and a heat radiation effect of each of the first and second semiconductor chips 220a and 220b may be improved through the metal layer 215.

The other descriptions are substantially the same as the detailed description of the semiconductor package 200A according to another example embodiment, and will be omitted herein. It should be apparent that features of the semiconductor packages 200B and 200C according to modified embodiments may also be introduced to the semiconductor package 200E according to another modified embodiment. For example, the semiconductor packages 200B, 200C, and 200E may be combined with each other in various combinations.

Figure 23:
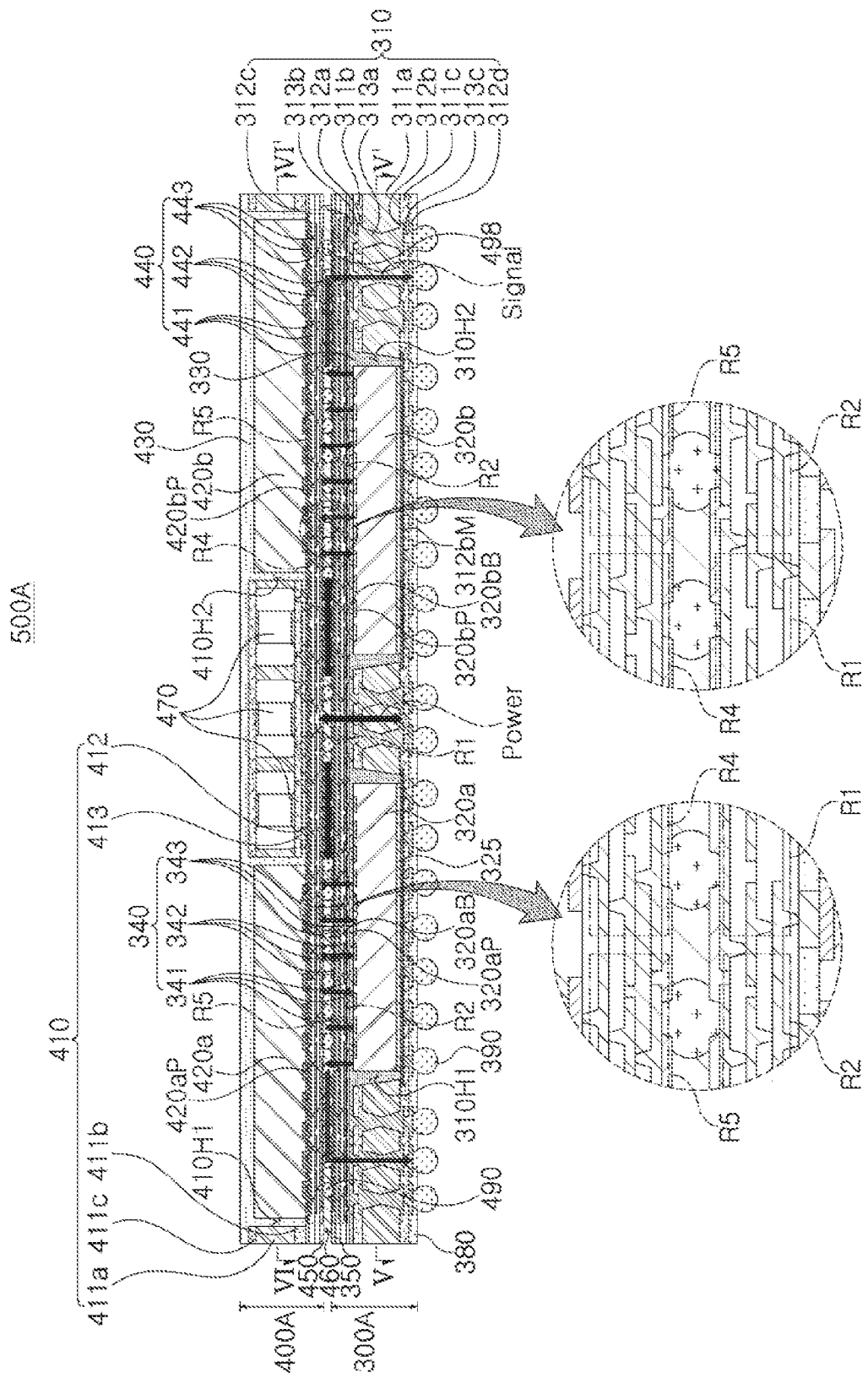
FIG. 23 is a cross-sectional view schematically illustrating another example of a semiconductor package.
Figure 24:
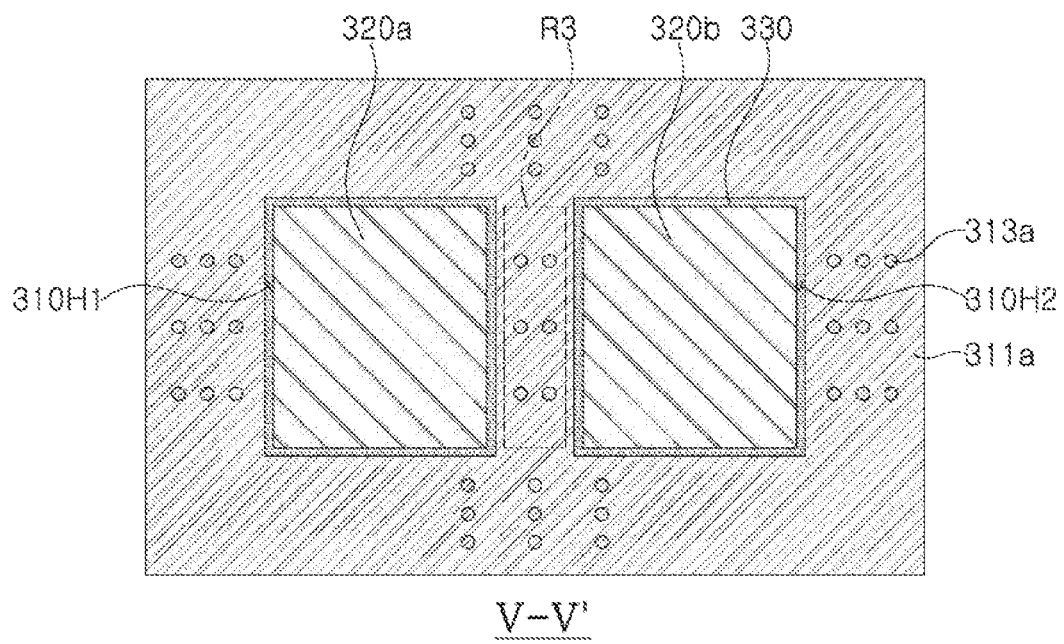
FIG. 24 is a schematic plan view taken along line V-V' of the semiconductor package in FIG. 23.

FIG. 23 is a cross-sectional view schematically illustrating another example of a semiconductor package. FIG. 24 is a schematic plan view taken along line V-V' of the semiconductor package in FIG. 23, and FIG. 25 is a schematic plan view taken along line VI-VI' of the semiconductor package in FIG. 23.

Figure 25:
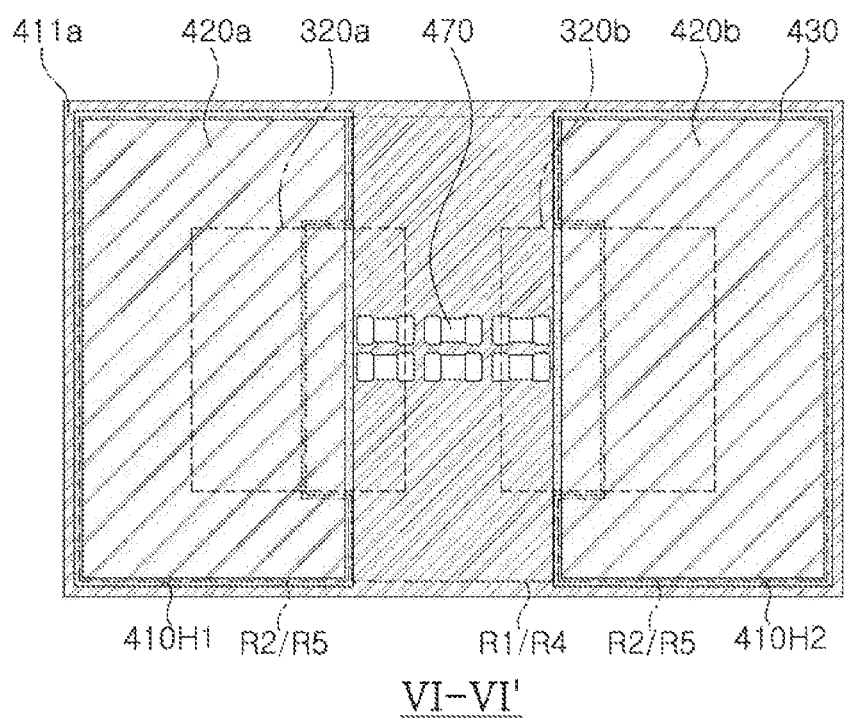
FIG. 25 is a schematic plan view taken along line VI-VI' of the semiconductor package in FIG. 23.

Referring to FIGS. 23 to 25, a semiconductor package 500A according to another example embodiment includes third and fourth semiconductor chips 420a and 420b and a passive component 470 packaged together to be disposed on an upper side of a first connection structure 340 in the form of package-on-package (PoP). More specifically, the semiconductor package 500A includes a first packaged structure 300A and a second packaged structure 400A disposed on the first packaged structure 300A.

The first packaged structure 300A includes a first connection structure 340, a first frame 310, disposed on a bottom surface of the first connection structure 340, having first and second penetration portions 310H1 and 310H2, a first semiconductor chip 320a disposed at the first penetration portion 310H1 on the bottom surface of the first connection structure 340, a second semiconductor chip 320b disposed at the second penetration portion 310H2 on the bottom surface of the first connection structure 340, a first encapsulant 330, disposed on the bottom surface of the first connection structure 340, covering at least a portion of the first frame 310 and at least a portion of each of the first and second semiconductor chips 320a and 320b and filling at least a portion of each of the first and second penetration portions 310H1 and 310H2, a first passivation layer 350 disposed on a top surface of the first connection structure 340, a second passivation layer 380 disposed on a bottom surface of the first frame 310, and a plurality of first electrical connection metals 390 disposed on a plurality of openings of the second passivation layer 380.

The second packaged structure 400A includes a second connection structure 440, a second frame 410, disposed on a top surface of the second connection structure 440, having third and fourth penetration portions 410H1 and 410H2, a third semiconductor chip 420a disposed at the third penetration portion 410H1 on the top surface of the second connection structure 440, a fourth semiconductor chip 420b disposed at the fourth penetration portion 410H2 on the top surface of the second connection structure 440, a second encapsulant 430, disposed on the top surface of the second connection structure 440, covering at least a portion of the second frame 410 and at least a portion of each of the third and fourth semiconductor chips 420a and 420b and filling at least a portion of each of the third and fourth penetration portions 410H1 and 410H2, a third passivation layer 450 disposed on a bottom surface of the second connection structure 440, and a passive component 470 embedded in the second frame 410.

Each of the first and third passivation layers 350 and 450 has a plurality of openings, exposing at least a portion of each of the first and second redistribution layers 342 and 442, and exposed first and second redistribution layers 342 and 442 are electrically connected through a plurality of third electrical connection metals 490 disposed between the first and third passivation layers 350 and 450. As necessary, each of the plurality of third electrical connection metals 490 may have at least a portion covered with an underfill resin 460 disposed between the first and third passivation layers 350 and 450. The underfill resin 460 may be, for example, an epoxy adhesive or the like, but is not limited thereto.

The first connection structure 340 includes one or more redistribution layers 342. The first and second semiconductor chips 320a and 320b are disposed side by side on the bottom surface of the first connection structure 340 in such a manner that a surface, on which the first and second connection pad 320aP and 320bP are disposed, faces the bottom surface of the first connection structure 340, respectively. The second connection structure 440 also includes one or more second redistribution layers 442. The third and fourth semiconductor chips 420a and 420b are disposed on the top surface of the second connection structure 440 in such a manner that a surface, on which third and fourth connection pads 420aP and 420bP are disposed, faces the top surface of the second connection structure 440, respectively.

The first connection structure 340 has a first region R1, including a region overlapping the passive component 470, and second regions R2 including regions respectively overlapping at least portions of the third and fourth semiconductor chips 420a and 420b, when viewed from above. Being viewed from above refers to being viewed in a thickness direction or a laminating direction of the semiconductor package 500A. The thickness direction or the laminating direction of the semiconductor package 500A may be parallel to a thickness direction of a semiconductor chip, such as one of the first to fourth semiconductor chips 320a, 320b, 420a, and 420b. The first region R1 is disposed between the second regions R2. The first region R1 may overlap at least another portion of each of the third and fourth semiconductor chips 420a and 420b, when viewed from above. The redistribution layer 342 mainly includes a power pattern and/or a ground pattern in the first region R1, and mainly includes a signal pattern in the second region R2. For example, in the first region R1, an area occupied by patterns of the first redistribution layer 342 to transmit power and patterns of the first redistribution layer 342 connected to ground is greater than an area occupied by patterns of the first redistribution layer 342 to transmit signals. In the each of the second regions R2, an area occupied by patterns of the first redistribution layer 342 to transmit signals is greater than an area occupied by patterns of the first redistribution layer 342 to transmit power and patterns of the first redistribution layer 342 connected to ground.

At least one of the passive components 470 is disposed in such a manner that at least a portion thereof overlaps a region R3 between the first and second penetration portions 310H1 and 310H2 of the frame 310, when viewed from above. A plurality of wiring layers 312a, 312b, 312c, and 312d of the frame 310 include a power pattern and/or a ground pattern electrically connected to the passive component 470 in the region R3 between the first and second penetration portions 310H1 and 310H2.

The second connection structure 440 has a fourth region R4, overlapping the passive component 470, and fifth regions R5 respectively overlapping at least portions of the third and fourth semiconductor chips 420a and 420b, when viewed from above. The fourth region R4 is disposed between the fifth regions R5. The fourth region R4 may overlap at least another portion of each of the third and fourth semiconductor chips 420a and 420b, when viewed from above. A second redistribution layer 442 mainly includes a power pattern and/or a ground pattern in the fourth region R4, and main includes a signal pattern in the fifth region R5. For example, in the fourth region R4, an area occupied by patterns of the second redistribution layer 442 to transmit power and patterns of the second redistribution layer 442 connected to ground is greater than an area occupied by patterns of the second redistribution layer 442 to transmit signals. In the each of the fifth regions R5, an area occupied by patterns of the second redistribution layer 442 to transmit signals is greater than an area occupied by patterns of the second redistribution layer 442 to transmit power and patterns of the second redistribution layer 442 connected to ground. A power pattern and/or a ground pattern in the fourth region R4 of the second redistribution layer 442 is electrically connected to a power pattern and/or a ground pattern in the first region R1 of the first redistribution layer 342 and a power pattern and/or a ground pattern in the third region R3 between the first and second penetration portions 310H1 and 310H2 of the plurality of wiring layers 312a, 312b, 312c, and 312d. A signal pattern is mainly designed to be in a region outside the third region R3 for a respective wiring layer or via layer. For example, in the third region R3, an area occupied by patterns of one of the wiring layers 312a, 312b, 312c, and 312d or one of the via layers 313a, 313b, and 313c to transmit power or connected to ground is greater than an area occupied by patterns of the one of the wiring layers 312a, 312b, 312c, and 312d or the one of the via layers 313a, 313b, and 313c to transmit signals. In a region outside the third region R3, an area occupied by patterns of one of the wiring layers 312a, 312b, 312c, and 312d or one of the via layers 313a, 313b, and 313c to transmit signals is greater than an area occupied by patterns of the one of the wiring layers 312a, 312b, 312c, and 312d or the one of the via layers 313a, 313b, and 313c to transmit power or connected to ground. A signal pattern in the fifth region R5 of the second redistribution layer 442 is electrically connected to a signal pattern in the second region R2 of the first redistribution layer 342.

The semiconductor package 500A is disposed in such a manner that at both sides of the first and second connection structure 340 and 440 respectively including the one or more first and second redistribution layers 342 and 442, the first and second semiconductor chips 320a and 320b and the third and fourth semiconductor chips 420a and 420b, capable of performing different functions, are disposed to oppose each other with the first and second connection structures 340 and 440 interposed therebetween. One or more passive components 470 are disposed between the third and fourth semiconductor chips 420a and 420b on the top surface of the second connection structure 440. The first and second redistribution layers 342 and 442 of the first and second connection structures 340 and 440 are designed to correspond to the arrangement of the first to fourth semiconductor chips 320a, 320b, 420a, and 420b and the passive component 470. The plurality of wiring layers 312a, 312b, 312c, and 312d of the frame 410 are designed. More specifically, a power pattern and/or a ground pattern is mainly designed to be in the first and fourth regions R1 and R4, in which the passive component 470 is mainly disposed, and a signal pattern is mainly designed to be in the second and fifth regions R2 and R5 in which the third and fourth semiconductor chips 420a and 420b are mainly disposed. Accordingly, an optimal signal and power path may be provided to improve signal and power characteristics of a package.

The third and fourth semiconductor chips 420a and 420b have at least portions overlapping the first and second semiconductor chips 320a and 320b, respectively, when viewed from above. In this case, portions of the first and second connection pads 320aP and 320bP are electrically connected to portions of the third and fourth connection pads 420aP and 420bP through the signal pattern of the first and second redistribution layers 342 and 442 in the second and fifth regions R2 and R5, respectively. Another portion of each of the passive component 470 and the first to fourth connection pads 320aP, 320bP, 420aP, and 420bP is electrically connected to a power pattern and/or a ground pattern of the first and second redistribution layers 342 and 442 in the first and fourth regions R1 and R4. The power pattern and/or the ground pattern of the first and second redistribution layers 342 and 442 in the first and fourth regions R1 and R4 is electrically connected to the power pattern and/or the ground pattern of the plurality of wiring layers 312a, 312b, 312c, and 412d in the third region R3 between the first and second penetration portions 310H1 and 310H2. As described above, the first and second semiconductor chips 320a and 320b and the third and fourth semiconductor chips 420a and 420b allow a connection between signals to be achieved in a vertical direction through a signal pattern of the first and second redistribution layers 342 and 442 in the second and fifth regions R2 and R5 of the first and second connection structures 340 and 440 and corresponding first and second connection vias 343 and 443. In addition, power may be supplied from the passive component 470 at an optimal distance. Thus, signal and power characteristics may be optimized.

Each of the first to fourth semiconductor chips 320a, 320b, 420a, and 420b may be a chip in which functions of an application processor (AP) are divided. For example, each of the first to fourth semiconductor chips 320a, 320b, 420a, and 420b may be a chip constituting some or all functions of an application processor (AP). In the semiconductor package 500A, the first to fourth semiconductor chips 320a, 320b, 420a, and 420b may be disposed in a specific form together with the passive component 470, and the first and second redistribution layers 342 and 442 and the first and second connection vias 343 and 443 of the first and second connection structures 340 and 440 and the plurality of wiring layers 312a, 312b, 312c, and 312d of the first frame 310 may be designed according to the specific form. Thus, the package 500A having improved signal and power characteristics may be implemented more easily than in the case in which an application process according to a related art is packaged in a single unit.

The first frame 310 includes a plurality of insulating layers 311a, 311b, and 311c, a plurality of wiring layers 312a, 312b, 312c, and 312d, and a plurality of wiring via layers 313a, 313b, and 313c. Each of the first and second penetration portions 310H1 and 310H2 of the first frame 310 is in the form of a blind cavity having a bottom surface on which a stopper layer 312bM is disposed. The first and second semiconductor chips 320a and 320b are disposed on the first and second penetration portions 310H1 and 310H2 in such a manner that a surface disposed opposing a surface, on which first and second connection pads 320aP and 320bP are disposed, is attached to a stopper layer 312bM via an adhesive member 325 or the like, respectively. Accordingly, when the first and second semiconductor chips 320a and 320b, generating heat more severely, are disposed, heat may be easily radiated to a lower side of the semiconductor package 500A through the stopper layer 312bM. For example, when the semiconductor package 500A is mounted on a printed circuit board, not illustrated, heat may be easily radiated to the printed circuit board. Among the plurality of wiring layers 312a, 312b, 312c, and 312d, at least one wiring layer 312d may be disposed in a position lower than the stopper layer 312bM. Since the wiring layer 312d may serve as a backside wiring layer, an additional backside process is not required.

Hereinafter, the components included in the semiconductor package 500A according to an example embodiment will be described in further detail.

The first frame 310 may further improve rigidity of the package 500A according to a detailed material and may serve to secure thickness uniformity and the like of the encapsulant 330. Since the first frame 310 includes the wiring layers 312a, 312b, 312c, and 312d and the wiring via layers 313a, 313b, 313c, and 313d, the first frame 310 may serve as an electrical connection member. The first frame 310 includes the wiring layer 312d disposed in a position lower than rear surfaces of the first and second semiconductor chips 320a and 320b, a backside wiring layer for the first and second semiconductor chips 320a and 320b may be provided without an additional process of forming a backside wiring layer. The frame 310 has blind cavity-type first and second penetration portions 310H1 and 310H2, formed as stoppers, and each of the first and second semiconductor chips 320a and 320b has a rear surface attached to the stopper layer 312bM via an adhesive member 325, such as a die attach film (DAF), known in the art. The stopper layer 312bM may be a metal plate to easily radiate heat, generated by the first and second semiconductor chip 320a and 320b, to a lower side of the package 500A. The first and second penetration portions 310H1 and 310H2 may be formed by a sandblasting process and have a predetermined angle of inclination, respectively. In this case, the first and second semiconductor chips 320a and 320b may be disposed more easily. A metal layer, not illustrated, may be disposed on wall surfaces of the first and second penetration portions 310H1 and 310H2 of the first frame 310. An electromagnetic shielding effect and a heat radiation effect may be improved through the metal layer.

The first frame 310 includes a first insulating layer 311a, a first wiring layer 312a disposed on a top surface of the first insulating layer 311a, a second wiring layer 312b disposed on a bottom surface of the first insulating layer 311a, a second insulating layer 311b disposed on the top surface of the first insulating layer 311a to cover at least a portion of the first wiring layer 312a, a third wiring layer 312c disposed on a top surface of the second insulating layer 211b, a third insulating layer 311c disposed on the bottom surface of the first insulating layer 311a to cover at least a portion of the second wiring layer 312b, and a fourth wiring layer 312d disposed on a bottom surface of the third insulating layer 311c. The frame 310 further includes a first wiring via layer 313a penetrating through the first insulating layer 311a and electrically connecting the first and second wiring layers 312a and 312b to each other, a second wiring via layer 313b penetrating through the second insulating layer 312b and electrically connecting the first and third wiring layers 312a and 312c to each other, and a third wiring via layer 313c penetrating through the third insulating layer 311c and electrically connecting the second and fourth wiring layers 312b and 312d to each other. The first to fourth wiring layers 312a, 312b, 312c, and 3212d may be electrically connected to each other. Each of the first to fourth wiring layers 312a, 312b, 312c, and 312d may also be electrically connected to the redistribution layer 342 of the connection structure 340 depending on function.

The stopper layer 312bM is disposed on the bottom surface of the first insulating layer 311a, and has a bottom surface, covered with the second insulating layer 312b, and a top surface. At least a portion of the top surface of the stopper layer 312bM is exposed by the first and second penetration portions 310H1 and 310H2. The first and second penetration portions 310H1 and 310H2 penetrates through the first and second insulating layers 311a and 311b, and do not penetrate through the third insulating layer 311c. However, this is merely an example, and the stopper layer 312M may be disposed on a lower side of the third insulating layer 311c to penetrate through the first to third insulating layers 311a, 311b, and 311c. In the stopper layer 312bM, an edge region in contact with the first insulation layer 311a may have a thickness greater than a thickness of a region exposed from the first insulation layer 311a by the first and second penetration portions 310H1 and 310H2. This is because a portion of the exposed region of the stopper layer 312bM may also be removed during a sandblasting process.

The stopper layer 312bM may be a metal plate including a metal such as titanium (Ti), copper (Cu), or the like. However, a material of the stopper layer 312bM is not limited thereto, and the stopper layer 312bM may include a material having an etching rate lower than a metal such as copper (Cu) in a sandblasting process. For example, the stopper layer 312bM may be an insulating film including an insulating material. More specifically, the stopper layer 312bM may be, for example, a dry film photoresist (DFR) including a photosensitive polymer.

The insulating layers 311a, 311b, and 311c may be formed of an insulating material. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. When a high-rigidity material such as prepreg including a glass fiber or the like is used, the frame 310 may be used as a support member for controlling warpage of the package 500A or a core member.

The first insulating layer 311a may have a thickness greater than a thickness of each of the second and third insulating layers 311b and 311c. This is because the first insulating layer 311a may basically have a relatively greater thickness to maintain rigidity, and the second and third insulating layers 311b and 311c may be introduced to form a greater number of wiring layers 312c and 312d. From a similar point of view, a wiring via of the first wiring via layer 313a penetrating through the first insulating layer 311a may have an average diameter and a height greater than an average diameter and a height of a wiring via of each of the second and third wiring via layers 313b and 313c penetrating through the second and third insulating layers 311b and 311c.

Together with the wiring via layers 313a, 313b, and 313c, the wiring layers 312a, 312b, 312c, and 312d may provide upper and lower electrical connection paths. A material forming each of the wiring layers 312a, 312b, 312c, and 312d may be a metal material such as copper (Cu), aluminum (Al), silver (Ag), tin (Sn), gold (Au), nickel (Ni), lead (Pb), titanium (Ti), or alloys thereof. The wiring layers 312a, 312b, 312c, and 312d may perform various functions depending on designs thereof. For example, a ground pattern, a power pattern, a signal pattern, and the like may be included. The ground pattern and the signal pattern may include a wiring and a pad. The signal pattern includes various signals, except for the ground pattern, the power pattern, and the like, such as a data signal and the like. The term "pattern" refers to a concept including a wiring and a pad.

Each of the wiring layers 312a, 312b, 312c, and 312d may have a thickness greater than a thickness of the redistribution layer 342 of the connection structure 340. The first frame 310 may be formed in a panel level by a board process, such that each of the wiring layers 312a, 312b, 312c, and 312d may also be formed to have a greater size. Meanwhile, the connection structure 340 requires a fine design such as a fine pitch, such that the redistribution layer 342 may be formed to have a relatively smaller size.

The wiring via layers 313a, 313b, and 313c electrically connect the wiring layers 312a, 312b, 312c, and 312d, disposed on different layers, to form an electrical path in the first frame 310. The above-mentioned metal material may also be used as a material forming wiring via layers 313a, 313b, and 313c. A wiring via of each of the wiring via layers 313a, 313b, and 313c may be a filled-type via, filled with a metal material, or a conformal-type via formed along a wall surface of a via hole. The wiring via of the first wiring via layer 313a may have a cylindrical cross-sectional shape or an hourglass cross-sectional shape, and the wiring via of each of the second and third wiring via layers 313b and 313c may have a tapered cross-sectional shape. In this case, the wiring via of each of the second and third wiring vias 313b and 313c may have a cross-sectional shape tapered in opposite directions on the basis of the first insulating layer 311a.

Each of the first and second semiconductor chips 320a and 320b may be an integrated circuit (IC) provided in an amount of several hundred to several million or more elements integrated in a single chip. Each of the first and second semiconductor chips 320a and 320b may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and each of the first and second semiconductor chips 320a and 320b may be a chip in which some functions of the application processor (AP) are divided, for example, a central processor (CPU), a graphics processor (GPU), a field programmable gate array (FPGA), a digital signal processor, a cryptographic processor, a microprocessor, and/or a microcontroller, or may be a chip in which other functions, not mentioned herein, are divided.

Each of the first and second semiconductor chips 320a and 320b may be a die formed based on an active wafer. A base material of a body of the first semiconductor chip 120 may be silicon (Si), germanium (Ge), gallium arsenide (GaAs), or the like. Various circuits may be formed on a body. First and second connection pad 320aP and 320bP may electrically connect the first and second semiconductor chips 320a and 320b to other components. A material forming the first and second connection pads 320aP and 320bP may be a metal material such as copper (Cu), aluminum (Al), or the like. Passivation layers, not illustrated, may be formed on the body to expose the first and second connection pad 320aP and 320bP, respectively. The passivation layer may be an oxide layer, a nitride layer, or the like, or a double layer of an oxide layer and a nitride layer. An insulating layer, not illustrated, or the like may be further disposed at a necessary position. Each of the first and second semiconductor chips 320a and 320b may be a bare die, but may be a packaged die on which an additional redistribution layer, not illustrated, is further disposed on a surface, on which the first and second connection pads 320aP and 320bP are disposed, for example, an active surface.

The first and second semiconductor chips 320a and 32b may further include first and second electrical connection bumps 320aB and 320bB connected to the first and second connection pads 320aP and 320bP, respectively. Each of the first and second electrical connection bumps 320aB and 320bB may be formed of copper (Cu) or the like. The semiconductor package 500A may be subjected to a grinding process on the encapsulant 330. As a result, an upper surface of the encapsulant 330, a surface, which is in contact with the connection via 343, of the third wiring layer 312c, the uppermost wiring layer of the first frame 310, may be disposed to be coplanar with a surface, which is in contact with the connection via 343, of the first and second electrical connection bumps 320aB and 320bB. The term "coplanar" refers to a concept including a fine difference depending on a processor error. Accordingly, the connection via 343, connecting the first and second electrical connection bumps 320aB and 320bB to the redistribution layer 342, may have the same height as the connection via 243 connecting the third wiring layer 212c to the redistribution layer 242. The term "same" also refers to a concept including a fine difference depending on a process error. As described above, when a surface, on which the connection structure 340 is formed, is a planar surface, the insulating layer 341 may be formed to be planar. Accordingly, the redistribution layer 342, the connection via 343, or the like may be formed more finely. An additional electrical connection metal, not illustrated, may be disposed on the third wiring layer 312c to prevent copper (Cu) burr or the like. Since the electrical connection metal, not illustrated, is ground, a surface in contact with the connection via 343 of the electrical connection metal, not illustrated, may have the above-described relationship.

The encapsulant 330 may protect the first frame 310, the first and second semiconductor chips 320a and 320b, and the like. An encapsulation form is not limited. For example, the encapsulant 330 may cover a surface on which the first frame 310 and the first and second connection pads 320aP and 320bP of the first and second semiconductor chips 320a and 320b are disposed, and may fill at least a portion of each of the first and second penetration portions 310H1 and 310H2. The encapsulant 330 may fill the penetration portions 310aH and 310bH to serve as an adhesive according to a detailed material and to reduce buckling.

A material of the encapsulant 330 is not limited. For example, an insulating material may be used as a material of the encapsulant 330. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. As necessary, a photoimageable encapsulant (PIE) resin may be used as a material of the encapsulant 230.

The connection structure 340 may redistribute first to fourth connection pads 320aP, 320bP, 420aP, and 420bP of the first to fourth semiconductor chips 320a, 320b, 420a, and 420b. The connection structure 340 may electrically connect the first to fourth connection pads 320aP, 320bP, 420aP, and 420bP to each other depending on function. The connection structure 340 may electrically connect the first to fourth connection pads 320aP, 320bP, 420aP, and 420bP to the passive component 470 depending on function. The connection structure 340 may electrically connect the first to fourth connection pads 320aP, 320bP, 420aP, and 420bP to wiring layers 312a, 312b, 312c, and 312d of the first frame 310 depending on function. Several tens to several hundreds of first to fourth connection pads 320aP, 320bP, 420aP, and 420bP may be redistributed and may be physically and/or electrically connected through the electrical connection metal 390 depending on function. The connection structure 340 includes an insulating layer 341, a redistribution layer 342, disposed on the insulating layer 341, and a connection via 343 penetrating through the insulating layer 341. The insulating layers 341, the redistribution layers 342, and the connection vias 343 may include a larger number of layers than those illustrated in the drawings. Alternatively, the insulating layers 341, the redistribution layers 342, and the connection vias 343 may include a smaller number of layers than those illustrated in the drawings.

A material of the insulating layers 341 may be an insulating material. In this case, a photoimageable dielectric (PID) material may also be used as the insulating material in addition to the above-described insulating materials. For example, the insulating layers 341 may be a photosensitive insulating layer. When the insulating layer 341 has photosensitive properties, a fine pitch of the connection via 343 may be achieved more easily. Even when the insulating layer 341 includes multiple layers, materials of the multiple layers may be identical to each other and, as necessary, may be different from each other. When the insulating layer 341 includes multiple layers, the multiple layers are integrated with each other, such that boundaries therebetween may not be readily apparent, but are not limited thereto.

The redistribution layer 342 may substantially serve to redistribute the first to fourth connection pads 320aP, 320bP, 420aP, and 420bP, and may provide the above-mentioned electrical connection path. A material forming the redistribution layer 342 may be a metal material such as copper (Cu), aluminum (Al), silver (Ag), tin (Sn), gold (Au), nickel (Ni), lead (Pb), titanium (Ti), or alloys thereof. The redistribution layer 342 may perform various functions depending on a design of a corresponding layer. For example, the redistribution layer 342 may include a ground pattern, a power pattern, a signal pattern, and the like. The signal pattern may include various signals, such as data signal and the like, except for the ground pattern, the power pattern, and the like. The term "pattern" refers to a concept including a wiring and a pad. The redistribution layer 342 mainly includes a power pattern and/or a ground pattern in the first region R1 and mainly includes a signal pattern in the second region R2.

The connection via 343 may electrically connect the redistribution layers 342, the first to fourth connection pads 320aP, 320bP, 420aP, and 420bP, the third wiring layer 312c, disposed on different layers, and the like. As a result, an electrical path is formed in the connection structure 340. A material forming the connection via 343 may be a metal material such as copper (Cu), aluminum (Al), silver (Ag), tin (Sn), gold (Au), nickel (Ni), lead (Pb), titanium (Ti), or alloys thereof. The connection via 243 may be a filled-type via filled with the metal material, or a conformal-type via formed along a wall surface of a via hole. Moreover, the connection via 343 may have a tapered cross-sectional shape. A tapered direction may be the same as that of the wiring via of the second wiring via layer 313b.

The first passivation layer 350 is an additional component for protecting the connection structure 340 from external physical and chemical damage and the like. The first passivation layer 350 may include a thermosetting resin. For example, the first passivation layer 350 may be an ABF, but a material of the first passivation layer 350 is not limited thereto. The first passivation layer 350 may have a plurality of openings exposing at least a portion of the uppermost redistribution layer 342. There may be several tens to several tens of thousands of openings. The number of openings may be greater or smaller than several tens to several tens of thousands. Each opening may include a plurality of holes.

The first electrical connection metal 390 is also an additional component for physically and/or electrically connecting the semiconductor package 500A to an external device. For example, the semiconductor package 500A may be mounted on a mainboard of an electric device through the electrical connection metal 390. The electrical connection metal 390 is disposed on each opening of the second passivation layer 380. Accordingly, the electrical connection metal 390 may be electrically connected to the exposed fourth wiring layer 312d. As necessary, an underbump metal, not illustrated, may be formed on a plurality of openings of the second passivation layer 380. In this case, the electrical connection metal 390 may be electrically connected to the exposed fourth wiring layer 312d through the underbump metal, not illustrated. Each electrical connection metal 390 may include a low melting point metal, for example, tin (Sn) or a Sn-containing alloy. In further detail, the electrical connection metal 390 may be formed of a solder or the like. However, this is merely an example, and a material of the electrical connection metal 390 is not limited thereto.

The electrical connection metal 390 may be a land, a ball, a pin, or the like. The electrical connection metal 390 may be formed as a multilayer structure or a single-layer structure. When the electrical connection metal 390 is formed as a multilayer structure, the electrical connection metal 390 includes a copper pillar and a solder. When the electrical connection structure metal 390 is formed as a single-layer structure, the electrical connection metal 390 includes a tin-silver solder or copper. However, this is merely an example, and a structure and a material of the electrical connection metal 390 are not limited thereto. The number, an interval, a dispositional form, and the like, of the electrical connection metal 390 are not limited, but may be sufficiently modified depending on design by those skilled in the art. For example, several tens to several tens of thousands of electrical connection metals 390 may be provided according to the number of first to fourth connection pads 320aP, 320bP, 420aP, and 420bP. The number of electrical connection metals 390 may be greater than or smaller than several tens to several tens of thousands.

At least one of the electrical connection metals 390 may be disposed in a fan-out region. The term "fan-out region" refers to a region except for a region in which the first and second semiconductor chips 320a and 320b are disposed. For example, the semiconductor package 500A may be a fan-out semiconductor package. The fan-out package may have improved reliability as compared to a fan-in package, may allow a plurality of input/output (I/O) terminals to be implemented, and may facilitate a three-dimensional (3D) interconnection structure. Moreover, as compared to a ball grid array (BGA) package, a land grid array (LGA) package, or the like, the fan-out package may be manufactured to have a small thickness, and may be superior in price competitiveness.

The second frame 410 may further improve rigidity of a second package structure 400A according to a detailed material, and may serve to secure thickness uniformity of the second encapsulant 430. One or more passive components 470 are embedded in the second frame 410. The second frame 410 has through-hole type third and fourth penetration portions 410H1 and 410H2. The third and fourth semiconductor chips 420a and 420b are connected to the third and fourth penetration portions 410H1 and 410H2 in such a manner that third and fourth connection pads 420aP and 420bP faces a top surface of the second connection structure 440, respectively. As necessary, an additional wiring layer 412 and an additional wiring via 413, electrically connected to the passive component 470 and the second redistribution layer 442, may be further disposed in the second frame 410 to provide an electrical connection between the passive component 470 and the second rewiring layer 442 of the second connection structure 440. The second frame 420 includes one or more insulating layers 411a, 411b, and 411c, which may be formed of an insulating material. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. When a high-rigidity material such as prepreg is used, the second frame 410 may be used as a support member for controlling warpage of the package 500A or a core member.

Each of the third and fourth semiconductor chips 420*a* and 420*b* may also be an integrated circuit (IC) provided in an amount of several hundred to several million or more elements integrated in a single chip. Each of the first and second semiconductor chips 420*a* and 420*b* may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and the first semiconductor chip 120 may be a chip in which some functions of the application processor (AP) are divided, for example, a central processor (CPU), a graphics processor (GPU), a field programmable gate array (FPGA), a digital signal processor, a cryptographic processor, a microprocessor, and/or a microcontroller, or may be a chip in which other functions, not mentioned herein, are divided. As an unlimited example, the first to fourth semiconductor chips 320*a*, 320*b*, 420*a*, and 420*b* may be combined to constitute a single complete application processor (AP). In this case, the first and second semiconductor chips 320*a* and 320*b* may be main chips, and the third and fourth semiconductor chips 420*a* and 420*b* may be sub-chips. However, the first to fourth semiconductor chips 320*a*, 320*b*, 420*a*, and 420*b* are not limited thereto, and each of the third and fourth semiconductor chips 420*a* and 420*b* may be a memory such as a volatile memory (DRAM), a nonvolatile memory (ROM), a flash memory, or the like.

Each of the third and fourth semiconductor chips 420*a* and 420*b* may also be a die formed based on an active wafer. A base material of a body of each of the third and fourth semiconductor chips 420*a* and 420*b* may also be silicon (Si), germanium (Ge), gallium arsenide (GaAs), or the like. Various circuits may be formed on the body of each of the third and fourth semiconductor chips 420*a* and 420*b*. The third and fourth connection pads 420*a*P and 420*b*P may electrically connect the third and fourth semiconductor chips 420*a* and 420*b* to other components. A material forming the third and fourth connection pads 420*a*P and 420*b*P may also be a metal material such as copper (Cu), aluminum (Al), or the like. Each of the third and fourth connection pads 420*a*P and 420*b*P may be connected to the second connection via 443 of the second connection structure 440 without an additional bump. A passivation layer, not illustrated, may be formed on the body of each of the third and fourth semiconductor chips 420*a* and 420*b* to expose the third and fourth connection pad 420*a*P and 420*b*P. The passivation layer may be an oxide layer, a nitride layer, or the like, or a double layer of an oxide layer and a nitride layer. An insulating layer, not illustrated, or the like may be further disposed at a necessary position. Each of the third and fourth semiconductor chips 420*a* and 420*b* may be a bare die, but may be a packaged die on which an additional redistribution, not illustrated, is further disposed on a surface, on which the third and fourth connection pads 420*a*P and 420*b*P are disposed, for example, an active surface.

A material of the second encapsulant 430 is not limited. For example, the material of the second encapsulant 430 may be an insulating layer. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber, for example, prepreg, ABF, FR-4, BT, or the like. As necessary, PIE may be used as the insulating material.

Together with the first connection structure 340, the second connection structure 440 may redistribute first to fourth connection pads 320*a*P, 320*b*P, 420*a*P, and 420*b*P of the first to fourth semiconductor chips 320*a*, 320*b*, 420*a*, and 420*b*. The connection structure 440 may electrically connect the first to fourth connection pads 320*a*P, 320*b*P, 420*a*P, and 420*b*P to each other depending on function. The connection structure 340 may electrically connect the first to fourth connection pads 320*a*P, 320*b*P, 420*a*P, and 420*b*P to the passive component 470 depending on function. The second connection structure 440 may electrically connect the first to fourth connection pads 320*a*P, 320*b*P, 420*a*P, and 420*b*P to wiring layers 412*a*, 412*b*, 412*c*, and 412*d* of the first frame 310 depending on function. Several tens to several hundreds of first to fourth connection pads 320*a*P, 320*b*P, 420*a*P, and 420*b*P may be redistributed through the second connection structure 440, and thus may be physically and/or electrically connected to an external device through the first electrical connection metal 390 depending on function. The second connection structure 440 includes a second insulating layer 441, a second redistribution layer 442, disposed on the second insulating layer 441, and a second connection via 443 penetrating through the second insulating layer 441. The second insulating layers 441, the second redistribution layers 442, and the second connection vias 443 of the second connection structure 440 may include a larger number of layers than those illustrated in the drawings. Alternatively, the second insulating layers 441, the second redistribution layers 442, and the second connection vias 443 of the second connection structure 440 may include a smaller number of layers than those illustrated in the drawings.

A material of the second insulating layers 441 may be an insulating material. In this case, a photoimageable dielectric (PID) material may also be used as the insulating material in addition to the above-described insulating materials. For example, the second insulating layers 441 may be a photosensitive insulating layer. When the second insulating layer 441 has photosensitive properties, a fine pitch of the connection via 343 may be achieved more easily. Even when the second insulating layer 441 includes multiple layers, materials of the multiple layers may be identical to each other and, as necessary, may be different from each other. When the second insulating layer 441 includes multiple layers, the multiple layers are integrated with each other, such that boundaries therebetween may not be readily apparent, but are not limited thereto.

The second redistribution layer 442 may substantially serve to redistribute the first to fourth connection pads 320*a*P, 320*b*P, 420*a*P, and 420*b*P, and may provide the above-mentioned electrical connection path. A material forming the second redistribution layer 442 may be a metal material such as copper (Cu), aluminum (Al), silver (Ag), tin (Sn), gold (Au), nickel (Ni), lead (Pb), titanium (Ti), or alloys thereof. The second redistribution layer 442 may perform various functions depending on a design of a corresponding layer. For example, the second redistribution layer 442 may include a ground pattern, a power pattern, a signal pattern, and the like. The ground pattern and the signal pattern may be identical to each other. The signal pattern may include various signals, such as data signal and the like, except for the ground pattern, the power pattern, and the like. The term "pattern" refers to a concept including a wiring and a pad. The second redistribution layer 442 mainly includes a power pattern and/or a ground pattern in a fourth region R4 and mainly includes a signal pattern in a fifth region R5.

The second connection via 443 may electrically connect the second redistribution layers 442, the first to fourth connection pads 320aP, 320bP, 420aP, and 420bP, the wiring layer 412c, disposed on different layers, and the like. As a result, an electrical path is formed in the second connection structure 440. A material forming the second connection via 443 may be a metal material such as copper (Cu), aluminum (Al), silver (Ag), tin (Sn), gold (Au), nickel (Ni), lead (Pb), titanium (Ti), or alloys thereof. The second connection via 443 may be a filled-type via filled with the metal material, or a conformal-type via formed along a wall surface of a via hole. Moreover, the second connection via 443 may have a tapered cross-sectional shape. A tapered direction may be the same as that of the wiring via 413.

The third passivation layer 450 is an additional component for protecting the second connection structure 440 from external physical and chemical damage and the like. The third passivation layer 450 may include a thermosetting resin. For example, the third passivation layer 450 may be an ABF, but a material of the first passivation layer 250 is not limited thereto. The third passivation layer 450 may have a plurality of openings exposing at least a portion of the lowermost redistribution layer 442. There may be several tens to several tens of thousands of openings. The number of openings may be greater or smaller than several tens to several tens of thousands. Each opening may include a plurality of holes.

The passive component 470 may be a chip-type capacitor such as a multilayer ceramic capacitor (MLCC) or a low inductance ceramic capacitor (LICC), or a chip-type inductor such as a power inductor. However, the passive component 470 is not limited thereto and may be another type of passive component well known in the art. For example, the passive component 470 may be a chip-type passive component well known in the art. The term "chip-type component" refers to, for example, an independent chip-type component including a body, internal electrodes, formed inside the body, and external electrodes formed on the body. The passive components 470 may be the same type or different types. The number of the passive components 470 is not limited, and may be greater than or smaller than the number of those illustrated in the drawings depending on design. The passive component 470 may be embedded at an appropriate location inside the second frame 410.

The third electrical connection metal 490 is a component for physically and/or electrically connecting the first and second package structures 300A and 400A. The third electrical connection metal 490 is disposed on a plurality of openings of the first and third passivation layers 350 and 450. Accordingly, the exposed first and second redistribution layers 342 and 442 may be electrically connected to each other. Each third electrical connection metal 490 may include a low melting point metal, for example, tin (Sn) or a Sn-containing alloy. More specifically, each third electrical connection metal 490 may include a solder or the like. However, this is merely an example, and a material of each third electrical connection metal 490 is not limited thereto. The third electrical connection metal 490 may be a land, a ball, a pin, or the like. The third electrical connection metal 490 may be formed as a multilayer structure or a single-layer structure. When the third electrical connection metal 490 is formed as a multilayer structure, the third electrical connection metal 490 includes a copper pillar and a solder. When the electrical connection structure metal 190 is formed as a single-layer structure, the third electrical connection metal 490 includes a tin-silver solder or copper. However, this is merely an example, and a structure and a material of the third electrical connection metal 490 are not limited thereto. The number, an interval, a dispositional form, and the like, of the third electrical connection metal 490 are not limited, but may be sufficiently modified depending on design by those skilled in the art. For example, several tens to several tens of thousands of third electrical connection metals 490 may be provided according to the number of the first to fourth connection pads 320aP, 320bP, 420aP, and 420bP. The number of third electrical connection metals 490 may be greater than or smaller than several tens to several tens of thousands.

Figure 26:
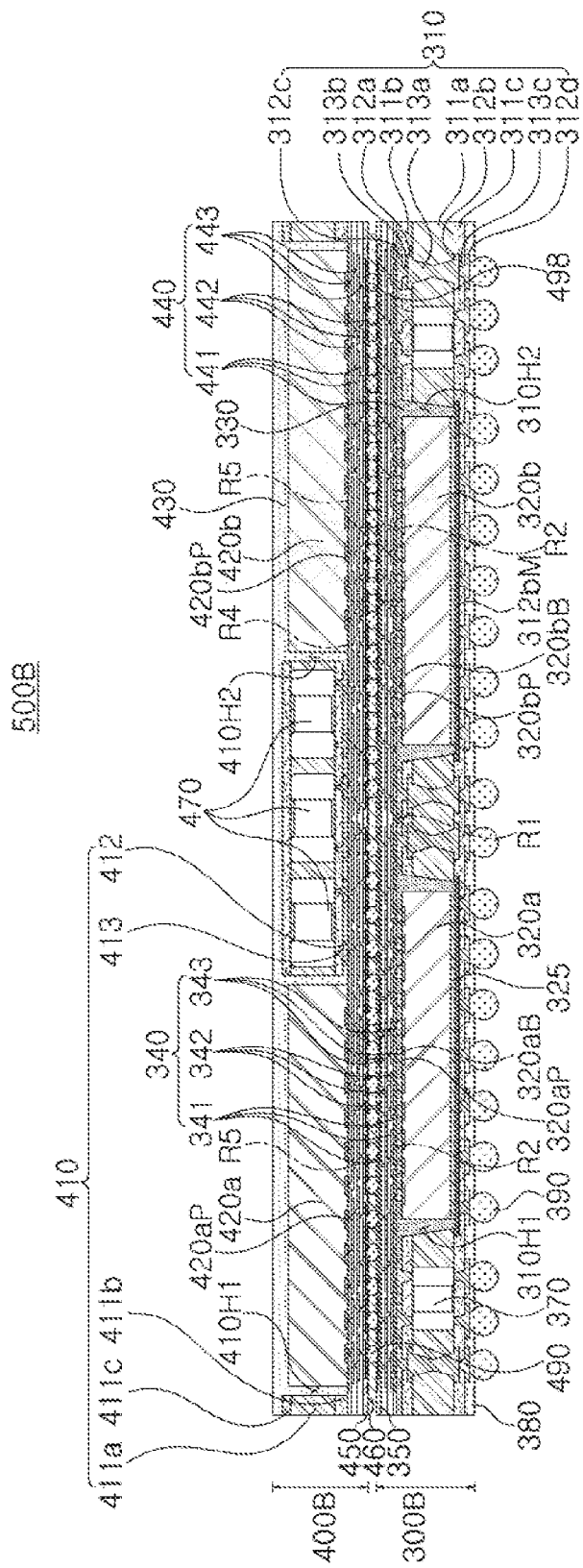
FIG. 26 is a cross-sectional view schematically illustrating a modified example of the semiconductor package in FIG. 23.

FIG. 26 is a cross-sectional view schematically illustrating a modified example of the semiconductor package in FIG. 23.

Referring to FIG. 26, a semiconductor package 500B according to a modified embodiment includes a first passive component 470, disposed in a second frame 410 of a second package structure 400B, and a second passive component 370 embedded in a first frame 310 of a first package structure 300B, as described above. The second passive component 370 is electrically connected to at least some of first to fourth wiring layers 312a, 312b, 312c, and 312d of the first frame 310 depending on function. As a result, the second passive component 370 may be electrically connected to first to fourth connection pads 320aP, 320bP, 420aP, and 420bP depending on function. The second passive component 370 may also be a chip-type capacitor such as a multilayer ceramic capacitor (MLCC) or a low inductance ceramic capacitor (LICC), or a chip-type inductor such as a power inductor. However, the second passive component 370 is not limited thereto and may be another type of passive component well known in the art. For example, the third passive component 370 may be a chip-type passive component well known in the art. The second passive components 370 may be the same type or different types. The number of the second passive components 370 is not limited, and may be greater than or smaller than the number of those illustrated in the drawings depending on design.

The other descriptions are substantially the same as the detailed description of the semiconductor package 500A according to another example embodiment, and will be omitted herein.

Figure 27:
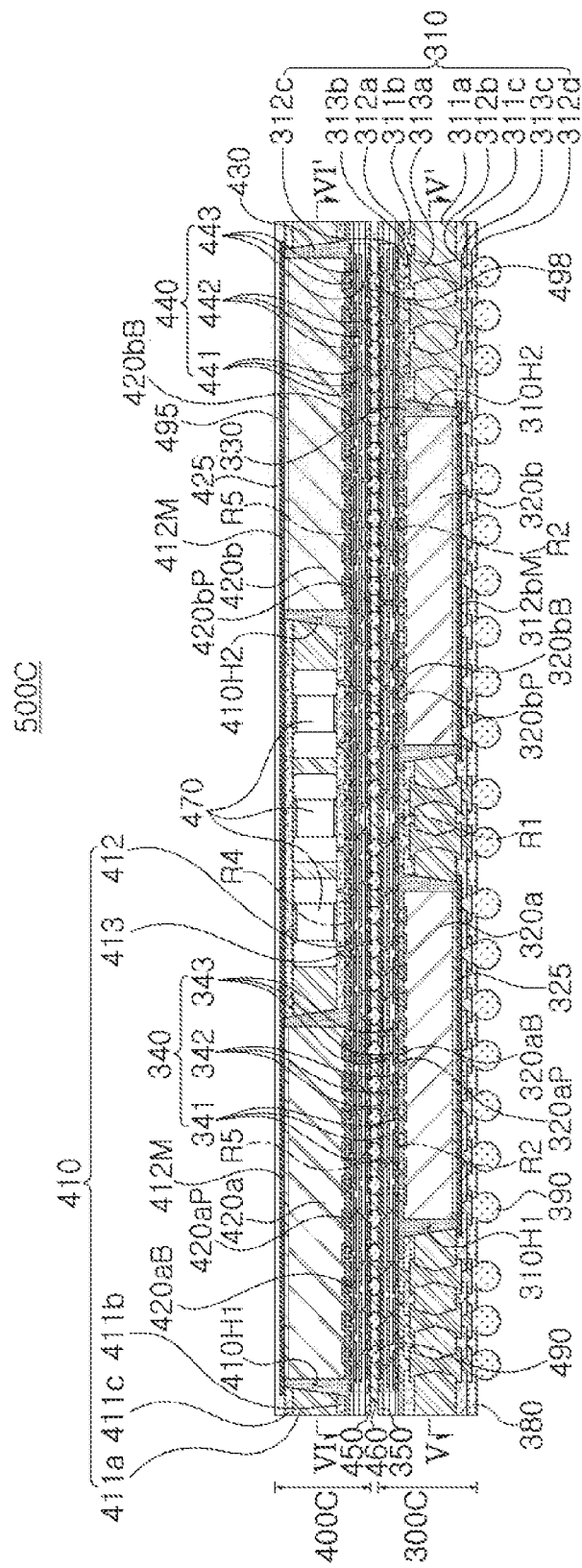
FIG. 27 is a cross-sectional view schematically illustrating a modified example of the semiconductor package in FIG. 23.

FIG. 27 is a cross-sectional view schematically illustrating a modified example of the semiconductor package in FIG. 23.

Referring to FIG. 27, a semiconductor package 500C according to another modified embodiment includes a first package structure 300C, having substantially the same configuration as described above, and a second package structure 400C including another type of second frame 410. More specifically, the second frame 410 also has a blind cavity-type third and fourth penetration portions 410H1 and 410H2, each having a bottom surface on which a stopper layer 412M is disposed. Third and fourth semiconductor chips 420a and 420b are disposed in the third and fourth penetration portions 410H1 and 410H2 in such manner that rear surfaces of the third and fourth penetration portions 410H1 and 410H2 are attached to the stopper layer 412M via an adhesive member 425 or the like, respectively. Third and fourth electrical connection bumps 420aB and 420bB may be disposed on third and fourth connection pads 420aP and 420bP, respectively. Each of the third and fourth electrical connection bump 420aB and 420bB may be a metal material such as copper (Cu) or the like. A second connection via 443, connecting the third and fourth electrical connection bump 420*a*B and 420*b*B to the second redistribution layer 442, may have the same height as a second connection via 443 connecting the wiring layer 412 to the second redistribution layer 442. The term "same" also refers to a concept including a fine difference depending on a process error. As described above, when a surface, on which the second connection structure 440 is formed, is a planar surface, the second insulating layer 441 may be formed to be planar. Accordingly, the second redistribution layer 442, the second connection via 443, or the like may be formed more finely. As necessary, an additional electrical connection metal, not illustrated, may be disposed on the third wiring layer 412 to prevent copper (Cu) burr or the like. Since the electrical connection metal, not illustrated, is ground, a surface in contact with the second connection via 443 of the electrical connection metal, not illustrated, may have the above-described relationship. As necessary, a fourth passivation layer 495 may be disposed on an upper side of the second frame 410 to cover at least a portion of the stopper layer 412M. The fourth passivation layer 495 may be ABF or the like.

The other descriptions are substantially the same as the detailed description of the semiconductor package 500A according to another example embodiment, and will be omitted herein. It should be apparent that features of the semiconductor package 500B according to another modified embodiment may be introduced to the semiconductor package 500C according to another modified embodiment. For example, the semiconductor packages 500A and 500C may be combined with each other.

Figure 28:
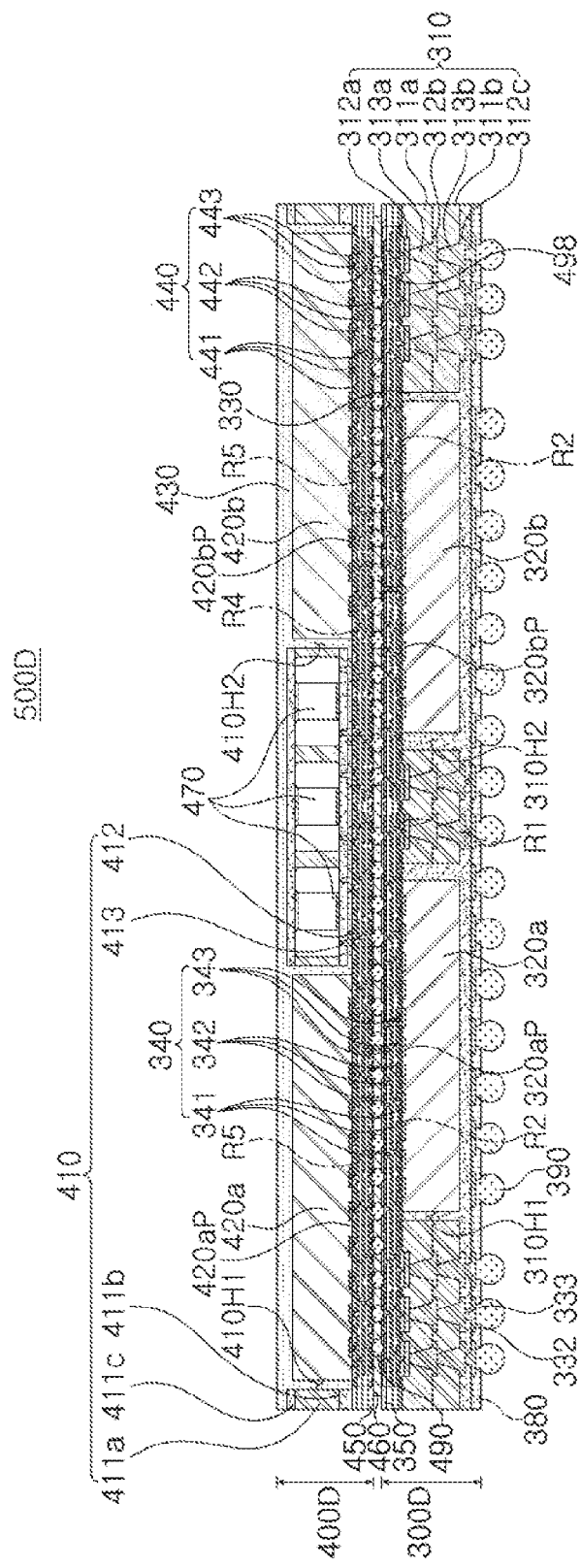
FIG. 28 is a cross-sectional view schematically illustrating a modified example of the semiconductor package in FIG. 23.

FIG. 28 is a cross-sectional view schematically illustrating a modified example of the semiconductor package in FIG. 23.

Referring to FIG. 28, a semiconductor package 500D according to another modified embodiment includes a first package structure 300D, including another type of first frame 310, and a second package structure 400D having substantially the same configuration as described above. More specifically, the first frame 310 has through-hole type first and second penetration portions 310H1 and 310H2, and first and second semiconductor chips 320*a* and 320*b* are disposed in such a manner that a surface, on which first and second connection pads 320*a*P and 320*b*P are disposed, faces a bottom surface of a first connection structure 340. In this case, the first and second connection pads 320*a*P and 320*b*P may be connected to a first connection via 343 of the first connection structure 340. In the present embodiment, the first frame 310 includes a first insulating layer 311*a* in contact with a bottom surface of the first connection structure 340, a first wiring layer 312*a* embedded in the first insulating layer 311*a* while being in contact with the bottom surface of the first connection structure 340, a second wiring layer 312*b* disposed on a side opposing a side in which the first wiring layer 312*a* of the first insulating layer 311*a* is embedded, a second insulating layer 311*b*, disposed on a side opposing the side in which the first wiring layer 312*a* of the first insulating layer 311*a* is embedded, covering at least a portion of the second wiring layer 312*b*, a third wiring layer 312*c* disposed on a side opposing a side in which the second wiring layer 312*b* of the second insulating layer 311*b* is embedded, a first connection via layer 313*a* penetrating through the first insulating layer 311*a* and electrically connecting the first and second wiring layers 312*a* and 312*b* to each other, and a second connection via layer 313*b* penetrating through the second insulating layer 311*b* and electrically connecting the second and third wiring layers 312*b* and 312*c* to each other.

The first wiring layer 312*a* may be recessed into the first insulating layer 311*a*. Thus, a surface, brought into contact with a bottom surface of the first connection structure 340 of the first insulating layer 311*a*, may have a step with respect to a surface brought into contact with a bottom surface of the first connection structure 340 of the first wiring layer 312*a*. In this case, when the first and second semiconductor chips 320*a* and 320*b* and the first frame 310 are encapsulated using a first encapsulant 330, bleeding of an encapsulant material may be suppressed to prevent the first wiring layer 312*a* from being contaminated by the encapsulant material. Each of the first to third wiring layers 312*a*, 312*b*, and 312*c* may have a thickness greater than a thickness of each first redistribution layer 342.

When a hole for the first wiring via layer 313*a* is formed, some pads of the first wiring layer 312*a* may serve as a stopper. Accordingly, it is advantageous in process that a wiring via of the first wiring via layer 313*a* has a tapered shape in which an upper side has a width smaller than a width of a lower side. In this case, the wiring via of the first wiring via layer 313*a* may be integrated with a pad pattern of the second wiring layer 312*b*. Similarly, when a hole is formed for the second wiring via layer 313*b*, some pad of the second wiring layer 312*b* may serve as a stopper. Accordingly, it is advantageous in process that a wiring via of the second wiring via layer 313*b* has a tapered shape in which an upper side has a width smaller than a width of a lower side. In this case, a wiring via of the second wiring via layer 313*b* may be integrated with a pad pattern of the third wiring layer 312*c*.

As necessary, a backside wiring layer 332 and a backside via 333 may be introduced to a lower side of the first encapsulant 330. The backside via 333 may penetrate through at least a portion of the first encapsulant 330 to electrically connect the third wiring layer 312*c* and the backside wiring layer 332 to each other. A second passivation layer 380 may have a plurality of openings, each exposing at least a portion of the backside wiring layer 332. A plurality of electrical connection metals 390 may be electrically connected to the exposed backside wiring layer 332.

The backside wiring layer 332 may also serve to redistribute first to fourth connection pads 320*a*P, 320*b*P, 420*a*P, and 420*b*P. A material forming the backside wiring layer 332 may be a metal such as copper (Cu), aluminum (Al), silver (Ag), tin (Sn), gold (Au), nickel (Ni), lead (Pb), titanium (Ti), or alloys thereof. The backside wiring layer 332 may also perform various functions depending on design of a corresponding layer. For example, the backside wiring layer 332 may include a ground pattern, a power pattern, a signal pattern, and the like. The ground pattern and the signal pattern may include a wiring and a pad. The signal pattern includes various signals, for example, a data signal and the like except for the ground pattern, the power pattern, and the like. The term "pattern" refers to a concept including a wiring and a pad.

The backside via 333 may electrically connect the third wiring layer 312*c* and the backside wiring layer 332 to each other. A material forming the backside via 333 may be a metal such as copper (Cu), aluminum (Al), silver (Ag), tin (Sn), gold (Au), nickel (Ni), lead (Pb), titanium (Ti), or alloys thereof. The backside via 333 may be a filled-type via filed with a metal, or a conformal-type via formed along a wall surface of a via hole. The backside via 333 may have a tapered cross-sectional shape. A tapered direction of the backside via 333 may be the same as a tapered direction of a wiring via of each of the first and second wiring vias 313a and 313b.

The other descriptions are substantially the same as the detailed description of the semiconductor package 500A according to another example embodiment, and will be omitted herein. It should be apparent that features of the semiconductor package 500B and 500C according to other modified embodiments may be introduced to the semiconductor package 500D according to another modified embodiment. For example, the semiconductor packages 500B, 500C, and 500D may be combined in various combinations.

Figure 29:
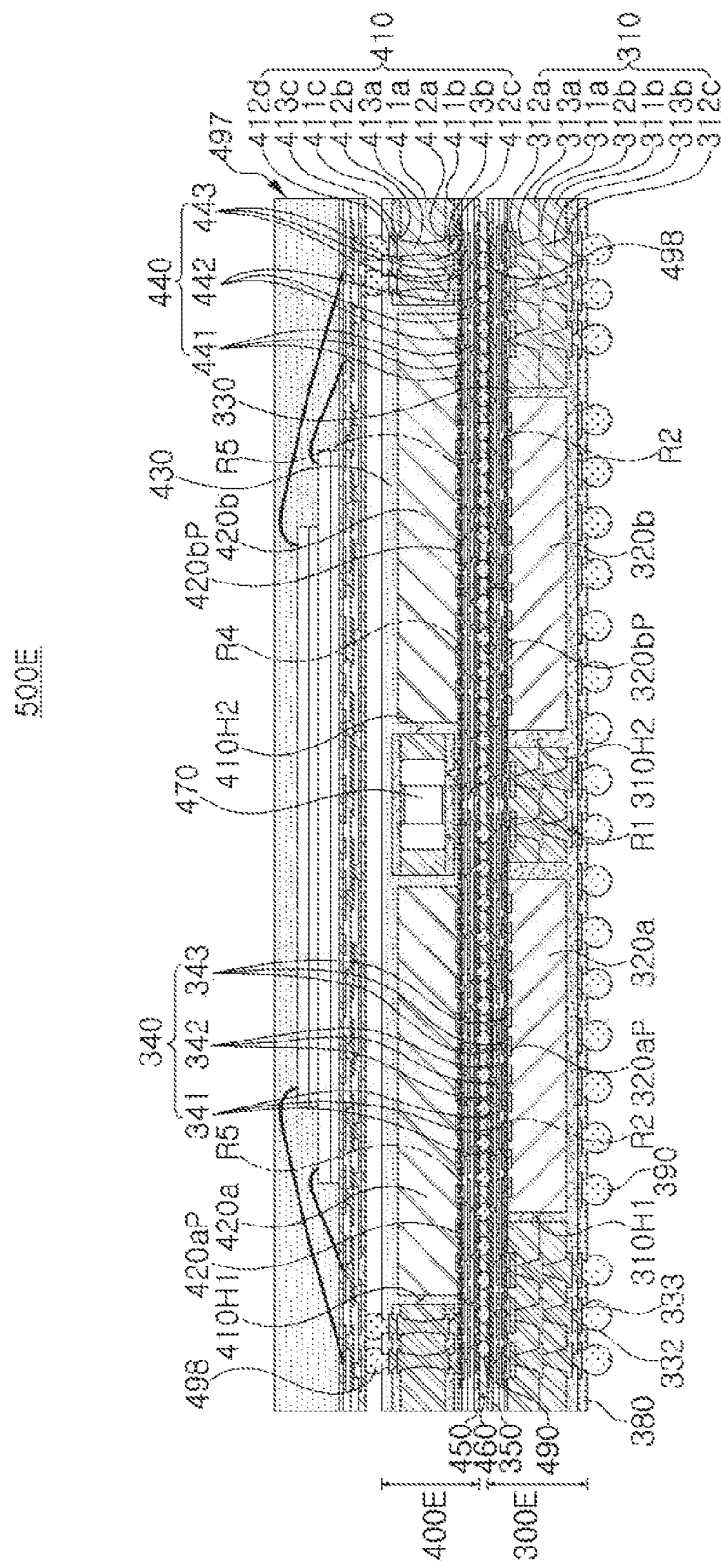
FIG. 29 is a cross-sectional view schematically illustrating a modified example of the semiconductor package in FIG. 23.

FIG. 29 is a cross-sectional view schematically illustrating a modified example of the semiconductor package in FIG. 23.

Referring to FIG. 29, a semiconductor package 500E includes a memory package 497, further disposed through a fourth electrical connection metal 498 in the form of package-on-package (PoP), in the semiconductor package 500D according to another modified embodiment. In this case, a plurality of wiring layers 412a, 412b, 412c, and 412d and one or more wiring via layers 413a, 413b, and 413c are further disposed in a second frame 410 to achieve an electrical connection to the memory package 497. The memory package 497 may have a structure in which one or more memory chips are disposed on a wiring board and connected to the wiring board using wire bonding or the like, but a structure of the memory package 497 is not limited thereto. As necessary, instead of the memory package 497, another type of package may be disposed. The plurality of wiring layers 412a, 412b, 412c, and 412d and the one or more wiring via layers 413a, 413b, and 413c may include a metal material and may be designed for power, ground, and/or signal connection. The fourth electrical connection metal 498 may be a low melting point metal such a solder. As such, the semiconductor package 500E according to another modified embodiment may be a package including both an application processor (AP) and a memory.

The other descriptions are substantially the same as the detailed description of the semiconductor package 500A according to another example embodiment, and will be omitted herein. It should be apparent that features of the semiconductor package 500B and 500C according to other modified embodiments may be introduced to the semiconductor package 500E according to another modified embodiment. For example, the semiconductor packages 500B, 500C, and 500E may be combined in various combinations.

Figure 30:
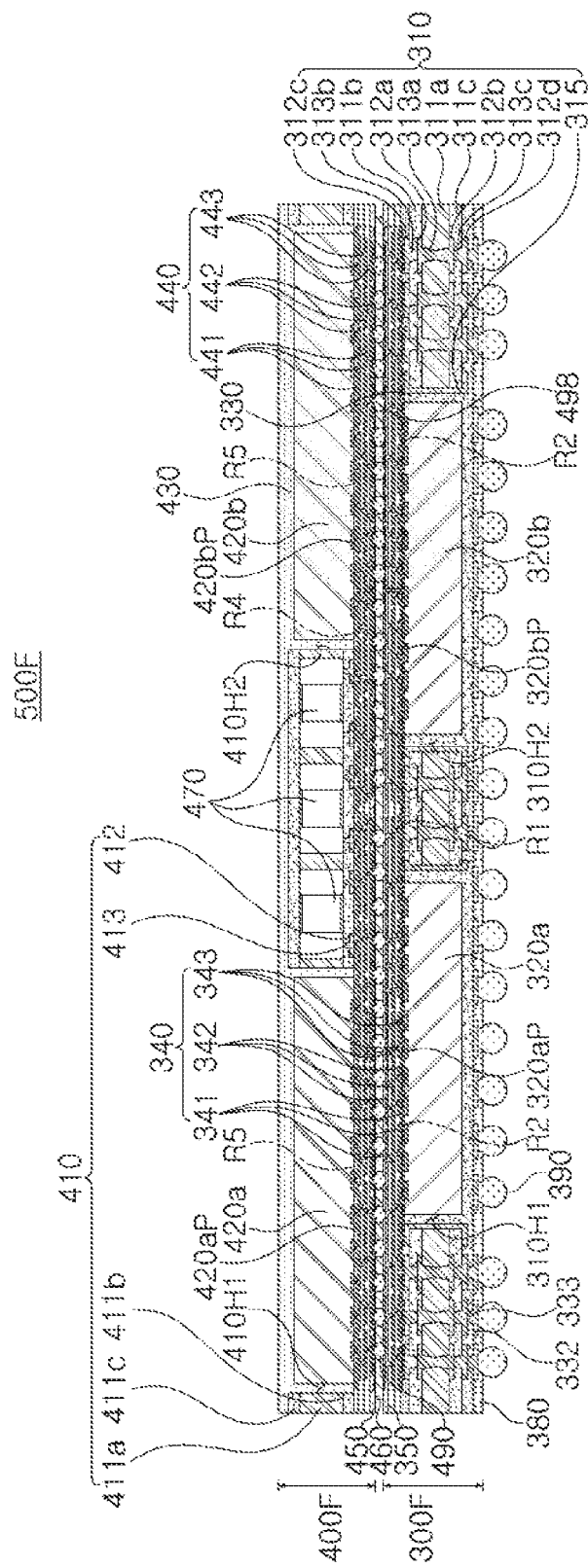
FIG. 30 is a cross-sectional view schematically illustrating a modified example of the semiconductor package in FIG. 23.

FIG. 30 is a cross-sectional view schematically illustrating a modified example of the semiconductor package in FIG. 23.

Referring to FIG. 30, a semiconductor package 500F according to another modified embodiment includes a first package structure 300F, including another type of first frame 310, and a second package structure 400F having substantially the same configuration as described above. More specifically, the frame 310 has through-hole type first and second penetration portions 310H1 and 310H2, and first and second semiconductor chips 320a and 320b are disposed at the first and second penetration portions 310H1 and 310H2 in such a manner that a surface, on which first and second connection pads 320aP and 320bP are disposed, faces a bottom surface of the first connection structure 340. In this case, the first and second connection pads 320aP and 320bP may be connected to a first connection via 343 of the first connection structure 340 without an additional bump. In the present embodiment, the first frame 310 includes a first insulating layer 311a, a first wiring layer 312a and a second wiring layer 312b, respectively on both surfaces of the first insulating layer 311a, respectively covering first and second wiring layers 312a and 312b, a third wiring layer 312c disposed on a side opposing a side in which the first wiring layer 312a of the third insulating layer 311b is embedded, a fourth wiring layer 312d disposed on a side opposing a side in which the second wiring layer 312b of the third insulating layer 311c is embedded, a first wiring via layer 313a penetrating through the first insulating layer 311a and electrically connecting the first and second wiring layers 312a and 312b to each other, a second wiring via layer 313b penetrating through the second insulating layer 311b and electrically connecting the first and third wiring layers 312a and 312c to each other, and a third wiring via layer 313c penetrating the third insulating layer 311c and electrically connecting the second and fourth wiring layers 312b and 312d to each other. Since the frame 310 includes a greater number of wiring layers 312a, 312b, 312c, and 312d, the first connection structure 340 may be further simplified.

The first insulating layer 311a may have a thickness greater than a thickness of each of the second and third insulating layers 311b and 311c. The first insulating layer 311a may have a relatively greater thickness to maintain rigidity, and the second and third insulating layers 311b and 311c may be introduced to forma greater number of wiring layers 312c and 312d. From a similar point of view, a wiring via of the first wiring via layer 313a, penetrating through the first insulating layer 311a, may have a height and an average diameter greater than a height and an average diameter of a wiring via of each of the second and third wiring via layers 313b and 313c respectively penetrating through the second and third insulating layers 311b and 311c. The wiring via of the first wiring via layer 313a may have an hourglass shape or a cylindrical shape, while the wiring vias of the second and third wiring via layers 313b and 313c may have shapes tapered in opposite directions. Each of the first to fourth wiring layers 312a, 312b, 312c, and 312d may have a thickness greater than a thickness of the redistribution layer 342.

Similarly, as necessary, a backside wiring layer 332 and a backside via 333 may be introduced on a lower side of the first encapsulant 330. The backside via 333 may penetrate through at least a portion of the first encapsulant 330 to electrically connect the third wiring layer 312c and the backside wiring layer 332 to each other. A second passivation layer 380 may have a plurality of openings, each exposing at least a portion of the backside wiring layer 332. A plurality of first electrical wiring metals 390 may be electrically connected to the exposed backside wiring layer 332.

As necessary, a metal layer 315 may be disposed on a wall surface of the first and second penetration portions 310H and 310H2 of the first frame 110, and the metal layer 315 may be disposed to fully cover the wall surface. An electromagnetic shielding effect and a heat radiation effect of the first and second semiconductor chips 320a and 320b may be improved through the metal layer 315.

The other descriptions are substantially the same as the detailed description of the semiconductor package 500A according to another example embodiment, and will be omitted herein. It should be apparent that features of the semiconductor package 500B and 500C according to other modified embodiments may be introduced to the semiconductor package 500F according to another modified embodiment. For example, the semiconductor packages 500B, 500C, and 500F may be combined in various combinations.

Figure 31:
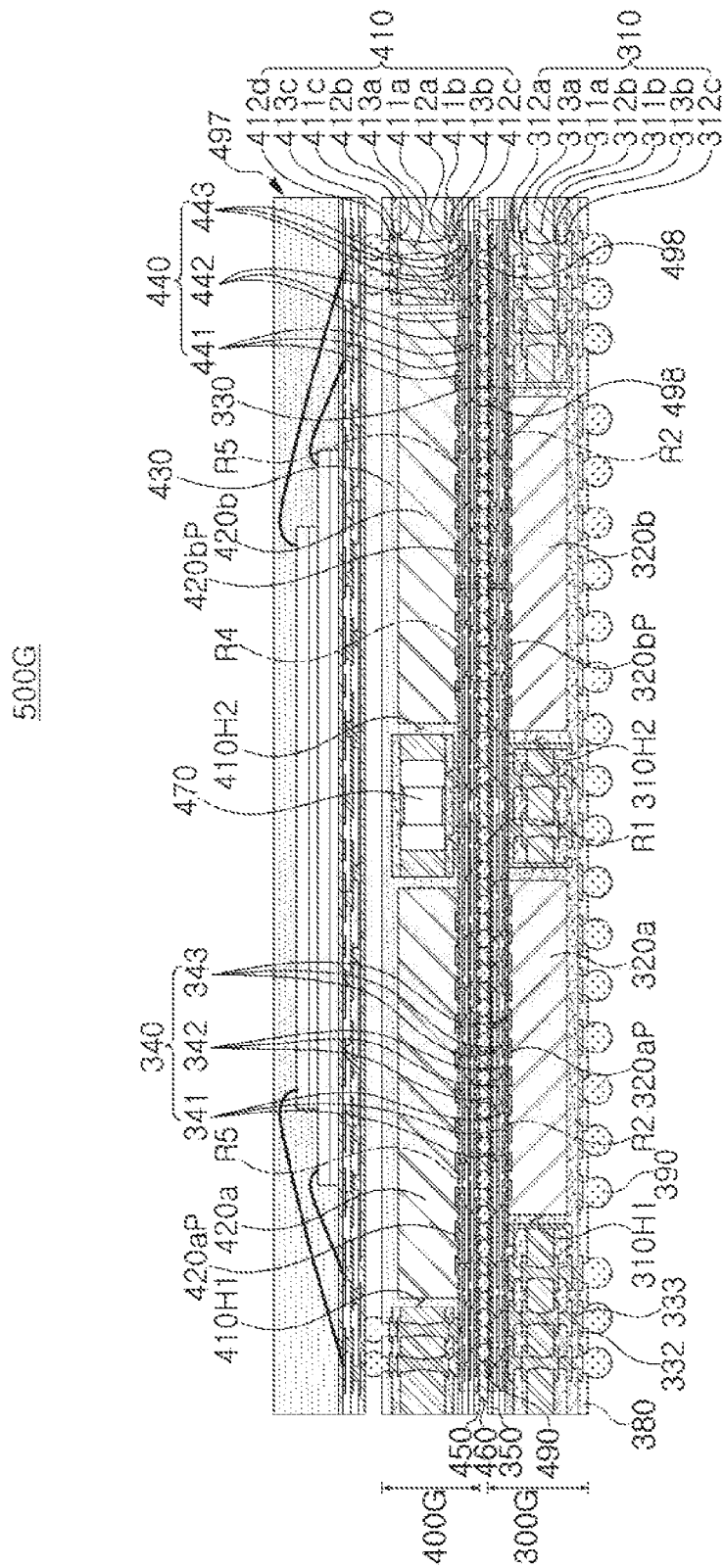
FIG. 31 is a cross-sectional view schematically illustrating a modified example of the semiconductor package in FIG. 23.

FIG. 31 is a cross-sectional view schematically illustrating a modified example of the semiconductor package in FIG. 23.

Referring to FIG. 31, a semiconductor package 500G according to another modified embodiment includes a memory package 497, further disposed through a fourth electrical connection metal 498 in the form of package-on-package (PoP), in the semiconductor package 500F according to another modified embodiment. The semiconductor package 500G according to another modified embodiment includes a first package structure 300G and a second package structure 400G having substantially the same configuration as described above. In this case, a plurality of wiring layers 412a, 412b, 412c, and 412d and one or more wiring via layers 413a, 413b, and 413c are further disposed in a second frame 410 to achieve an electrical connection to the memory package 497. The memory package 497 may have a structure in which one or more memory chips are disposed on a wiring board and connected to the wiring board using wire bonding or the like, but a structure of the memory package 497 is not limited thereto. As necessary, instead of the memory package 497, another type of package may be disposed. The plurality of wiring layers 412a, 412b, 412c, and 412d and the one or more wiring via layers 413a, 413b, and 413c may include a metal material and may be designed for power, ground, and/or signal connection. The fourth electrical connection metal 498 may be a low melting point metal such a solder. As such, the semiconductor package 500G according to another modified embodiment may be a package including both an application processor (AP) and a memory.

The other descriptions are substantially the same as the detailed description of the semiconductor package 500A according to another example embodiment, and will be omitted herein. It should be apparent that features of the semiconductor package 500B and 500C according to other modified embodiments may be introduced to the semiconductor package 500G according to another modified embodiment. For example, the semiconductor packages 500B, 500C, and 500G may be combined in various combinations.

As described above, a package structure, in which a plurality of semiconductor chips may be packaged to have optimal signal and power characteristics, is provided.

In the present disclosure, the terms "lower side", "lower portion", "lower surface," and the like, have been used to indicate a direction toward a mounted surface of the electronic component package in relation to cross sections of the drawings, the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not always refer to the same example embodiment, and is provided to emphasize a particular feature or characteristic different from that of another example embodiment. However, example embodiments provided herein are considered to be able to be implemented by being combined in whole or in part one with another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than to limit the present disclosure. In this case, singular forms include plural forms unless necessarily interpreted otherwise, based on a particular context.

While example embodiments have been shown and described above, it will be apparent to those skilled in the art that modifications and variations could be made without departing from the scope of the present disclosure as defined by the appended claims.

What is claimed is:

1. A semiconductor package comprising:
   a first connection structure having a first surface and a second surface opposing the first surface and including one or more first redistribution layers;
   a first semiconductor chip disposed on the first surface of the first connection structure, a surface of the first semiconductor chip, on which a first connection pad of the first semiconductor chip is disposed, facing the first surface of the first connection structure;
   a second semiconductor chip disposed on the second surface of the first connection structure, a surface of the second semiconductor chip, on which a second connection pad of the second semiconductor chip is disposed, facing the second surface of the first connection structure;
   a third semiconductor chip disposed on the second surface of the first connection structure, a surface of the third semiconductor chip, on which a third connection pad of the third semiconductor chip is disposed, facing the second surface of the first connection structure;
   a first passive component disposed between the second and third semiconductor chips on the second surface of the first connection structure; and
   a first frame, disposed on the first surface of the first connection structure, having a first penetration portion in which the first semiconductor chip is disposed, wherein the first frame includes one or more wiring layers electrically connected to the one or more first redistribution layers,
   wherein the first connection structure includes a first region including a region overlapping, in a thickness direction of the semiconductor package, the first passive component, and second regions including regions respectively overlapping, in the thickness direction of the semiconductor package, at least portions of the second and third semiconductor chips,
   the first region is disposed between the second regions, and the one or more first redistribution layers include at least one of a power pattern and a ground pattern in the first region and includes a signal pattern in the second region.

2. The semiconductor package of claim 1, wherein the first region further includes regions respectively overlapping, in the thickness direction of the semiconductor package, at least other portions of the second and third semiconductor chips.

3. The semiconductor package of claim 1, wherein each of the second and third semiconductor chips is disposed to overlap, in the thickness direction of the semiconductor package, at least a portion of the first semiconductor chip in the second region, and
 a portion of the first connection pad is electrically connected to a portion of each of the second and third connection pads through the signal pattern of the one or more first redistribution layers in the second region.

4. The semiconductor package of claim 3, wherein the first passive component and another portion of each of the first to third connection pads are electrically connected to at least one of the power pattern and the ground pattern.

5. The semiconductor package of claim 1, wherein each of the first to third semiconductor chips is a chip constituting some or all functions of an application processor (AP).

6. The semiconductor package of claim 5, further comprising:
 a molding material, disposed on the second surface of the first connection structure, covering at least a portion of each of the first and second semiconductor chips and the first passive component;
 a penetration wiring, penetrating through at least a portion of the molding material, electrically connected to the one or more first redistribution layers;
 a memory package disposed on the molding material; and
 a second electrical connection metal electrically connecting the penetration wiring and the memory package to each other.

7. The semiconductor package of claim 1, wherein the first penetration portion is in a form of a blind cavity having a bottom surface on which a stopper layer is disposed, and
 the first semiconductor chip is disposed in the first penetration portion, a surface of the first semiconductor chip opposing the surface of the first semiconductor chip, on which the first connection pad is disposed, attached to the stopper layer.

8. The semiconductor package of claim 7, further comprising:
 an encapsulant, disposed on the first surface of the first connection structure, covering at least a portion of each of the first frame and the first semiconductor chip;
 a passivation layer, disposed on a side opposing a side on which the first connection structure of the first frame is disposed, having a plurality of openings respectively exposing portions of the first wiring layer; and
 a plurality of electrical connection metals respectively disposed on the plurality of openings and electrically connected to the exposed portions of the first wiring layer.

9. The semiconductor package of claim 1, wherein the first penetration portion is in a form of a through-hole penetrating through the first frame, and the first semiconductor chip is disposed in the first penetration portion.

10. The semiconductor package of claim 9, further comprising:
 an encapsulant, disposed on the first surface of the first connection structure, covering at least a portion of each of the first frame and the first semiconductor chip;
 a backside wiring layer disposed on a side opposing a side on which the first frame of the encapsulant is disposed;
 a backside via penetrating through at least a portion of the encapsulant and electrically connecting the one or more wiring layers and the backside wiring layer to each other;
 a passivation layer, disposed on a side opposing a side on which the first frame of the encapsulant is disposed, covering at least a portion of the backside wiring layer and having a plurality of openings respectively exposing portions of the backside wiring layer; and
 a plurality of first electrical connection metals respectively disposed on the plurality of openings and electrically connected to the exposed backside wiring layer.

11. The semiconductor package of claim 9, wherein the first frame includes a first insulating layer in contact with the first surface of the first connection structure, a first wiring layer embedded in the first insulating layer while being in contact with the first surface of the first connection structure, a second wiring layer disposed on a side opposing a side in which the first wiring layer of the first insulating layer is embedded, a second insulating layer, disposed on a side opposing the side in which the first wiring layer of the first insulating layer is embedded, covering at least a portion of the second wiring layer, and a third wiring layer disposed on a side opposing a side in which the second wiring layer of the second insulating layer is embedded, and
 a surface, brought into contact with the first surface of the first connection structure, of the first insulating layer, has a step with respect to a surface, brought into contact with the first surface of the first connection structure, of the first wiring layer.

12. The semiconductor package of claim 9, wherein the first frame includes a first insulating layer, first and second wiring layers respectively disposed on both surfaces of the first insulating layer, second and third insulating layer, respectively disposed on both surfaces of the first insulating layer, covering at least a portion of each of the first and second wiring layers, a third wiring layer disposed on a side opposing a side in which the first wiring layer of the second insulating layer is embedded, and a fourth wiring layer disposed on a side opposing a side in which the second wiring layer of the third insulating layer is embedded, and
 the third insulating layer has a thickness greater than a thickness of each of the second and third insulating layers.

13. The semiconductor package of claim 1, further comprising:
 at least one second passive component disposed in the first frame and electrically connected to at least a portion of the one or more wiring layers.

14. The semiconductor package of claim 1, wherein one or more first redistribution layers mainly include power patterns and ground patterns in the first region, and mainly include signal patterns in the second region.

15. A semiconductor package comprising:
 a first connection structure having a first surface and a second surface opposing the first surface and including one or more first redistribution layers;
 a first semiconductor chip disposed on the first surface of the first connection structure, a surface of the first semiconductor chip, on which a first connection pad of the first semiconductor chip is disposed, facing the first surface of the first connection structure;

a second semiconductor chip disposed on the second surface of the first connection structure, a surface of the second semiconductor chip, on which a second connection pad of the second semiconductor chip is disposed, facing the second surface of the first connection structure;

a third semiconductor chip disposed on the second surface of the first connection structure, a surface of the third semiconductor chip, on which a third connection pad of the third semiconductor chip is disposed, facing the second surface of the first connection structure; and a first passive component disposed between the second and third semiconductor chips on the second surface of the first connection structure, wherein the first connection structure includes a first region including a region overlapping, in a thickness direction of the semiconductor package, the first passive component, and second regions including regions respectively overlapping, in the thickness direction of the semiconductor package, at least portions of the second and third semiconductor chips, the first region is disposed between the second regions, the one or more first redistribution layers include at least one of a power pattern and a ground pattern in the first region and includes a signal pattern in the second region, and wherein the semiconductor package further comprises:
a fourth semiconductor chip disposed side by side with the first semiconductor chip on the first surface of the first connection structure, a surface of the fourth semiconductor chip, on which a fourth connection pad of fourth semiconductor chip is disposed, facing the first surface of the first connection structure; and a first frame, disposed on the first surface of the first connection structure, having first and second penetration portions in which the first and fourth semiconductor chips are disposed, respectively, wherein the first frame includes one or more wiring layers electrically connected to the one or more first redistribution layers.

16. The semiconductor package of claim 15, wherein the first passive component overlaps, in the thickness direction of the semiconductor package, at least a portion of a region between the first and second penetration portions of the first frame, and the one or more wiring layers include at least one of a power pattern and a ground pattern electrically connected to the first passive component in the region between the first and second penetration portions.

17. The semiconductor package of claim 15, wherein each of the second and third semiconductor chips and the first passive component is disposed on the second surface of the first connection structure in a surface-mount form.

18. The semiconductor package of claim 15, the second and third semiconductor chips and the first passive component are packaged together to be disposed on the second surface of the first connection structure in a form of package-on-package (PoP).

19. The semiconductor package of claim 18, further comprising a second connection structure, disposed on the second surface of the first connection structure to be spaced apart from the first connection structure, including one or more second redistribution layers, the second and third semiconductor chips disposed on the second connection structure, a second frame, disposed on the second connection structure, having third and fourth penetration portions at which the second and third semiconductor chips are disposed, respectively, and the first passive component embedded in the second frame, and the one or more first redistribution layers and the one or more second redistribution layers are electrically connected through a plurality of second electrical connection metals disposed between the first and second connection structures.

20. The semiconductor package of claim 19, wherein the second frame includes one or more wiring layers electrically connected to each other, a memory package is disposed on the packaged structure,
the memory package is electrically connected to a wiring layer of the second frame through a third electrical connection metal, and each of the first to fourth semiconductor chips is a chip constituting some or all functions of an application processor (AP).

21. A semiconductor package comprising:
a connection structure having a first surface and a second surface opposing the first surface and including a redistribution layer;

a first frame disposed on the first surface of the connection structure, having first and second penetration portions spaced apart from each other by a first region of the first frame, and including a wiring layer connected to the redistribution layer;

first and second semiconductor chips respectively disposed in the first and second penetration portions on the first surface, connection pads of the first and second semiconductor chips facing the first surface; and a passive component disposed on the first region of the first frame, wherein the connection structure is disposed between the passive component and the first region, the wiring layer in the first region of the frame includes patterns connected to power and ground, and the wiring layer outside the first region of the frame includes patterns transmitting signals.

22. The semiconductor package of claim 21, wherein the wiring layer mainly includes the patterns connected to power and ground in the first region, and mainly includes the patterns transmitting signals outside the first region.

23. The semiconductor package of claim 21, further comprising third and fourth semiconductor chips disposed on the second surface, connection pads of the third and fourth semiconductor chips facing the second surface, wherein the passive component is disposed between the third and fourth semiconductor chips.

24. The semiconductor package of claim 23, wherein the first and third semiconductor chips at least partially overlap each other in a thickness direction of the semiconductor package, and the second and fourth semiconductor chips at least partially overlap each other in the thickness direction of the semiconductor package.

25. The semiconductor package of claim 23, wherein each of the first to fourth semiconductor chips is a chip constituting some or all functions of an application processor (AP).

26. The semiconductor package of claim 23, further comprising a resin layer covering the third and fourth semiconductor chips and the passive component.

27. The semiconductor package of claim 23, further comprising a second frame having at least one through-hole in which the third and fourth semiconductor chips are disposed.

28. The semiconductor package of claim 23, further a memory package disposed on the third and fourth semiconductor chips, the memory package is electrically connected to a wiring layer of the second frame.

29. The semiconductor package of claim 21, further comprising:

a passivation layer and having a plurality of openings; and a plurality of electrical connection metals respectively disposed on the plurality of openings and electrically connected to the wiring layer.

30. The semiconductor package of claim 21, wherein each of the first and second penetration portions is a blind cavity having a bottom surface on which a stopper layer is disposed, a surface of the first semiconductor chip opposing a surface of the first semiconductor chip, on which the first connection pads are disposed, is attached to the stopper layer in the first penetration portion, and a surface of the second semiconductor chip opposing a surface of the second semiconductor chip, on which the second connection pads are disposed, is attached to the stopper layer in the second penetration portion.

31. The semiconductor package of claim 21, wherein each of the first and second penetration portions is a through-hole penetrating through the first frame.

\* \* \* \* \*